United States Patent
Wu et al.

(10) Patent No.: US 12,078,657 B2
(45) Date of Patent: Sep. 3, 2024

(54) COMPLIANT PIN PROBES WITH EXTENSION SPRINGS, METHODS FOR MAKING, AND METHODS FOR USING

(71) Applicant: Microfabrica Inc., Van Nuys, CA (US)

(72) Inventors: Ming Ting Wu, San Jose, CA (US); Arun S. Veeramani, Vista, CA (US)

(73) Assignee: Microfabrica Inc., Van Nuys (CA)

( * ) Notice: Subject to any disclaimer, the term of this patent is extended or adjusted under 35 U.S.C. 154(b) by 229 days.

(21) Appl. No.: 17/854,756

(22) Filed: Jun. 30, 2022

(65) Prior Publication Data

US 2024/0094249 A1 Mar. 21, 2024

Related U.S. Application Data

(63) Continuation-in-part of application No. 17/682,340, filed on Feb. 28, 2022, now Pat. No. 11,906,549, and (Continued)

(51) Int. Cl.
*G01R 1/067* (2006.01)
*G01R 1/073* (2006.01)
*G01R 3/00* (2006.01)

(52) U.S. Cl.
CPC ..... *G01R 1/06722* (2013.01); *G01R 1/06738* (2013.01); *G01R 1/0735* (2013.01); *G01R 3/00* (2013.01)

(58) Field of Classification Search
CPC ............ G01R 1/06722; G01R 1/06738; G01R 1/0735; G01R 3/00
See application file for complete search history.

(56) References Cited

U.S. PATENT DOCUMENTS

| | | |
|---|---|---|
| 2,306,082 A | 12/1942 | Prest |
| 3,240,685 A | 3/1966 | Maissel, I |

(Continued)

FOREIGN PATENT DOCUMENTS

| | | |
|---|---|---|
| CH | 627282 A5 | 12/1981 |
| DE | 3906691 A1 | 9/1989 |

(Continued)

OTHER PUBLICATIONS

(01) Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — G. M. A Hyder
(74) *Attorney, Agent, or Firm* — Holland & Hart LLP

(57) ABSTRACT

Embodiments are directed to probe structures, arrays, methods of using probes and arrays, and/or methods for making probes and/or arrays wherein the probes include at least one flat extension spring segment and wherein in some embodiments the probes also provide: (1) narrowed channel passage segments (e.g. by increasing width of plunger elements or by decreasing channel widths) along portions of channel lengths (e.g. not entire channel lengths) to enhance stability or pointing accuracy while still allowing for assembled formation of movable probe elements, and/or (2) ratcheting elements on probe arms and/or frame elements to allow permanent or semi-permanent transition from a build state or initial state to a working state or pre-biased state.

22 Claims, 33 Drawing Sheets

Related U.S. Application Data a continuation-in-part of application No. 17/139,936, filed on Dec. 31, 2020, now Pat. No. 11,867,721, said application No. 17/682,340 is a continuation of application No. 17/139,940, filed on Dec. 31, 2020, now abandoned.

(60) Provisional application No. 63/238,209, filed on Aug. 29, 2021, provisional application No. 63/217,721, filed on Jul. 1, 2021, provisional application No. 63/217,265, filed on Jun. 30, 2021, provisional application No. 62/961,678, filed on Jan. 15, 2020, provisional application No. 62/961,675, filed on Jan. 15, 2020, provisional application No. 62/961,672, filed on Jan. 15, 2020, provisional application No. 62/956,124, filed on Dec. 31, 2019, provisional application No. 62/956,122, filed on Dec. 31, 2019.

(56) References Cited

U.S. PATENT DOCUMENTS

| | | |
|---|---|---|
| 3,697,401 A | 10/1972 | Lucas et al. |
| 3,723,197 A | 3/1973 | Buschow et al. |
| 3,745,105 A | 7/1973 | Kosowsky et al. |
| 3,832,632 A | 8/1974 | Ardezzone |
| 3,835,017 A | 9/1974 | Mentone et al. |
| 3,874,855 A | 4/1975 | Legrand |
| 3,926,916 A | 12/1975 | Mastrangelo |
| 4,027,935 A | 6/1977 | Bymes et al. |
| 4,043,891 A | 8/1977 | Alkire et al. |
| 4,080,267 A | 3/1978 | Castellani et al. |
| 4,116,523 A | 9/1978 | Coberly et al. |
| 4,126,533 A | 11/1978 | Lukyanchikov et al. |
| 4,155,815 A | 5/1979 | Francis et al. |
| 4,187,553 A | 2/1980 | Ahn et al. |
| 4,294,669 A | 10/1981 | Lincoln et al. |
| 4,298,436 A | 11/1981 | Thomas |
| 4,370,941 A | 2/1983 | Belton |
| 4,376,017 A | 3/1983 | Urion |
| 4,404,080 A | 9/1983 | Jahani |
| 4,452,684 A | 6/1984 | Palnik |
| 4,537,647 A | 8/1985 | Foster |
| 4,575,330 A | 3/1986 | Hull |
| 4,600,555 A | 7/1986 | Shimizu |
| 4,737,114 A | 4/1988 | Yaegashi |
| 4,752,352 A | 6/1988 | Feygin |
| 4,764,449 A | 8/1988 | Vanlseghem |
| 4,770,754 A | 9/1988 | Meuldijk et al. |
| 4,773,877 A | 9/1988 | Krüger et al. |
| 4,821,411 A | 4/1989 | Yaegashi |
| 4,920,639 A | 5/1990 | Yee |
| 4,921,583 A | 5/1990 | Sewell et al. |
| 4,952,272 A | 8/1990 | Okino et al. |
| 4,954,192 A | 9/1990 | Dziekan |
| 4,955,523 A | 9/1990 | Carlommagno et al. |
| 4,961,052 A | 10/1990 | Tada et al. |
| 4,961,154 A | 10/1990 | Pomerantz et al. |
| 4,985,116 A | 1/1991 | Mettler et al. |
| 5,011,580 A | 4/1991 | Pan et al. |
| 5,020,219 A | 6/1991 | Leedy |
| 5,059,359 A | 10/1991 | Hull et al. |
| 5,070,297 A | 12/1991 | Kwon et al. |
| 5,177,438 A | 1/1993 | Littlebury et al. |
| 5,189,507 A | 2/1993 | Carlomagno et al. |
| 5,190,637 A | 3/1993 | Guckel |
| 5,209,817 A | 5/1993 | Ahmad et al. |
| 5,209,878 A | 5/1993 | Smalley et al. |
| 5,271,822 A | 12/1993 | Nolan et al. |
| 5,273,691 A | 12/1993 | Hull et al. |
| 5,286,208 A | 2/1994 | Matsuoka |
| 5,301,415 A | 4/1994 | Prinz et al. |
| 5,321,685 A | 6/1994 | Nose et al. |
| 5,354,712 A | 10/1994 | Ho et al. |
| 5,369,881 A | 12/1994 | Inaba et al. |
| 5,378,583 A | 1/1995 | Guckel et al. |
| 5,395,508 A | 3/1995 | Jolly et al. |
| 5,413,668 A | 5/1995 | Aslam et al. |
| 5,435,902 A | 7/1995 | Andre, Sr. |
| 5,436,412 A | 7/1995 | Ahmad et al. |
| 5,472,539 A | 12/1995 | Saia et al. |
| 5,476,211 A | 12/1995 | Khandros |
| 5,476,818 A | 12/1995 | Yanof et al. |
| 5,478,699 A | 12/1995 | Blessington et al. |
| 5,501,784 A | 3/1996 | Ilmann et al. |
| 5,512,162 A | 4/1996 | Sachs et al. |
| 5,512,163 A | 4/1996 | Warfield |
| 5,513,430 A | 5/1996 | Yanof et al. |
| 5,545,045 A | 8/1996 | Wakamatsu |
| 5,560,837 A | 10/1996 | Trueba |
| 5,578,185 A | 11/1996 | Bergeron et al. |
| 5,596,504 A | 1/1997 | Tata et al. |
| 5,599,194 A | 2/1997 | Ozawa et al. |
| 5,605,614 A | 2/1997 | Bornand |
| 5,614,075 A | 3/1997 | Andre, Sr. |
| 5,641,391 A | 6/1997 | Hunter et al. |
| 5,686,689 A | 11/1997 | Snedeker et al. |
| 5,700,607 A | 12/1997 | Rath et al. |
| 5,766,441 A | 6/1998 | Arndt et al. |
| 5,772,451 A | 6/1998 | Dozier, II et al. |
| 5,805,971 A | 9/1998 | Akedo |
| 5,806,181 A | 9/1998 | Khandros et al. |
| 5,811,982 A | 9/1998 | Beaman et al. |
| 5,820,014 A | 10/1998 | Dozier, II et al. |
| 5,829,128 A | 11/1998 | Eldridge et al. |
| 5,832,834 A | 11/1998 | Nishino et al. |
| 5,864,946 A | 2/1999 | Eldridge et al. |
| 5,865,641 A | 2/1999 | Swart et al. |
| 5,874,011 A | 2/1999 | Ehrlich |
| 5,876,424 A | 3/1999 | Michael |
| 5,892,223 A | 4/1999 | Karpov et al. |
| 5,917,707 A | 6/1999 | Khandros et al. |
| 5,923,637 A | 7/1999 | Shimada et al. |
| 5,945,058 A | 8/1999 | Manners et al. |
| 5,952,843 A | 9/1999 | Vinh |
| 5,967,856 A | 10/1999 | Meller |
| 5,974,662 A | 11/1999 | Eldridge et al. |
| 5,989,994 A | 11/1999 | Khoury et al. |
| 5,994,152 A | 11/1999 | Khandros et al. |
| 5,999,184 A | 12/1999 | Smalley et al. |
| 6,016,000 A | 1/2000 | Moslehi |
| 6,019,784 A | 2/2000 | Hines |
| 6,023,103 A | 2/2000 | Chang et al. |
| 6,027,630 A | 2/2000 | Cohen |
| 6,029,096 A | 2/2000 | Manners et al. |
| 6,043,563 A | 3/2000 | Eldridge et al. |
| 6,044,548 A | 4/2000 | DiStefano et al. |
| 6,064,213 A | 5/2000 | Khandros et al. |
| 6,184,053 B1 | 2/2001 | Eldridge et al. |
| 6,190,181 B1 | 2/2001 | Affolter et al. |
| 6,197,180 B1 | 3/2001 | Kelly |
| 6,208,155 B1 | 3/2001 | Barabi et al. |
| 6,208,225 B1 | 3/2001 | Miller |
| 6,218,203 B1 | 4/2001 | Khoury et al. |
| 6,218,910 B1 | 4/2001 | Miller |
| 6,239,385 B1 | 5/2001 | Schwiebert et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,268,261 B1 | 7/2001 | Petrarca et al. |
| 6,289,781 B1 | 9/2001 | Cohen |
| 6,299,458 B1 | 10/2001 | Yamagami et al. |
| 6,329,827 B1 | 12/2001 | Beaman et al. |
| 6,333,741 B1 | 12/2001 | Snead et al. |
| 6,336,269 B1 | 1/2002 | Eldridge et al. |
| 6,358,097 B1 | 3/2002 | Peters |
| 6,359,455 B1 | 3/2002 | Takekoshi |
| 6,413,852 B1 | 7/2002 | Grill et al. |
| 6,414,501 B2 | 7/2002 | Kim et al. |
| 6,426,638 B1 | 7/2002 | Di Stefano |
| 6,441,315 B1 | 8/2002 | Eldridge et al. |
| 6,456,099 B1 | 9/2002 | Eldridge et al. |
| 6,471,524 B1 | 10/2002 | Nakano et al. |

(56) References Cited

U.S. PATENT DOCUMENTS

| | | |
|---|---|---|
| 6,475,369 B1 | 11/2002 | Cohen |
| 6,482,013 B2 | 11/2002 | Eldridge et al. |
| 6,483,328 B1 | 11/2002 | Eldridge et al. |
| 6,491,968 B1 | 12/2002 | Mathieu et al. |
| 6,499,216 B1 | 12/2002 | Fjelstad |
| 6,507,207 B2 | 1/2003 | Nguyen |
| 6,509,751 B1 | 1/2003 | Mathieu et al. |
| 6,520,778 B1 | 2/2003 | Eldridge et al. |
| 6,539,531 B2 | 3/2003 | Miller et al. |
| 6,560,861 B2 | 5/2003 | Fork et al. |
| 6,573,738 B1 | 6/2003 | Matsuo et al. |
| 6,596,624 B1 | 7/2003 | Romankiw |
| 6,624,645 B2 | 9/2003 | Haseyama et al. |
| 6,624,648 B2 | 9/2003 | Eldridge et al. |
| 6,626,708 B2 | 9/2003 | Phillips |
| 6,627,483 B2 | 9/2003 | Ondricek et al. |
| 6,640,415 B2 | 11/2003 | Eslamy et al. |
| 6,651,325 B2 | 11/2003 | Lee et al. |
| 6,672,875 B1 | 1/2004 | Mathieu et al. |
| 6,672,876 B1 | 1/2004 | Takekoshi |
| 6,677,772 B1 | 1/2004 | Faull |
| 6,690,185 B1 | 2/2004 | Khandros et al. |
| 6,690,186 B2 | 2/2004 | Fjelstad |
| 6,692,145 B2 | 2/2004 | Gianchandani et al. |
| 6,705,876 B2 | 3/2004 | Eldridge |
| 6,713,374 B2 | 3/2004 | Eldridge et al. |
| 6,720,781 B2 | 4/2004 | Ott et al. |
| 6,729,019 B2 | 5/2004 | Grube et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,790,377 B1 | 9/2004 | Cohen |
| 6,807,734 B2 | 10/2004 | Eldridge et al. |
| 6,811,406 B2 | 11/2004 | Grube |
| 6,817,052 B2 | 11/2004 | Grube |
| 6,838,893 B2 | 1/2005 | Khandros, Jr. et al. |
| 6,838,894 B2 | 1/2005 | Macintyre |
| 6,844,748 B2 | 1/2005 | Sato et al. |
| 6,855,010 B1 | 2/2005 | Yen |
| D507,198 S | 7/2005 | Kister |
| 6,913,468 B2 | 7/2005 | Dozier, II et al. |
| 6,935,901 B2 | 8/2005 | Simpson et al. |
| 6,948,940 B2 | 9/2005 | Lindsey et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,086,149 B2 | 8/2006 | Eldridge et al. |
| 7,091,729 B2 | 8/2006 | Kister |
| 7,098,540 B1 | 8/2006 | Mohan et al. |
| 7,126,220 B2 | 10/2006 | Lahiri et al. |
| 7,131,848 B2 | 11/2006 | Lindsey et al. |
| 7,142,000 B2 | 11/2006 | Eldridge et al. |
| 7,148,709 B2 | 12/2006 | Kister |
| 7,172,431 B2 | 2/2007 | Beaman et al. |
| 7,195,989 B2 | 3/2007 | Lockard et al. |
| 7,220,134 B2 | 5/2007 | Goodman et al. |
| 7,239,219 B2 | 7/2007 | Brown et al. |
| 7,252,861 B2 | 8/2007 | Smalley |
| 7,256,593 B2 | 8/2007 | Treibergs |
| 7,265,565 B2 | 9/2007 | Chen et al. |
| 7,271,888 B2 | 9/2007 | Frodis et al. |
| 7,273,812 B2 | 9/2007 | Kim et al. |
| 7,279,917 B2 | 10/2007 | Williams et al. |
| 7,287,322 B2 | 10/2007 | Mathieu et al. |
| 7,326,327 B2 | 2/2008 | Armstrong et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,498,714 B2 | 3/2009 | Lockard et al. |
| 7,504,839 B2 | 3/2009 | Feigenbaum et al. |
| 7,504,840 B2 | 3/2009 | Arat et al. |
| 7,527,721 B2 | 5/2009 | Lembrikov et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,640,651 B2 | 1/2010 | Cohen et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,111,080 B2 | 2/2012 | Kister |
| 8,299,394 B2 | 10/2012 | Theppakuttai et al. |
| 8,415,963 B2 * | 4/2013 | Kister ............... G01R 1/06733 |
| | | 324/755.07 |
| 8,427,186 B2 | 4/2013 | McFarland |
| 8,451,017 B2 | 5/2013 | Gleason et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 8,742,272 B2 | 6/2014 | English et al. |
| 8,926,379 B2 | 1/2015 | Vinther |
| 9,030,222 B2 | 5/2015 | Eldridge et al. |
| 9,052,342 B2 | 6/2015 | Fan et al. |
| 9,097,740 B2 | 8/2015 | Kister |
| 9,121,868 B2 | 9/2015 | Kister |
| 9,244,101 B2 | 1/2016 | Cohen et al. |
| 9,316,670 B2 | 4/2016 | Kister |
| 9,476,911 B2 | 10/2016 | Kister |
| RE46,221 E | 11/2016 | Kister |
| 9,540,233 B2 | 1/2017 | Kumar et al. |
| 9,671,429 B2 | 6/2017 | Wu et al. |
| 9,702,904 B2 | 7/2017 | Breinlinger et al. |
| 9,972,933 B2 | 5/2018 | Kimura et al. |
| 10,215,775 B2 | 2/2019 | Wu et al. |
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 2002/0013085 A1 | 1/2002 | Boyle et al. |
| 2002/0053734 A1 | 5/2002 | Eldridge et al. |
| 2002/0067181 A1 | 6/2002 | Eldridge et al. |
| 2002/0196038 A1 | 12/2002 | Okuno et al. |
| 2003/0001606 A1 | 1/2003 | Bende et al. |
| 2003/0143492 A1 | 7/2003 | Sexton |
| 2003/0161750 A1 | 8/2003 | Moxson et al. |
| 2003/0186405 A1 | 10/2003 | Lee et al. |
| 2004/0004001 A1 | 1/2004 | Cohen et al. |
| 2004/0007470 A1 | 1/2004 | Smalley |
| 2004/0051541 A1 | 3/2004 | Zhou et al. |
| 2004/0072452 A1 | 4/2004 | Eldridge et al. |
| 2004/0112637 A1 | 6/2004 | Kim et al. |
| 2004/0239355 A1 | 12/2004 | Kazama |
| 2005/0029109 A1 | 2/2005 | Zhang et al. |
| 2005/0029225 A1 | 2/2005 | Zhang |
| 2005/0032375 A1 | 2/2005 | Lockard et al. |

(56) References Cited

U.S. PATENT DOCUMENTS

| | | |
|---|---|---|
| 2005/0045585 A1 | 3/2005 | Zhang et al. |
| 2005/0067292 A1 | 3/2005 | Thompson et al. |
| 2005/0070170 A1 | 3/2005 | Zhang et al. |
| 2005/0072681 A1 | 4/2005 | Cohen et al. |
| 2005/0104609 A1 | 5/2005 | Arat et al. |
| 2005/0110505 A1* | 5/2005 | Stanley Tsui ...... G01R 1/06733 324/755.05 |
| 2005/0142846 A1 | 6/2005 | Frodis et al. |
| 2005/0148214 A1 | 7/2005 | Mathieu et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0202667 A1 | 9/2005 | Cohen et al. |
| 2005/0215023 A1 | 9/2005 | Cohen et al. |
| 2005/0230261 A1 | 10/2005 | Cohen et al. |
| 2005/0253606 A1 | 11/2005 | Kim et al. |
| 2006/0006888 A1 | 1/2006 | Kruglick et al. |
| 2006/0051948 A1 | 3/2006 | Kim et al. |
| 2006/0053625 A1 | 3/2006 | Kim et al. |
| 2006/0108678 A1 | 5/2006 | Kumar et al. |
| 2006/0170440 A1 | 8/2006 | Sudin |
| 2006/0216920 A1 | 9/2006 | Kojima |
| 2006/0226015 A1 | 10/2006 | Smalley et al. |
| 2006/0238209 A1 | 10/2006 | Chen et al. |
| 2006/0279301 A1 | 12/2006 | Treibergs |
| 2007/0144841 A1 | 6/2007 | Chong et al. |
| 2007/0200576 A1 | 8/2007 | Laurent et al. |
| 2008/0050524 A1 | 2/2008 | Kumar et al. |
| 2008/0106280 A1 | 5/2008 | Chen et al. |
| 2008/0108221 A1 | 5/2008 | Kim et al. |
| 2008/0111573 A1 | 5/2008 | Chen et al. |
| 2008/0121343 A1 | 5/2008 | Cohen et al. |
| 2008/0174332 A1 | 7/2008 | Arat et al. |
| 2008/0211524 A1 | 9/2008 | Chen et al. |
| 2009/0066351 A1 | 3/2009 | Arat et al. |
| 2009/0079455 A1 | 3/2009 | Gritters |
| 2009/0144971 A1 | 6/2009 | Takekoshi |
| 2009/0256583 A1 | 10/2009 | Chen et al. |
| 2010/0051466 A1 | 3/2010 | Smalley et al. |
| 2010/0088888 A1 | 4/2010 | Mathieu et al. |
| 2010/0134131 A1 | 6/2010 | Chen et al. |
| 2010/0155253 A1 | 6/2010 | Kim et al. |
| 2010/0176834 A1 | 7/2010 | Chen et al. |
| 2011/0050263 A1 | 3/2011 | Sato et al. |
| 2011/0147223 A1 | 6/2011 | Kumar et al. |
| 2011/0187397 A1 | 8/2011 | Chen et al. |
| 2011/0187398 A1 | 8/2011 | Chen et al. |
| 2012/0176122 A1 | 7/2012 | Hirata et al. |
| 2014/0065893 A1 | 3/2014 | Vinther |
| 2014/0132298 A1 | 5/2014 | Cros et al. |
| 2014/0197145 A1 | 7/2014 | Veeramani et al. |
| 2014/0227912 A1 | 8/2014 | Sakai et al. |
| 2014/0231264 A1 | 8/2014 | Chen et al. |
| 2015/0160265 A1 | 6/2015 | Nakamura et al. |
| 2017/0219623 A1 | 8/2017 | Choi et al. |
| 2019/0204354 A1 | 7/2019 | Chen et al. |
| 2019/0383857 A1 | 12/2019 | Kister et al. |
| 2020/0064373 A1* | 2/2020 | Treibergs ........... G01R 1/06722 |
| 2020/0241042 A1 | 7/2020 | Jeong et al. |
| 2021/0190822 A1 | 6/2021 | Jun et al. |

FOREIGN PATENT DOCUMENTS

| | | |
|---|---|---|
| EP | 0897655 B1 | 7/2000 |
| JP | 2734412 B2 | 3/1998 |
| JP | 2001337110 A | 12/2001 |
| JP | 2004156993 A | 6/2004 |
| JP | 2004340617 A | 12/2004 |
| JP | 2004340654 A | 12/2004 |
| JP | 4014040 B2 | 11/2007 |
| JP | 2008032400 A | 2/2008 |
| KR | 20180095315 A | 8/2018 |
| KR | 20190012965 A | 10/2019 |
| WO | 2007097559 A1 | 8/2007 |
| WO | 2015023062 A1 | 2/2015 |
| WO | WO-2024006446 A1 | 1/2024 |
| WO | WO-2024006449 A1 | 1/2024 |
| WO | WO-2024025700 A1 | 2/2024 |

OTHER PUBLICATIONS

(02) Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

(03) "Microfabrication—Rapid Prototyping's Killer Application", Rapid Prototyping Report, CAD/CAM Publishing, Inc., Jun. 1999, pp. 1-5.

(04) Adam L. Cohen, "3-D Micromachining by Electrochemical Fabrication", Micromachine Devices, Mar. 1999, pp. 6-7.

(05) Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

(06) F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

(07) Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

(08) F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

(09) Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of The Institute of Materials, Sep. 1999, vol. 7, No. 9, pp. 538-539.

Kumar, et al., "Features of gold having micrometer to centimeter dimensions can be formed through a combination of stamping with an elastomeric stamp..." Appln. Phys. Lett., Jul. 1993, 63(14):2002-2004.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Osterberg, Peter M., et al., "MEMBUILDER: An Automated 3D Solid Model Construction Program For Microelectromechanical Structures", The 8th Int'l Conference on Solid-State Sensors and Actuators, and Eurosensors IX; Jun. 25-29, 1995; pp. 21-24; Stockholm, Sweden.

Taylor, et al., "'Spatial Forming' A Three Dimensional Printing Process", IEEE, 1995, pp. 203-208.

Weeden, Otto, Keithley Instruments, Inc. "Probe Card Tutorial", pp. 1-40.

International Search Report and Written Opinion dated Jan. 3, 2024, European Patent Office, Int'l App. No. PCT/US2023/026588 filed Jun. 29, 2023, 10 pages.

International Search Report and Written Opinion dated Oct. 11, 2023, European Patent Office, Int'l App. No. PCT/US2023/026590 filed Jun. 29, 2023, 10 pages.

International Search Report and Written Opinion dated Nov. 28, 2023, European Patent Office, Int'l App. No. PCT/US2023/026593 filed Jun. 29, 2023, 16 pages.

\* cited by examiner

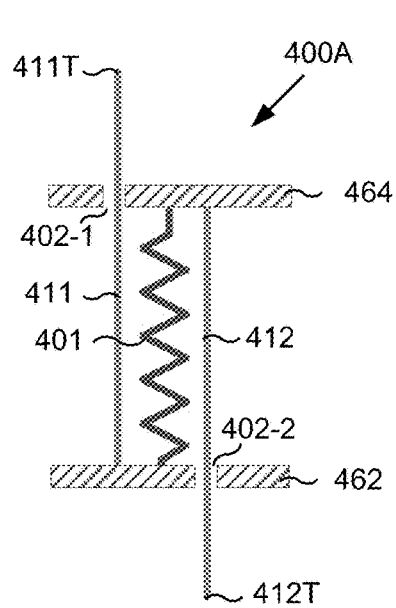
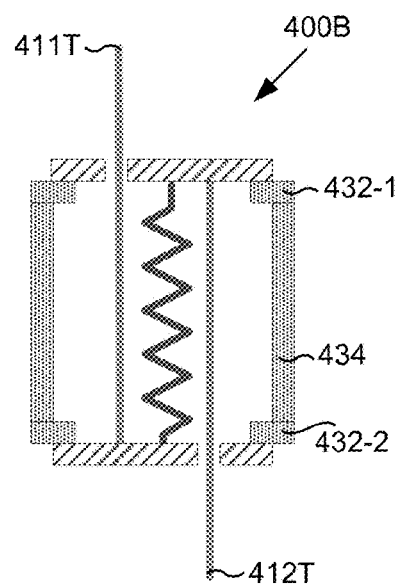
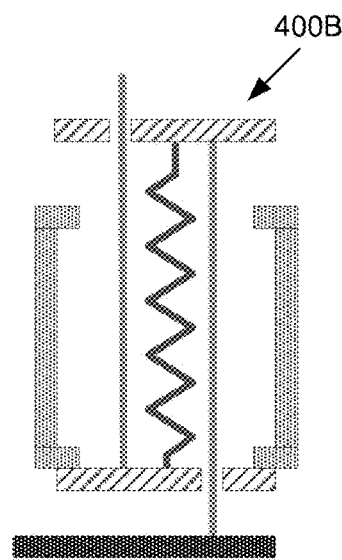
FIG. 4A     FIG. 4B-1     FIG. 4B-2
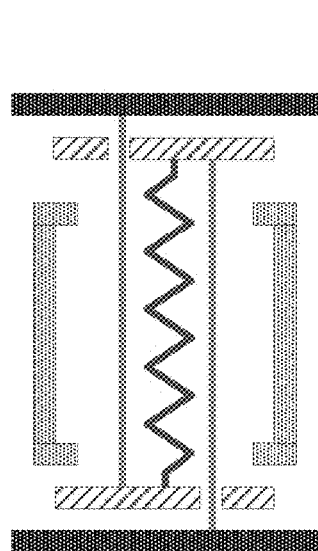
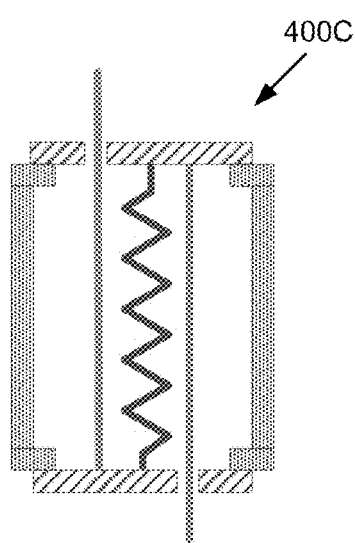
FIG. 4B-3     FIG. 4C Base and lower lateral arm of the probe module brought into contact Lower pair of laterally displaceable plates brought into contact with the base Lower plates shifted left - right.

Upper pair of plate & standoff structures lowered to contact the shifted lower plate structures Biasing tool moved upward to contact the lower probe tips Biasing tool moved upward relative to the base to stretch the spring and move the upper lateral arm upward The upper plates are laterally shifted left and right.

The biasing tool is removed and the spring allowed to compress

The base is removed leaving probes with pre-biased springs held by upper and lower guide plates

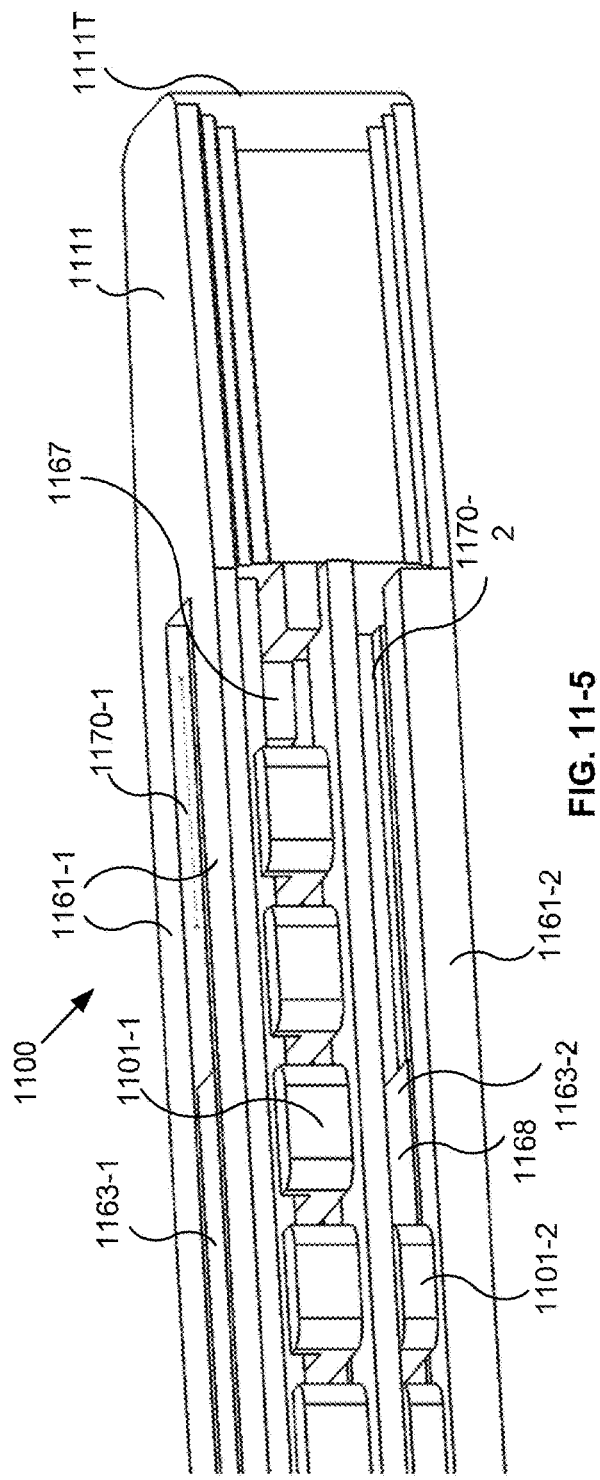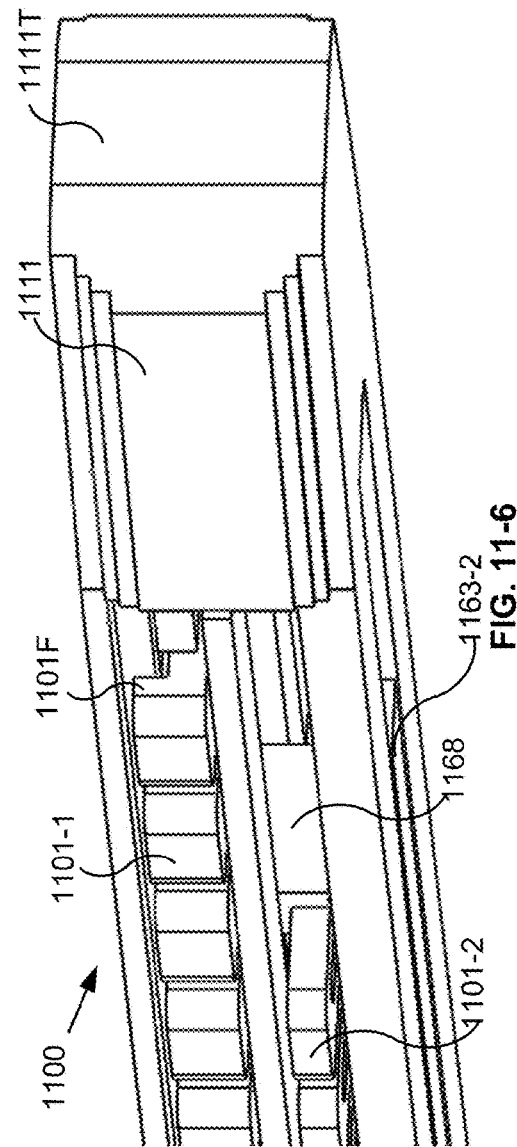

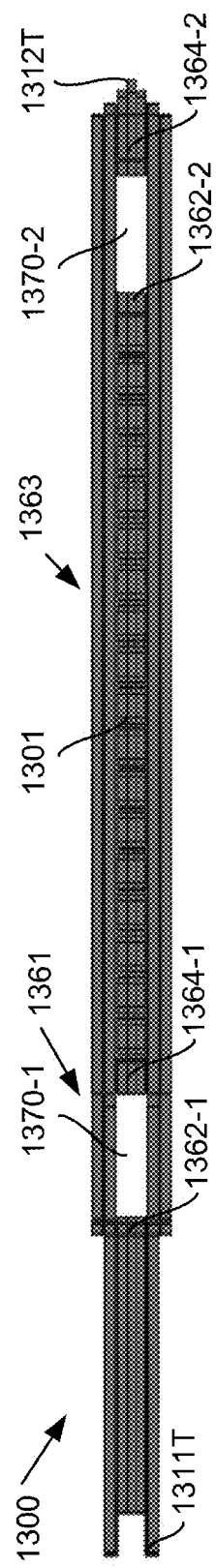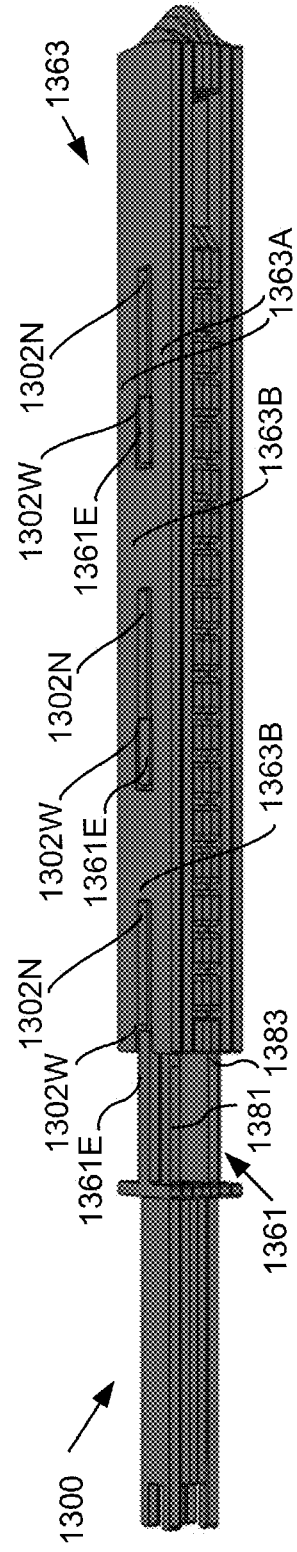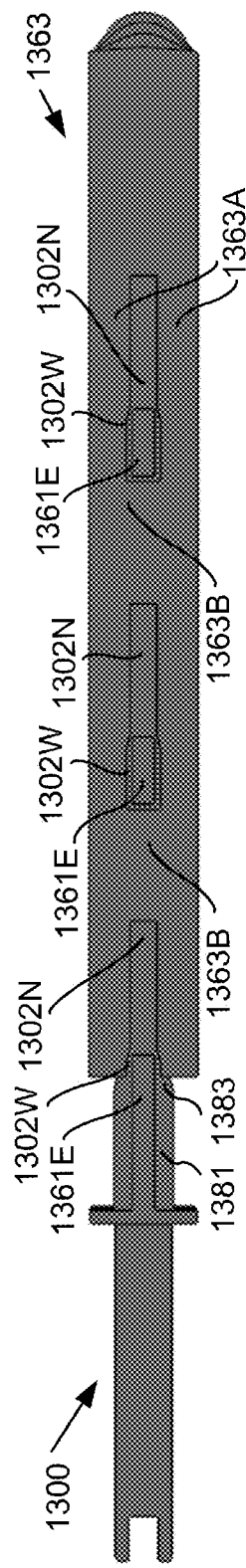
FIG. 13A1  FIG. 13A2  FIG. 13A3

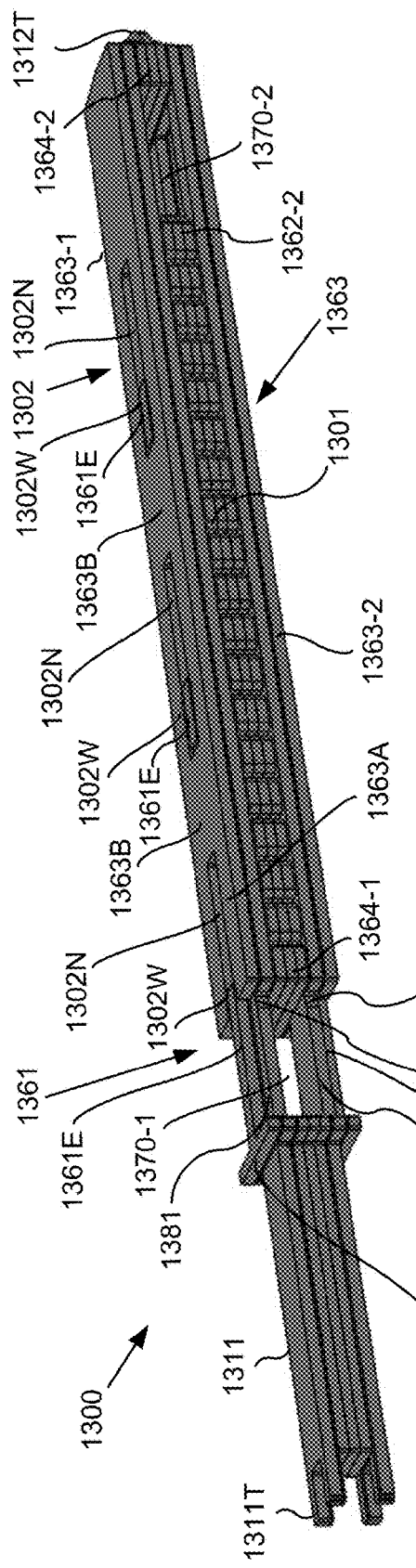
FIG. 13A4
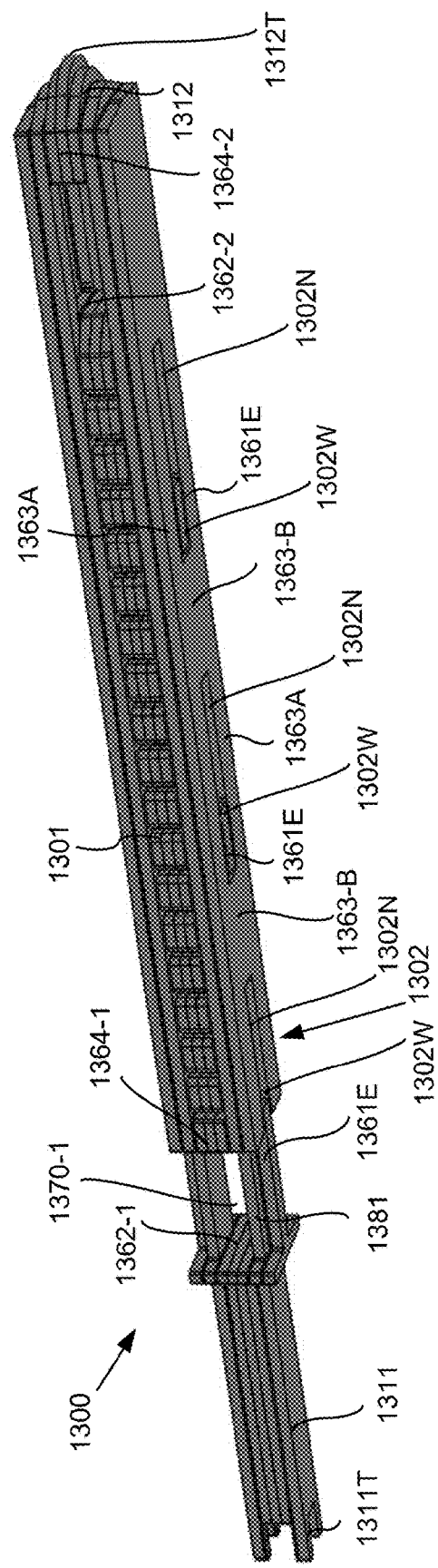
FIG. 13A5

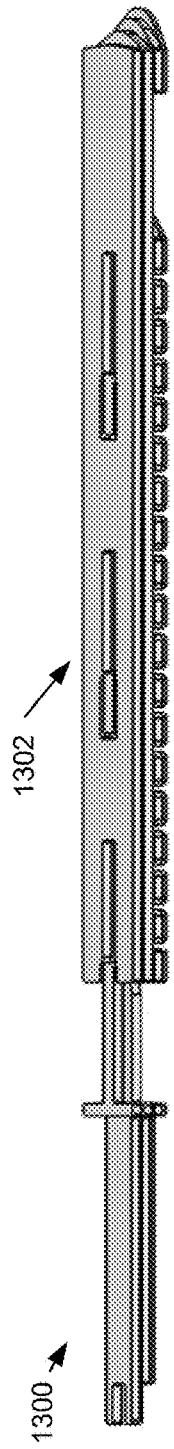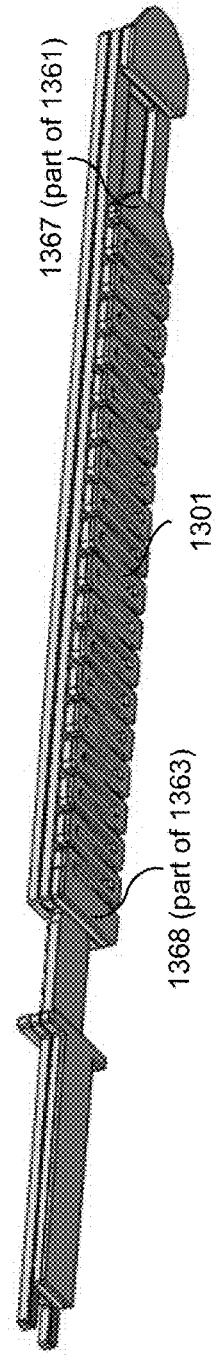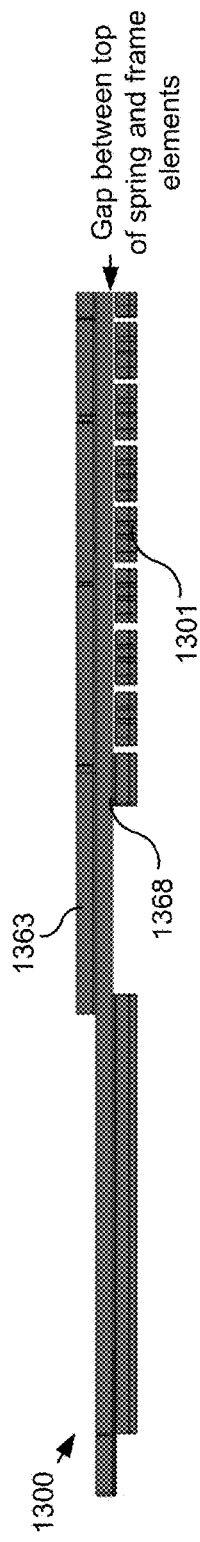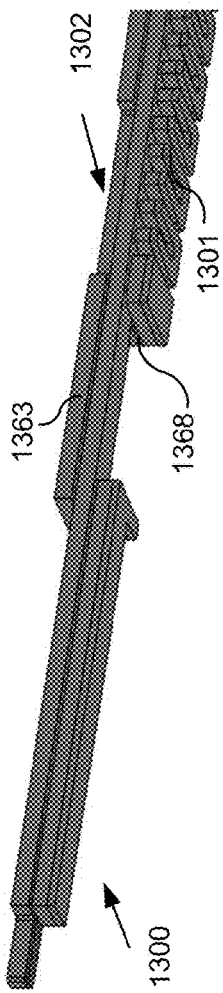
FIG. 13B1　FIG. 13B2　FIG. 13C1　FIG. 13C2

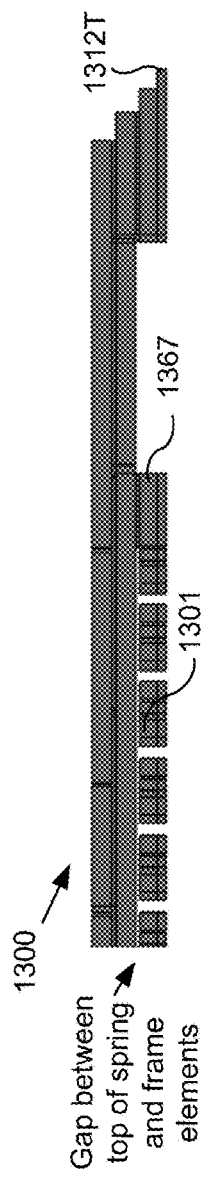
FIG. 13D1
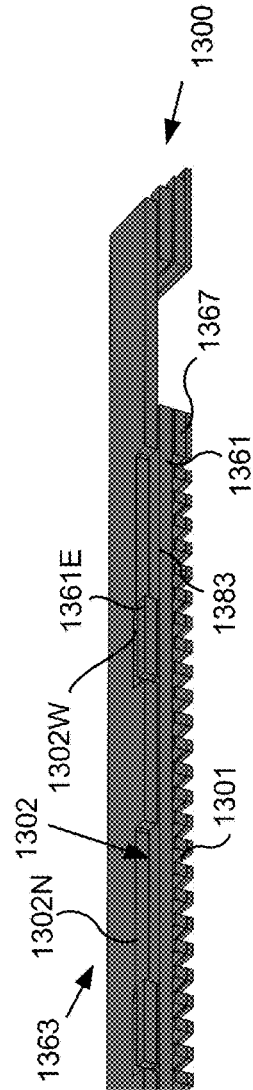
FIG. 13D2
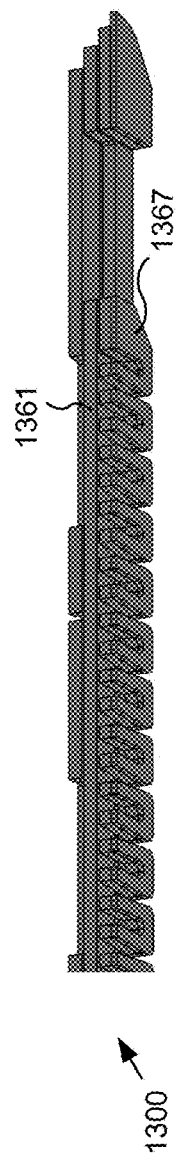
FIG. 13D3
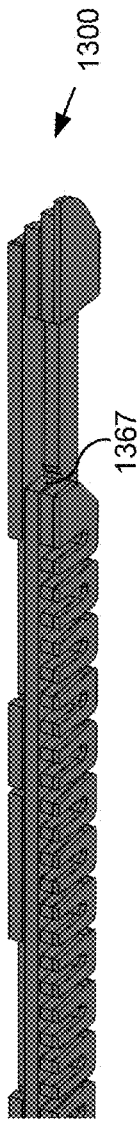
FIG. 13D4

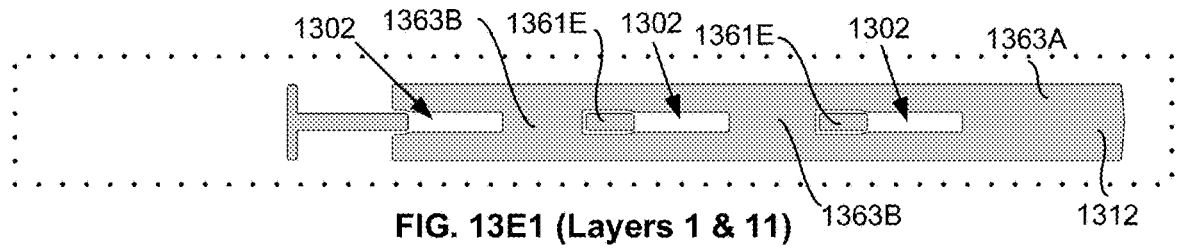
FIG. 13E1 (Layers 1 & 11)
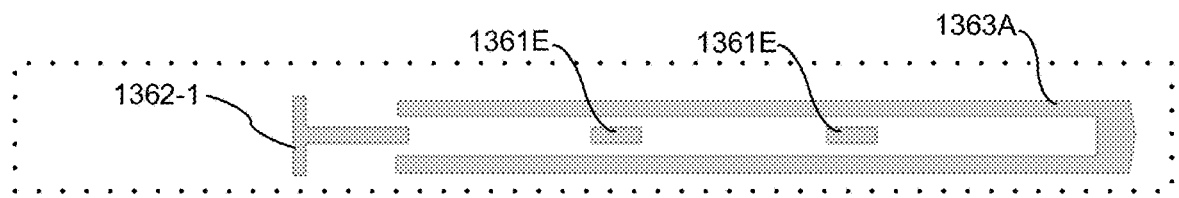
FIG. 13E2 (Layers 2 & 10)
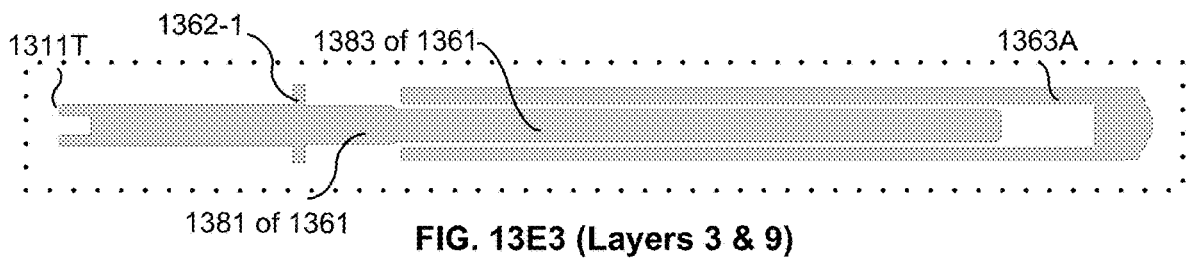
FIG. 13E3 (Layers 3 & 9)
FIG. 13E4 (Layers 4 & 8)
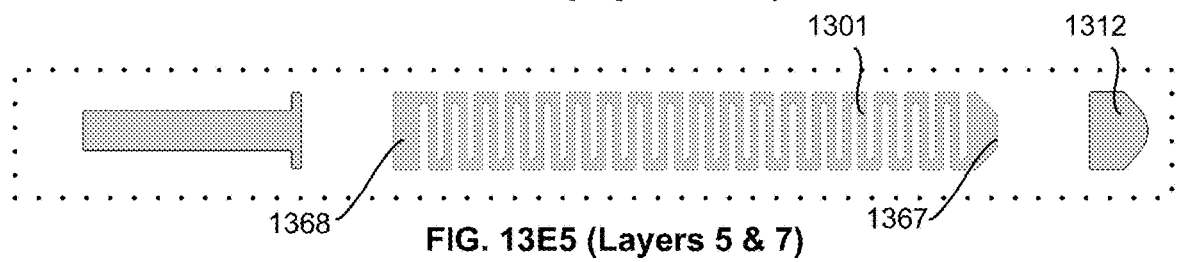
FIG. 13E5 (Layers 5 & 7)
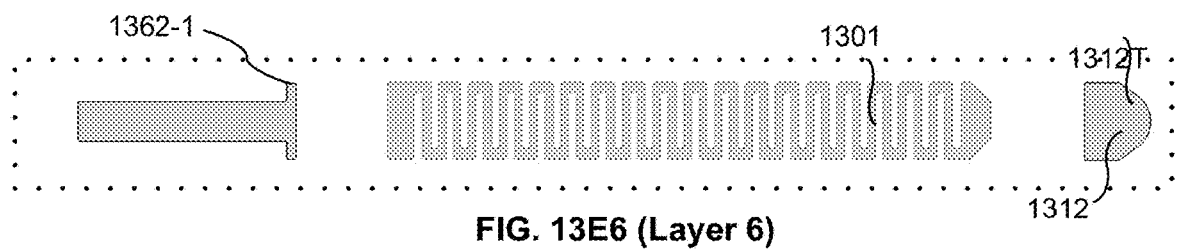
FIG. 13E6 (Layer 6)

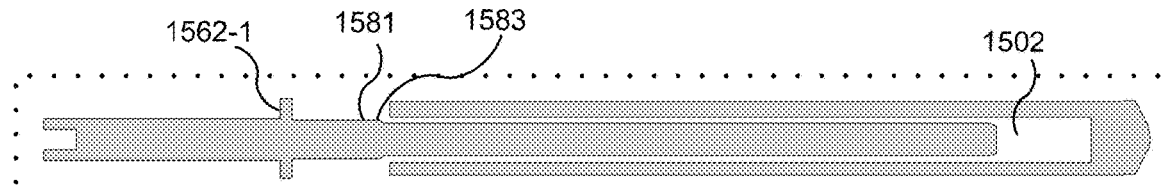
FIG. 15A1
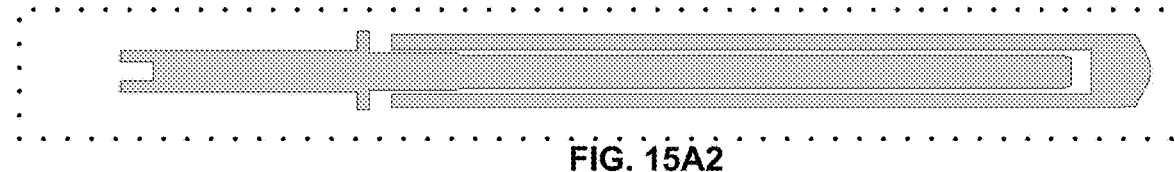
FIG. 15A2
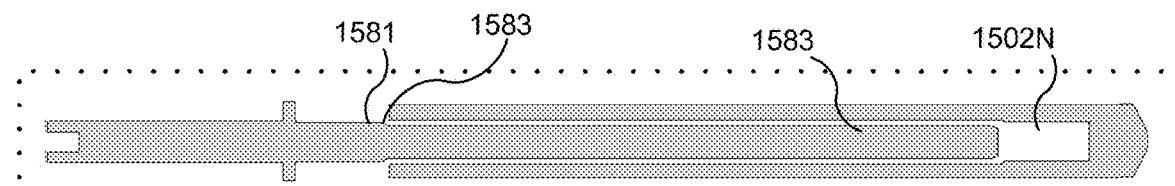
FIG. 15B1
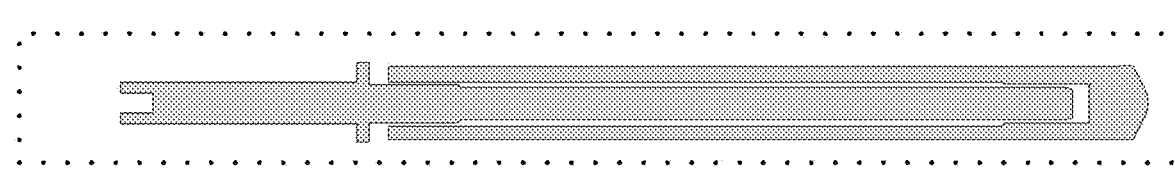
FIG. 15B2
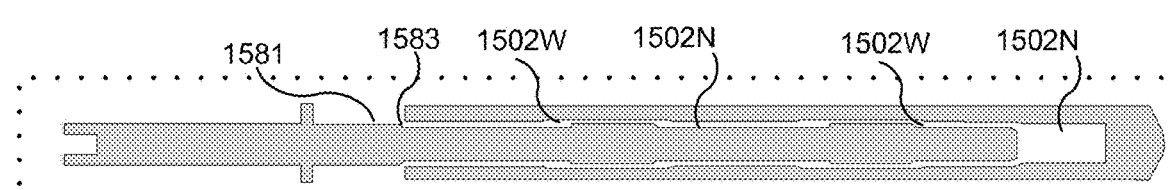
FIG. 15C1
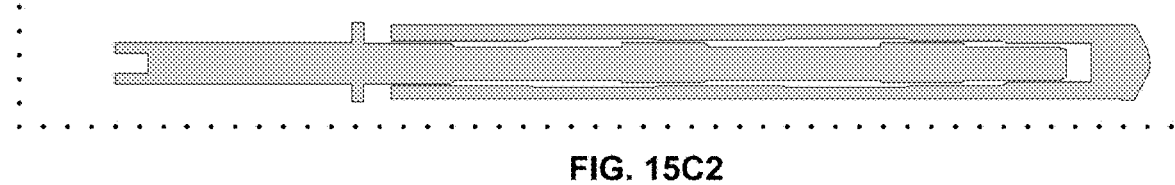
FIG. 15C2

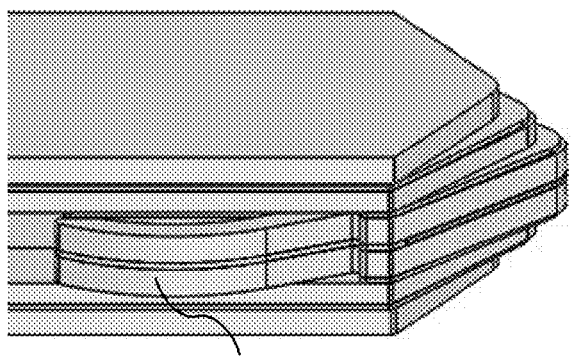
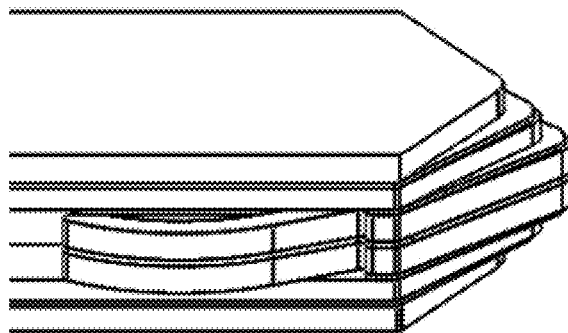
FIG. 18A
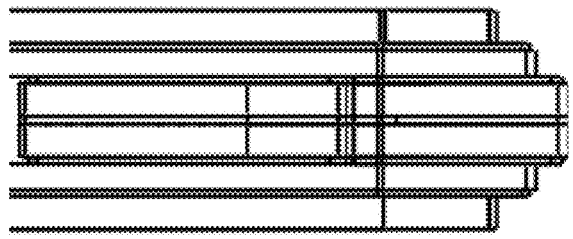
FIG. 18B
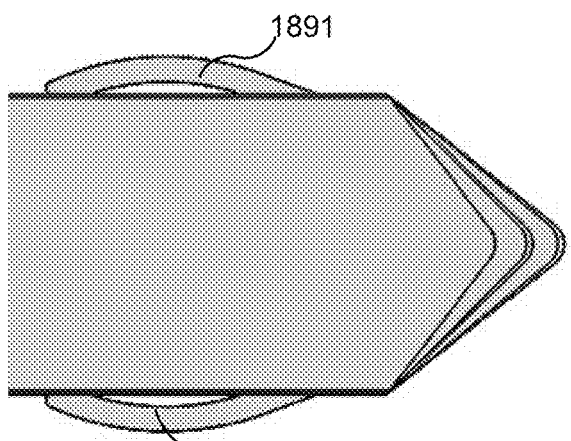
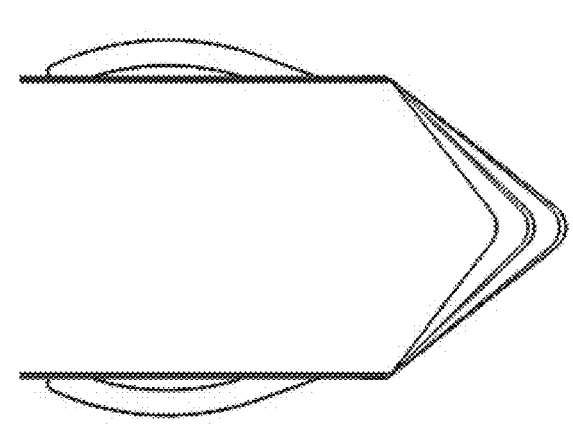
FIG. 18C

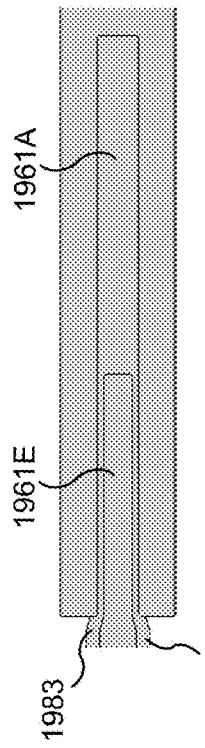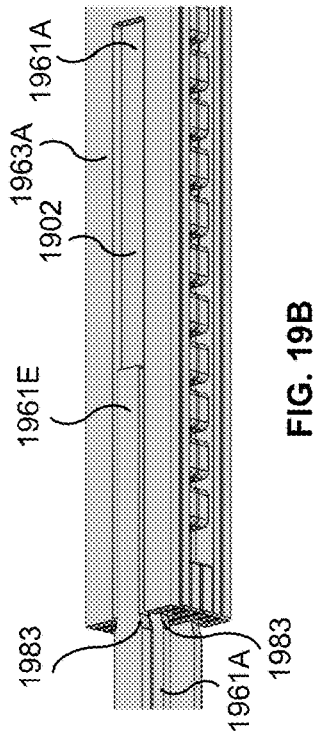
FIG. 19A
FIG. 19B
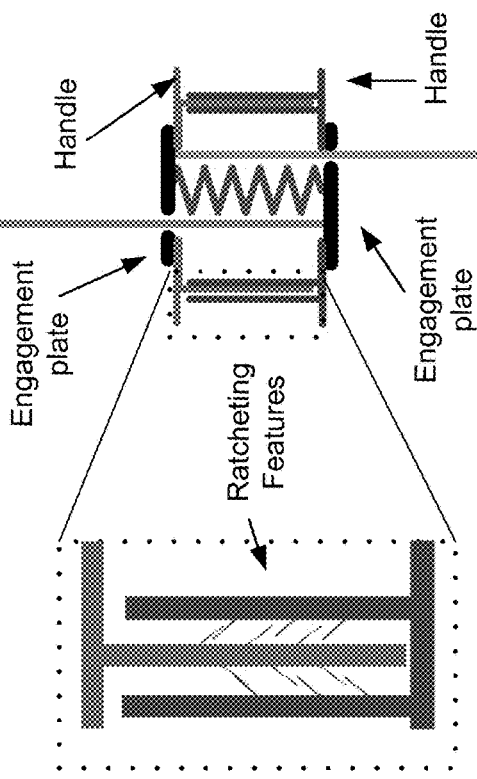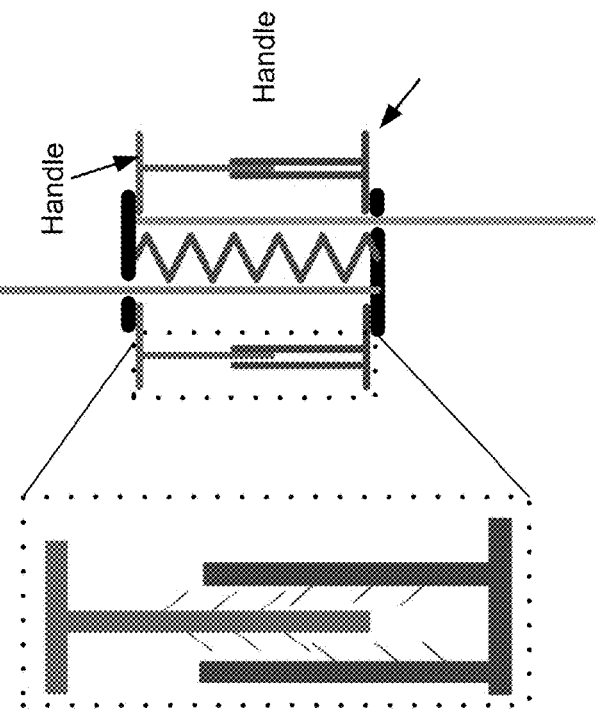
FIG. 20A
FIG. 20B

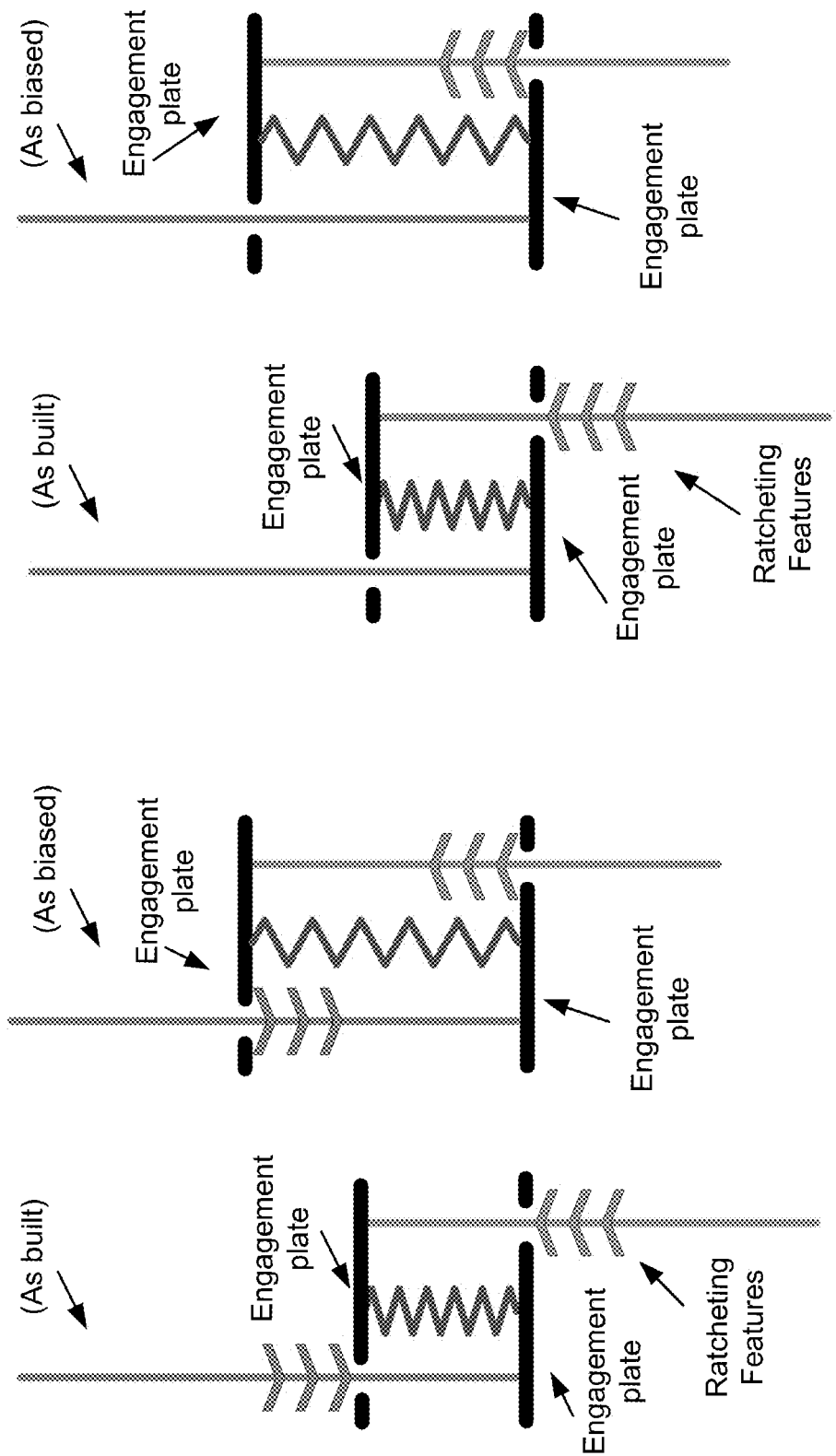

COMPLIANT PIN PROBES WITH EXTENSION SPRINGS, METHODS FOR MAKING, AND METHODS FOR USING

RELATED APPLICATIONS

The below table sets forth priority claims for the instant application. Each of the listed applications is incorporated herein by reference as if set forth in full herein.

| App. No. | Continuity Type | App. No. | Which was Filed | Which is now | Which issued on | Dkt No. Fragment |
|---|---|---|---|---|---|---|
| This application | CBO | 63/238,209 | Aug. 29, 2021 | pending | — | 426-A |
| This application | CBO | 63/217,721 | Jul. 1, 2021 | pending | — | 402-B |
| This application | CBO | 63/217,265 | Jun. 30, 2021 | pending | — | 402-A |
| This application | is a CIP of | 17/682,340 | Feb. 28, 2022 | pending | — | 401-B |
| This application | is a CNT of | 17/139,940 | Dec. 31, 2020 | pending | — | 401-A |
| 17/139,940 | CBO | 62/956,122 | Dec. 31, 2019 | expired | — | 383-A |
| 17/139,940 | CBO | 62/961,678 | Jan. 15, 2020 | expired | — | 383-B |
| 17/139,940 | CBO | 62/956,124 | Dec. 31, 2019 | expired | — | 382-A |
| 17/139,940 | CBO | 62/961,675 | Jan. 15, 2020 | expired | — | 382-B |
| 17/139,940 | CBO | 62/961,672 | Jan. 15, 2020 | expired | — | 381-B |
| 17/139,940 | CBO | 62/956,016 | Dec. 31, 2019 | expired | — | 381-A |
| This application | is a CIP of | 17/139,936 | Dec. 31, 2020 | pending | — | 400-A |
| 17/139,936 | CBO | 62/956,122 | Dec. 31, 2019 | expired | — | 383-A |
| 17/139,936 | CBO | 62/961,678 | Jan. 15, 2020 | expired | — | 383-B |
| 17/139,936 | CBO | 62/956,124 | Dec. 31, 2019 | expired | — | 382-A |
| 17/139,936 | CBO | 62/961,675 | Jan. 15, 2020 | expired | — | 382-B |
| 17/139,936 | CBO | 62/961,672 | Jan. 15, 2020 | expired | — | 381-B |
| 17/139,936 | CBO | 62/956,016 | Dec. 31, 2019 | expired | — | 381-A |

FIELD OF THE INVENTION

Embodiments of the present invention relate to probes for testing electronic circuits (e.g. for use in the wafer level testing, chip scale package testing, or socket testing of integrated circuits, or for use in making electrical connections to PCBs or other electronic components). In some embodiments, the probes are microprobes and they may be pin-like probes with spring elements supported by relatively rigid elements wherein the probe heights may be much greater than their lateral dimensions or such dimensions may be comparable. The probes may have single contact elements or multiple contact elements, Embodiments include, or provide, probes having at least one extension spring and may or may not also include one or more compression springs. Probe tips compress toward one another under an elastic return force provided by one or more flat extension springs or segments that provide a return force wherein in some embodiments the extension springs are pre-biased prior to contacting a DUT to be tested and in some embodiments the probe includes relatively movable rigid elements with operational gaps that are smaller than can be generally formed in an assembled state or that have varying gap widths that provide for effective formation as well as stabilized probe operation, while still other embodiments are directed to methods for making probes and/or assembling the probes into probe arrays.

BACKGROUND OF THE INVENTION

Probes

Numerous electrical contact probe and pin configurations have been commercially used or proposed, some of which may qualify as prior art while others may not. Examples of such pins, probes, and methods of making are set forth in the following patent applications, publications of applications, and patents. Each of these applications, publications, and patents is incorporated herein by reference as if set forth in full herein and such applications may or may not be prior art against the present application.

| U.S. Pat. App No., Filing Date U.S. App Pub No., Pub Date U.S. Pat. No., Pub Date | First Named Inventor, "Title" | Dkt No. Fragment |
|---|---|---|
| 10/772,943-Feb. 4, 2004 2005-0104609-May 19, 2005 | Arat, et al., "Electrochemically Fabricated Microprobes" | 097-A |
| 10/949,738-Sep. 24, 2019 2006-0006888-Jan. 12, 2006 | Kruglick, et al., "Electrochemically Fabricated Microprobes" | 119-A |

-continued

| U.S. Pat. App No., Filing Date U.S. App Pub No., Pub Date U.S. Pat. No., Pub Date | First Named Inventor, "Title" | Dkt No. Fragment |
|---|---|---|
| 11/028,945-Jan. 3, 2005 2005-0223543-Oct. 13, 2005 7,640,651-Jan. 5, 2010 | Cohen, et al., "A Fabrication Process for Co-Fabricating a Multilayer Probe Array and a Space Transformer" | 134-A |
| 11/028,960-Jan 3, 2005 2005-0179458-Aug. 18, 2005 7,265,565-Sep. 4, 2007 | Chen, et al. "Cantilever Microprobes for Contacting Electronic Components and Methods for Making Such Probes" | 140-A |
| 11/029,180-Jan. 3, 2005 2005-0184748-Aug. 25, 2005 — | Chen, et al. "Pin-Type Probes for Contacting Electronic Circuits and Methods for Making Such Probes" | 139-A |
| 11/029,217-Jan. 3, 2005 2005-0221644-Oct. 6, 2005 7,412,767-Aug. 19, 2008 | Kim, et al., "Microprobe Tips and Methods for Making" | 122-A |
| 11/173,241-Jun. 30, 2005 2006-0108678-May 25, 2006 | Kumar, et al., Probe Arrays and Method for Making | 137-A |
| 11/178,145-Jul. 7, 2005 2006-0112550-Jun. 1, 2006 7,273,812-Sep. 25, 2007 | Kim, et al., "Microprobe Tips and Methods for Making" | 136-B |
| 11/325,404-Jan. 3, 2006 2006-0238209-Oct. 26, 2006 | Chen, et al., "Electrochemically Fabricated Microprobes" | 153-A |
| 14/986,500-Dec. 31, 2015 2016-0231356-Aug. 11, 2016 10,215,775-Feb. 26, 2019 | Wu, et al. "Multi-Layer, Multi-Material Micro-Scale and Millimeter-Scale Devices with Enhanced Electrical and/or Mechanical Properties" | 296-D |
| 16/584,818-Sep. 26, 2019 — — | Smalley, "Probes Having Improved Mechanical and/or Electrical Properties for Making Contact between Electronic Circuit Elements and Methods for Making" | 376-A |
| 16/584,863-Sep. 26, 2019 — — | Frodis, "Probes Having Improved Mechanical and/or Electrical Properties for Making Contact between Electronic Circuit Elements and Methods for Making" | 377-A |
| 17/139,933-Dec. 31, 2020 — — | Wu, "Compliant Pin Probes with Multiple Spring Segments and Compression Spring Deflection Stabilization Structures, Methods for Making, and Methods for Using" | 399-A |
| 17/240,963-Apr. 26, 2021 — — | Lockard, "Improved Buckling Beam Probe Arrays and Methods for Making Such Arrays Including Forming Probes with Lateral Positions Matching Guide Plate Hole Positions" | 405-A |
| 17/320,173-May 13, 2021 — — | Lockard, "Vertical Probe Arrays and Improved Methods for Making Using Temporary or Permanent Alignment Structures for Setting or Maintaining Probe-to-Probe Relationships" | 406-A |
| 17/493,802-Oct. 4, 2021 | Li, "Shielded Probes for Semiconductor Testing, Methods for Using, and Methods for Making" | 427-A |

Electrochemical Fabrication:

Electrochemical fabrication techniques for forming three-dimensional structures from a plurality of adhered layers have been, and are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this capability, and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved compliant pin probes (e.g. with barrel and plunger type operation or sheath and double plunger operation) with one or more substantially planar spring segments with at least one of the segments being operated in tension with the probes further including sheaths or other rails, slots, channels, spring connector arms, and/or other engagement structures providing enhanced stability of probe performance.

It is an object of some embodiments of the invention to provide a probe including a plurality of spring segments, with at least one being a tensional or extension spring and with the combinations of segments being connected in series and/or in parallel.

It is an object of some embodiments of the invention to provide a probe including multiple spring segments with at least two of the spring segments being spaced from one another but at least partially overlaying one another with a side-to-side or face-to-face orientation.

It is an object of some embodiments of the invention to provide improved probe arrays.

It is an object of some embodiments of the invention to provide methods for making improved probes.

It is an object of some embodiments of the invention to provide a probe having at least one movable contact tip with an opposite end of the probe having a structure that is to be bonded or attached to an electrical interface, or contact to an electrical interface via a tip that forms part of a probe body, sheath or barrel.

It is an object of some embodiments of the invention to provide a probe with a sheath that has at least one end cap that restrains excessive longitudinal movement of at least one tip from that end of the probe.

It is an object of some embodiments of the invention to provide a probe that has at least two movable contact tips for contacting different electronic components or different pads or bumps on the same electronic component relative to a sheath, barrel or other non-moving portion of the probe.

It is an object of some embodiments of the invention to provide a probe with the sheath having at least two end caps that restrain excessive longitudinal movement of the tips from either end of the probe.

It is an object of some embodiments of the invention to provide a pin-like probe having two tips, with at least one being a contact tip wherein the probe has a configuration that enhances pointing accuracy of the two tips (i.e. reduces lateral misplacement of tips when making contact or undergoing compression and/or reduces angular misalignment of longitudinal elements that hold the tips and allow their longitudinal movement with respect to one another wherein, for example, the configuration provides for reduced gaps or clearance between one or more longitudinal arms or plungers relative to channels or barrels they move through after an initial compression of the tips toward one another (which may be a pre-biasing compression or a compression while in a working state).

It is an object of some embodiments of the invention to provide probes with enhanced pointing accuracy by providing narrowed gaps or clearance at one or more (e.g., starting, periodic, or ending) locations along a length of a channel or barrel relative to an arm or plunger.

It is an object of some embodiments of the invention to provide probes with enhanced pointing accuracy by providing narrowed channel or barrel dimensions at one or more (e.g., starting, periodic, and/or ending) locations along a length of a channel or barrel.

It is an object of some embodiments of the invention to provide probes with enhanced pointing accuracy by providing widened arm or plunger dimensions at one or more (e.g., starting, periodic, or ending) locations along a length of the arm, arms, plunger, or plungers.

It is an object of some embodiments of the invention to form probes on their sides, e.g., with the longitudinal axis of the probe being perpendicular to a normal direction of the planes of layers from which the probes are formed It is an object of some embodiments of the invention to form probes on their sides wherein any smooth curved features of the probe are formed within individual layers while changes in probe configuration from layer to layer are provided with stair stepped or at least partially discontinuous transitions.

It is an object of some embodiments of the invention to provide configurations that improve pointing alignment within a single layer, while it is an object of other embodiments to provide configurations that improve pointing alignment via multiple adjacent layers, while it is an object of still other embodiments to provide configurations that improve pointing alignment that are located on non-adjacent layers.

It is an object of some embodiments of the invention to provide a probe that is configured to provide shunting of a majority of the current through a sheath as opposed to through a majority of the length of the spring elements.

It is an object of some embodiments of the invention to provide a probe with a configuration that provides a compliant element attached to the sheath that is in direct or indirect sliding contact with the moving tip.

It is an object of some embodiments of the invention to provide a probe with a configuration that provides a compliant element attached directly or indirectly to the moving tip and is in direct or indirect sliding contact with a sheath.

It is an object of some embodiments of the invention to provide a method of forming a probe, or a plurality of probes simultaneously, with at least a portion of each of the plurality of spring segments of a probe formed within an opening in a sheath.

It is an object of some embodiments of the invention to provide a method of forming a probe, or a plurality of probes simultaneously, with all of the plurality of spring segments of a probe formed within an opening in a sheath.

It is an object of some embodiments of the invention to provide a probe with a sheath that is formed as multiple components, with the components pushed longitudinally together after formation to load the spring segments and to join the multiple components.

It is an object of some embodiments of the invention to provide a probe with a joining structure or structures that are configured to allow the moving of a compliant element through an engagement feature that inhibits unjoining.

It is an object of some embodiments of the invention to provide a probe with at least some spring segments that undergo tensional loading when transitioning from a build configuration to a working configuration.

It is an object of some embodiments of the invention to provide transitioning that includes moving a compliant element through an engagement feature that inhibits movement back to a build configuration.

It is an object of some embodiments of the invention to provide probes with sheaths that include one or more ratcheting or stepped locking mechanisms and a fixed extension stop that allow the probe to be formed in a compressed or compacted state (using less batch wafer real estate for a body or sheath portion of the probe) and then two portions of the sheath pulled apart longitudinally to engage the at least one ratcheting mechanism without risk of overextending the springs or sheath components such that the probe is held in an elongated or stretched state with at least one pre-biased extension spring.

It is an object of some embodiments of the invention to provide probes with sheaths that include one or more ratcheting or stepped locking mechanisms, a fixed extension stop as well as a secondary retention lock that allow the probes to be formed in a compressed or compacted state (using less batch wafer real estate for a body or sheath portion of the probe) and then two portions of the sheaths pulled apart longitudinally to engage the at least one ratcheting mechanism and the secondary lock without risk of overextending the springs or sheath components such that the probes are held in an elongated or stretched state with at least one pre-biased extension spring.

It is an object of some embodiments of the invention to provide extension probes with arm-to-spring mounting plates with openings therein that probe tip arms or probe tip extensions can extend, with the probe arms including at least one ratcheting feature that can be formed between the mounting plates and that can be moved beyond the mounting plates to permanently bias at least one extension spring such that during use, the extension spring always has a non-zero initial bias or pre-load.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively they may address some other object ascertained from the teachings herein. It is not intended that any particular object, let alone all objects, be addressed by any single aspect of the invention.

In a first aspect of the invention, a probe for testing a DUT, includes: (a) a first tip for making electrical contact to an electrical circuit element, the first tip having a contact region and an attachment region; (b) a first extension arm connecting directly or indirectly to the attachment region of the first tip; (c) a compliant structure including at least one spring segment, wherein a first region of the compliant structure joins the first extension arm; (d) a second extension arm joining a second region of the compliant structure such that relative displacement of the first and second extension arms results in elastic movement of the at least one spring segment of the compliant structure; and (e) a second tip having an first attachment region and a second region (e.g. a contact region region) wherein the first attachment region joins the second extension arm, wherein the at least one spring segment operates under tension to provide an elastic restoration force.

Numerous variations of the first aspect of the invention are possible and include, for example: (1) the at least one spring segment including a plurality of spring segments; (2) the at least one spring segment including a plurality of spring segments with at least one of the plurality of spring segments operating under compression to provide a restoring force; (3) the probe further including at least two stop structures to allow pre-biasing of at least one of the spring segments; (4) the probe further including at least two movable stop structures to allow pre-biasing of at least one of the spring segments; (5) the probe additionally including features that can engage with features on an array structure to allow for pre-biasing of at least one spring segment; (6) the probe additionally including at least one shunting element that directs current from one of the first or second extension arms through a non-compliant structure and then through the other of the first or second extension arms; (7) the sixth variation wherein the at least one shunting structure is a surface against which the extension arms slide; (8) the probe further including at least one guidance element that limits relative movement of the first tip and the second tip along a substantially longitudinal axis of the probe; (9) the at least one spring segment includes at least two spring segments that are joined together in a serial configuration; (10) the ninth variation with the at least two joined spring segments operating in tension; (11) the ninth variation with at least one of the at least two joined segments operating in tension while another of the at least two joined segments operates in compression; (12) the ninth variation with the at least two spring segments being flat spring segments and being spaced from one another but at least partially overlay one another in a face-to-face configuration; (13) the ninth variation with the at least two spring segments being flat springs and being separated from one another by an intermediate surface against which at least one of the spring segments can slide; and (14) the probe including a sheath in which at least a portion of the at least one segment of the compliant structure moves. Many further variations are possible and will be understood by those of skill in the art upon reviewing the teachings herein.

In a second aspect of the invention, a probe for testing a DUT, includes: (a) a first tip for making electrical contact to an electrical circuit element, the first tip having a first contact region and a first connection region; (b) a first extension arm connecting directly or indirectly to the first connection region of the first tip; (c) a compliant structure including at least one first spring segment, wherein a first region of the compliant structure connects directly or indirectly to the first extension arm; (d) a second extension arm connecting directly or indirectly to a second connection region of the compliant structure such that relative displacement of the first extension arm and the second extension arm results in elastic movement of the at least one first spring segment of the compliant structure; and (e) a second tip having a first connection region and a second region wherein the first connection region joins the second extension arm, wherein the at least one spring undergoes increased extension upon relative displacement of the first tip and the second tip toward one another along the longitudinal axis of the probe, and wherein the second region of the second tip is configured for making an electrical connection to a second circuit element, wherein the configuration is selected from the group consisting of: (1) a tip for making a contact connection, and (2) a tip for making an attached connection.

Numerous variations of the second aspect of the invention are possible and include, for example, those noted with regard to the first aspect. Additional variations include, for example: (1) the probe further including at least one structure that is directly or indirectly attached to an end of the at least one spring for providing a function selected from the group consisting of: (1) providing a stop structure that moves with the end of the spring as a first tip and second tip are moved relative to one another; and (2) providing for relative longitudinal motion of the first tip relative to the second tip while inhibiting excessive lateral motion of at least one of the first tip or the second tip, and/or (2) a rigid probe body providing a frame which supports the relative lateral positioning of the compliant structure, the first extension arm, and the second tip extension arm while allowing at least one of the first extension arm and first tip or the second extension arm and second tip to move longitudinally, via an external compressive force applied to the first and/or second tips, through a working range of longitudinally extended probe length to longitudinally compressed probe length while increasing a tensional force on the at least one first spring segment and moving longitudinally through a working range of longitudinally compressed probe length to extended probe length under a force of extension provided, at least in part, by the tensional force stored in the at least one first spring segment.

In a third aspect of the invention, a probe for testing a DUT, includes: (a) a first tip for making electrical contact to an electrical circuit element, the first tip having a contact region and a first extension arm having an attachment region; (b) a first structure connecting directly or indirectly to the attachment region of the first extension arm; (c) a compliant structure comprising at least one spring segment, wherein a first region of the compliant structure joins the first extension arm; (d) a second region of the compliant structure, different from the first region, joining, directly or indirectly, a second structure that is configured for longitudinal sliding relative to the first structure such that relative displacement of the first and second structures results in elastic movement of the at least one spring segment of the compliant structure; and (e) a second tip joining, directly or indirectly, the second structure, wherein the first and second structures move relative to each other via at least one guidance structure that may be part of a structure selected from the group consisting of: (1) the first, (2) the second structure, and (3) a third structure, wherein the at least one guidance structure limits movement of the first and second structures to substantially longitudinal movement wherein the at least one guidance structure provides features that provide enhanced stability and/or pointing accuracy of the tips after a relatively small amount of compressive movement of the tips relative to one another such that the majority of compressive movement of the tips occurs with an increased level of stability and/or pointing accuracy, wherein at least one of the features that provides enhanced stability and/or pointing accuracy comprises an effective narrowing of a clearance between an element that slides that is smaller than an effective clearance prior to the spring being biased, wherein the at least one spring segment operates under tension to provide an elastic restoration force, and wherein the second region of the second tip is configured for making an electrical connection to a second circuit element, wherein the configuration is selected from the group consisting of: (1) a tip for making a contact connection, and (2) a tip for making an attached connection.

Numerous variation of the probe of the third aspect are possible and include, for example: (1) any of the variations noted for the first or second aspects, (2) the at least one of the features that provides enhanced stability and/or pointing accuracy comprises a plurality of features that are located at spaced longitudinal portions of the probe; (3) the probe of the first variation wherein the plurality is selected from the group consisting of: (a) at least two, (b) at least three, and (c) at least four; (4) the probe of the third aspect or its variations wherein the probe has a length selected from the group consisting of: (a) less than 1 mm, (b) less than 2 mm, (c) less than 3 mm, (d) less than 5 mm, (e) less than 8 mm, (f) more than 0.5 mm, (g) more than 1 mm, (h) more than 2 mm, (i) more than 3 mm, (j) more than 5 mm, and (k) more than 8 mm; (5) the probe of the third aspect or its variations wherein the probe has a width selected from the group consisting of: (a) less than 100 um (microns), (b) less than 200 um, (c) less than 300 microns, (d) less than 400 um, and (e) less than 600 microns; (6) the probe of the third aspect or its variations wherein the probe is configured in an array for wafer level testing; (7) the probe of the third aspect or its variations wherein the probe is configured in an array for socket testing of one or more packaged ICs; (8) the probe of the third aspect or its variations wherein the probe does not induce tip-to-tip rotation during compression.

Additional variations of the third aspect or its variations include the enhanced level of stability and/or pointing accuracy being selected from the group consisting of: (1) higher than the stability and/or pointing accuracy in absence of the at least one feature that provides an effective narrowing of a clearance between an element that slides that is smaller than an effective clearance prior to the spring being biased, wherein the smaller clearance is smaller by an amount selected from the group consisting of (a) at least two microns, (b) at least four microns, (c) at least 6 microns, (d) at least eight microns, and (e) at least 10 microns, (f) less than ⅞ of the clearance prior to biasing, (g) less than ¾ of the clearance prior to biasing, (h) less than ¾ of the clearance prior to biasing, (i) less than ⅝ of the clearance prior to biasing, (j) less than ½ of the clearance prior to biasing, (k) less than ⅜ of the clearance prior to biasing, (l) less than ¼ of the clearance prior to biasing, (m) less than ⅛ of the clearance prior to biasing; (2) the stability and/or pointing accuracy when making to an electronic component for a given level of spring compression is selected from the group consisting of: (a) less than ten microns, (b) less than eight microns, (c) less than six microns, (d) less than four microns, and (e) less than two microns, (f) less than ⅞ of the stability and/or pointing accuracy in absence of the clearance reduction, (g) less than ⅞ of the stability and/or pointing accuracy in absence of the clearance reduction, (h) less than ¾ of the stability and/or pointing accuracy in absence of the clearance reduction, (i) less than ⅝ of the stability and/or pointing accuracy in absence of the clearance reduction, (j) less than ½ of the stability and/or pointing accuracy in absence of the clearance reduction, (k) less than ⅜ of the stability and/or pointing accuracy in absence of the clearance reduction, (l) less than ¼ of the stability and/or pointing accuracy in absence of the clearance reduction, (m) less than ⅛ of the stability and/or pointing accuracy in absence of the clearance reduction.

In a fourth aspect of the invention, a probe for testing a DUT includes: (a) a first tip for making electrical contact to an electrical circuit element, the first tip having a contact region and an attachment region; (b) a first tip arm connecting directly or indirectly to the attachment region of the first tip, wherein the first tip arm holds, directly or indirectly, at least one first ratcheting element; (c) a first engagement plate with a first hole, joined directly or indirectly to the first tip arm; (d) a compliant structure, including at least one extension spring, wherein a first region of the compliant structure joins directly or indirectly the first engagement plate; (e) a second engagement plate with a second hole, joined directly or indirectly to the compliant structure and with the first tip arm passing through the hole of the second engagement plate with the at least one first ratcheting element on the opposite side of the second engagement plate relative to the compliant structure when in an as built state, and on the same side of the second engagement plate when in a pre-biased working state; (f) a second tip arm directly or indirectly joined to the second engagement plate, and wherein the second tip arm passes through the first opening in the first engagement plate; (g) a second tip having a first attachment region and a second region wherein the first attachment region of the second tip joins the second tip arm; and wherein the at least one extension spring operates under tension to provide an elastic restoration force, and wherein the second region of the second tip is configured for making an electrical connection to a second circuit element, wherein the configuration is selected from the group consisting of:

(1) a tip for making a contact connection, and (2) a tip for making an attached connection.

Numerous variations of the four aspect of the invention are possible and include, for example the second tip arm holding, directly or indirectly, at least one second ratcheting element and wherein the at least one second ratcheting element of the second arm being on the opposite side of the first engagement plate relative to the compliant structure when in an as built state, and on the same side of the first engagement plate when in a pre-biased working state. Other variations include features set forth in other aspects and embodiments of the invention as well as in variations of those aspects and embodiments.

In a fifth aspect of the invention a probe for testing a DUT, includes: (a) a first tip for making electrical contact to an electrical circuit element, the first tip having a contact region and an attachment region; (b) a first tip arm connecting directly or indirectly to the attachment region of the first tip; (c) a first engagement plate with a first hole, joined directly or indirectly to the first tip arm; (d) a compliant structure, including at least one extension spring, wherein a first region of the compliant structure joins directly or indirectly the first engagement plate; (e) a second engagement plate with a second hole, joined directly or indirectly to the compliant structure and with first tip arm passing through the hole of the second engagement plate; (f) a second tip arm directly or indirectly joined to the second engagement plate, wherein the second tip arm passes through the first opening in the first engagement plate; (g) a second tip having a first attachment region and a second region wherein the first attachment region of the second tip joins the second tip arm; and (h) a multi-part sheath having a first biasing portion and a second biasing portion wherein the first biasing portion includes a first feature that engages the compliant structure side of the first engagement plate and the second biasing portion includes a second feature that engages the compliant structure side of the second engagement plate and wherein the first and second biasing portions include first and second ratcheting features on first and second longitudinally extended elements, respectively, that can move at least partially passed one another wherein at least one first ratcheting feature and at least one second ratcheting feature have initial positions with respect to one another while the probe is in an as built state, and final position with respect to one another while in a pre-biased working state, wherein the initial position locates the first ratcheting feature at a position selected from the group consisting of: (i) closer to the second engagement plate than when in the final position, (ii) further from the first engagement plate than when in a final position, and (iii) less centrally, longitudinally located than when in the final position, wherein the at least one extension spring operates under tension to provide an elastic restoration force, and wherein the second region of the second tip is configured for making an electrical connection to a second circuit element, wherein the configuration is selected from the group consisting of: (1) a tip for making a contact connection, and (2) a tip for making an attached connection.

Numerous variations of the fifth aspect of the invention are possible and include, for example: (1) the initial position locates the second ratcheting feature closer to the first engagement plate than when in the final position; (2) the initial position locates the second ratcheting feature further from the second engagement plate than when in a final position, and (3) the initial position locates the second ratcheting feature less centrally, longitudinally located than when in the final position, and (4) the at least one first ratcheting feature comprises at least two ratcheting features on opposite sides of the probe and wherein the at least one second ratcheting feature comprises at least two ratcheting features on opposite sides of the probe. Other variations include features set forth in other aspects and embodiments of the invention as well as in variations of those aspects and embodiments.

In a sixth aspect of the invention, a probe array for testing a DUT, includes: (1) at least one array structure having a plurality of openings defining at least in part lateral positions of a plurality of probes; and (2) a plurality of probes located in the plurality of openings, wherein each of the plurality of probes comprises a probe selected from the group consisting of: (1) the first aspect, (2) the second aspect, (3) the third aspect, (4) the fourth aspect, (5) the fifth aspect, (6) a variation of any of the first to fifth aspects.

Numerous variations of the sixth aspect of the invention are possible and include, for example variations of the first to fifth aspects as noted above, mutatis mutandis. Additional variations include, for example: (1) the at least one array structure being a guide plate; (16) the at least one array structure being a plurality of plates; (2) the probes including fixed flange-like structures for engaging perimeters of the openings; (3) the probes including movable flange-like structures for engaging perimeters of the openings; (4) the probes including lower flange-like structures with upper surfaces which engage at least portions of lower perimeter surfaces of an opening in a lower array structure; (5) the probes including upper flange-like structures with lower surfaces which engage at least portions of upper perimeter surfaces of openings in an upper array structure; (6) the probes including the features of both the fifth and sixth variations of the first aspect; (7) the array structure including a lower biasing assembly and an upper biasing assembly with each biasing assembly including two longitudinally stacked plates with openings that can be laterally slid relative to one another to align openings for loading of probes and can be laterally slid to partially close the openings to allow engagement of at least portions of perimeter edges of at least one of the stacked plates with features on the probes to retain the probes; (8) the seventh variation where the lower biasing assembly and the upper biasing assembly include at least two plates with slots into which bridging structures extend which hold the plates together in the direction of their normals while allowing lateral sliding to occur along the planes of the plates; (9) the array structure including multiple spaced plates or assemblies along with standoffs that set a longitudinal (or normal direction) spacing of the plates or assemblies; and (10) the ninth variation wherein the standoffs set a distance between the spaced plates that hold at least one spring segment of each of a plurality of probes in a biased state without the probe tips being compressed toward one another. Still numerous other variations are possible and will be apparent to those skill in the art upon review of the teachings herein.

In a seventh aspect of the invention, a method of forming at least a portion of a plurality of probes using a multi-layer, multi-material fabrication process, includes: (a) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (i) depositing a first of the at least two materials; (ii) depositing a second of the at least two materials; and (b) after the forming of the plurality of successive layers, separating at least a portion of the sacrificial material from the structural material to reveal the three-dimensional structure, wherein the plurality of probes comprises a probe selected from the group consisting of: (1) the first aspect, (2) the second aspect, (3) the third aspect, (4) the fourth aspect, (5) the fifth aspect, and (6) a variation of any of the first to fifth aspects.

Numerous variations of the seventh aspect of the invention are possible and include, for example, variations of the first to fifth aspects. Additional variations include, for example: (1) each of the at least one structural material being a metal; (2) at least one structural material including at least two structural materials with at least one of the at least two structural materials being a dielectric; (3) a longitudinal axis of the plurality of probes extending parallel to a build axis during formation of the probes; (4) a longitudinal axis of the plurality of probes extending perpendicular to a build axis during formation of the probes; (5) the portion of the probes formed by the multi-layer, multi-material fabrication process include the compliant structures which are stacked and combined with the relatively rigid structure after layer fabrication and release has been completed; (6) the portion of the probes formed by the multi-layer, multi-material fabrication process includes the entire probes; (7) the portion of the probes formed by the multi-layer, multi-material fabrication process includes at least the compliant structures; (8) during the multi-layer, multi-material fabrication process, at least a portion of the layers are planarized after deposition of the materials forming those respective layers; (9) the portion of the probes formed by the multi-layer, multi-material fabrication process are subjected to heat treatment to improve one or more properties of the probes; (10) the portion of the probes formed by the multi-layer, multi-material fabrication process are released as individual separate probes from a build substrate prior to assembly into an array configuration; and (11) the portion of the probes formed by the multi-layer, multi-material fabrication process are formed in groups with a lateral spacing of probes in each group during formation corresponding to a lateral spacing to be used in a probe array wherein the probes are released from a build substrate in groups and the groups are assembled into array configurations.

In an eighth aspect of the invention, a method of forming a probe array, includes: (a) providing at least one array structure that includes a plurality of openings for receiving probes wherein the openings are laterally located in an array pattern; (b) providing a plurality of probes, formed using a multi-layer, multi-material fabrication process, including: (i) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (1) depositing a first of the at least two materials; (2) depositing a second of the at least two materials; and (ii) after the forming of the plurality of successive layers, separating at least a portion of the sacrificial material from the structural material to reveal the three-dimensional structure, wherein the probe includes the probe of any of the first to fifth aspects or variations of such aspects; and (c) loading the probes into the openings in the at least one array structure and securing the probes in position in a fixed or longitudinally movable manner.

Numerous variations of the eighth aspect of the invention are possible and include, for example, those noted with regard to the seventh aspect. Still other variations are possible and will be apparent to those skill in the art upon review of the teachings herein.

In a ninth aspect of the invention, a method of forming a probe array, includes: (a) providing at least two plate-like structures with each including a plurality of openings for receiving probes wherein the openings are laterally located in an array pattern; (b) providing a plurality of probes, formed using a multi-layer, multi-material fabrication process, including: (i) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (1) depositing a first of the at least two materials; (2) depositing a second of the at least two materials; and (ii) after the forming of the plurality of successive layers, separating at least a portion of the sacrificial material from the structural material to reveal the three-dimensional structure, wherein the probe includes the probe of any of the first to fifth aspects or variations of such aspects; and (c) loading the probes into the openings in the two plate-like structures and setting a desired longitudinal spacing between the plate-like structures.

Numerous variations of the ninth aspect of the invention are possible and include, for example, those noted with regard to the seventh aspect. Still numerous other variations are possible and will be apparent to those skill in the art upon review of the teachings herein.

In a tenth aspect of the invention, a method of forming a probe array, includes: (a) providing at least first and second plate-like assemblies with each including at least first and second plate-like structures that are held together longitudinally but are capable of lateral sliding relative to one another, the assemblies also including a plurality of openings for receiving probes that extend through the structures of the first and second plate-like assemblies; (b) providing at least one standoff; (c) providing at least one base plate; (d) providing a plurality of probes with each having features set forth in any of the first—fifth aspect including at least one tensional spring segment and at least first and second movable stops; (e) laterally positioning the probes with respect to the base; (f) longitudinally moving the probes and the base together such that the probes have first ends that extend into an opening in the base and the first moving stop of the probe engages a surface of base; (g) laterally positioning and longitudinally loading the first plate-like assembly over the base; (h) laterally shifting at least two plate-like structures of the first assembly so as to engage and hold the first movable stop of the probe to the base; (i) laterally positioning the at least one standoff and the second of the plate-like assemblies in line with the probes and thereafter longitudinally bringing the at least one standoff into contact with the first plate-like assembly and the second plate-like assembly in contact with the other end of the at least one standoff; (j) contacting a biasing tool to the probe tips that extend into the base and then longitudinally moving the biasing tool relative to the base to cause further separation of the at least two moving stops so that they are separated by an amount that is equal to or greater than a standoff height of inner most plate-like structures of the plate-like assemblies; (k) while the moving stops are separated, laterally displacing the plate-like structures of the second plate-like assembly so as to inhibit the second movable stop from moving back to a position between the second plate-like assembly and the first plate-like assembly; (l) moving the biasing tool away from the base so that a tension induced return force of the at least one spring segment brings the movable stop into contact with the outer surfaces of each of the two plate-like assemblies, and (m) separating the base on the first plate-like assembly to yield a probe array having a plurality of probes, a pair of plate-like assemblies holding the plurality of probes in a biased state.

Numerous variations of the tenth aspect of the invention are possible and include, for example, those noted with regard to the other aspects of the invention. Further variations exist and include, for example, both plate-like assemblies and the at least one intermediate standoff being loaded onto the probes at the same time. Still numerous other variations are possible and will be apparent to those skill in the art upon review of the teachings herein.

Still other aspects of the invention will be understood by those of skill in the art upon review of the teachings herein. Other aspects of the invention may involve combinations of the above noted aspects of the invention. These other aspects of the invention may provide various combinations of the aspects presented above as well as provide other configurations, structures, functional relationships, and processes that have not been specifically set forth above but are taught by other specific teachings set forth herein or by the teachings set forth herein as a whole.

BRIEF DESCRIPTION OF THE DRAWINGS

FIG. 4A provides a schematic illustration of a probe similar to that of FIG. 2C with a single tensional spring connected on both ends to tip arms with corresponding tips and where the arms are connected to the springs via respective stop plates and passing through openings in the opposing stop plates such that the stop plates may function as movable plates during probe operation.

FIGS. 4B-1 to 4B-3 provide schematic illustrations of the probe of FIG. 4A with the probe further including a sheath or frame structure that sets a minimum distance between the stop plates where FIG. 4B-1 shows the probe in an undeflected state, while FIG. 4B-2 shows the probe with the lower tip compressed toward the sheath with the spring being biased or stretched as the top movable plate is forced away from the top of the sheath, while FIG. 4B-3 shows the probe after the upper tip is compressed toward the sheath with the spring being further biased or stretched as the lower movable plate is forced away from the lower portion of the sheath.

FIG. 4C provides another schematic illustration of the probe of FIG. 4A with the spring being pre-biased by use of a taller sheath or frame structure that holds the movable stops at a larger relative separation, thus ensuring that an initial contact of either tip against a surface (e.g. a pad, bump, or other contact surface of an electrical circuit element) will be accompanied by a non-zero restoration or back force.

FIG. 5A provides a schematic illustration of a probe 500 similar to that of FIG. 2I with two tensional springs 501-1 and 501-2 functionally connected in parallel and with additional structural emphasis added to the three structural members that may function as movable stops.

FIGS. 5B-1 to 5B-2 provide first and second variations of the probe of FIG. 5A but with the addition of sheath or frame structures that set the minimum distance between a first pair of movable stops (i.e., the lower pair) with the minimum distance of FIG. 5B-1 being the same separation distance shown in FIG. 5A while the minimum distance of FIG. 5B-2 is shown as being larger than the separation distance shown in FIG. 5A.

FIGS. 5C-1 to 5C-2 provide third and fourth variations of the probe of FIG. 5A but with the addition of sheath or frame structures that set the maximum distance between a second pair of movable stops (i.e., the upper pair) with the maximum distance of FIG. 5C-1 being the same separation distance shown in FIG. 5A while the maximum distance of FIG. 5C-2 being smaller than the separation distance shown in FIG. 5A wherein the maximum distance also sets a maximum allowable compression of the tips toward one another.

FIG. 6A provides a schematic illustration of a probe similar to that of FIG. 2J with a tensional spring and a compression spring functionally connected side by side in series and with additional structural emphasis added to the three structural members that may function as movable stops.

FIGS. 6B-1 to 6B-2 provide first and second variations of the probe of FIG. 6A but with the addition of sheath or frame structures that set the maximum distance between a first pair of movable stops (i.e., the top and bottom stops) with the maximum distance of FIG. 6B-1 being the same separation distance shown in FIG. 6A while the maximum distance of FIG. 6B-2 being smaller than the separation distance shown in FIG. 6A.

FIGS. 6C-1 to 6C-2 provide third and fourth variations of the probe of FIG. 6A but with the addition of sheath or frame structures that set a minimum distance between a second pair of movable stops (i.e., the middle and bottom stops) with the minimum distance of FIG. 5C-1 having the same separation distance shown in FIG. 5A while the minimum distance of FIG. 6C-2 being smaller than the separation distance shown in FIG. 6A.

FIGS. 11-1 to 11-6 provide a number of isometric views of a probe and views of expanded sections of the probe according to another embodiment of the invention where probe provides a specific implementation of spring and guide functionality similar to that of the probe of FIG. 10 with the primary exception being that the lower frame moves within slots or channels in the upper frame as opposed to the upper frame moving within slots or channels in the lower frame.

FIGS. 13A1 to 13D4 provide a number of isometric views of a probe and views of expanded sections of the probe according to another embodiment of the invention where the probe provides a specific implementation of spring and guide functionality of the probe of FIG. 12.

13E1 to 13E6 provide top views of individual layers that define the probe of FIGS. 13A1-13D4 wherein FIG. 13E1 shows the features of probe layers 1 and 11, FIG. 13E2 shows the features of probe layers 2 and 10, FIG. 13E3 shows the features of probe layers 3 and 9, FIG. 13E4 shows the features of probe layers 4 and 8, FIG. 13E5 shows the features of probe layers 5 and 7, and FIG. 13E6 shows the features of probe layer 6 wherein each figure also provides a dashed rectangular alignment guide that correlates the relative positions of the features from layer-to-layer.

Figures 1, 2, 5A, 5B:
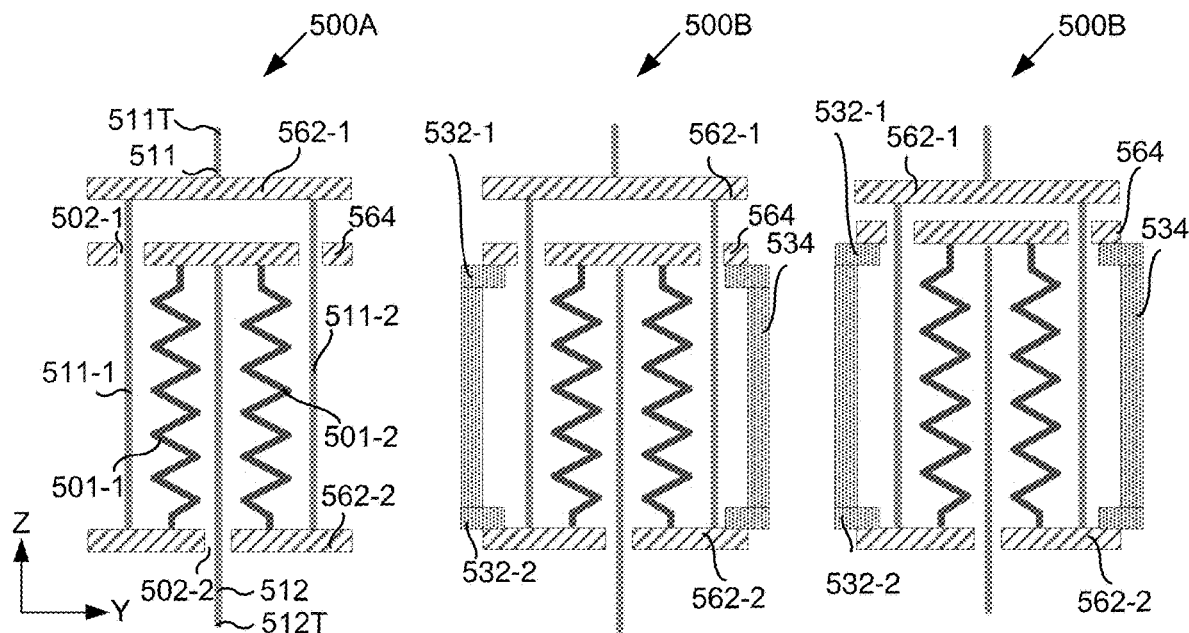
Figures 1, 11:
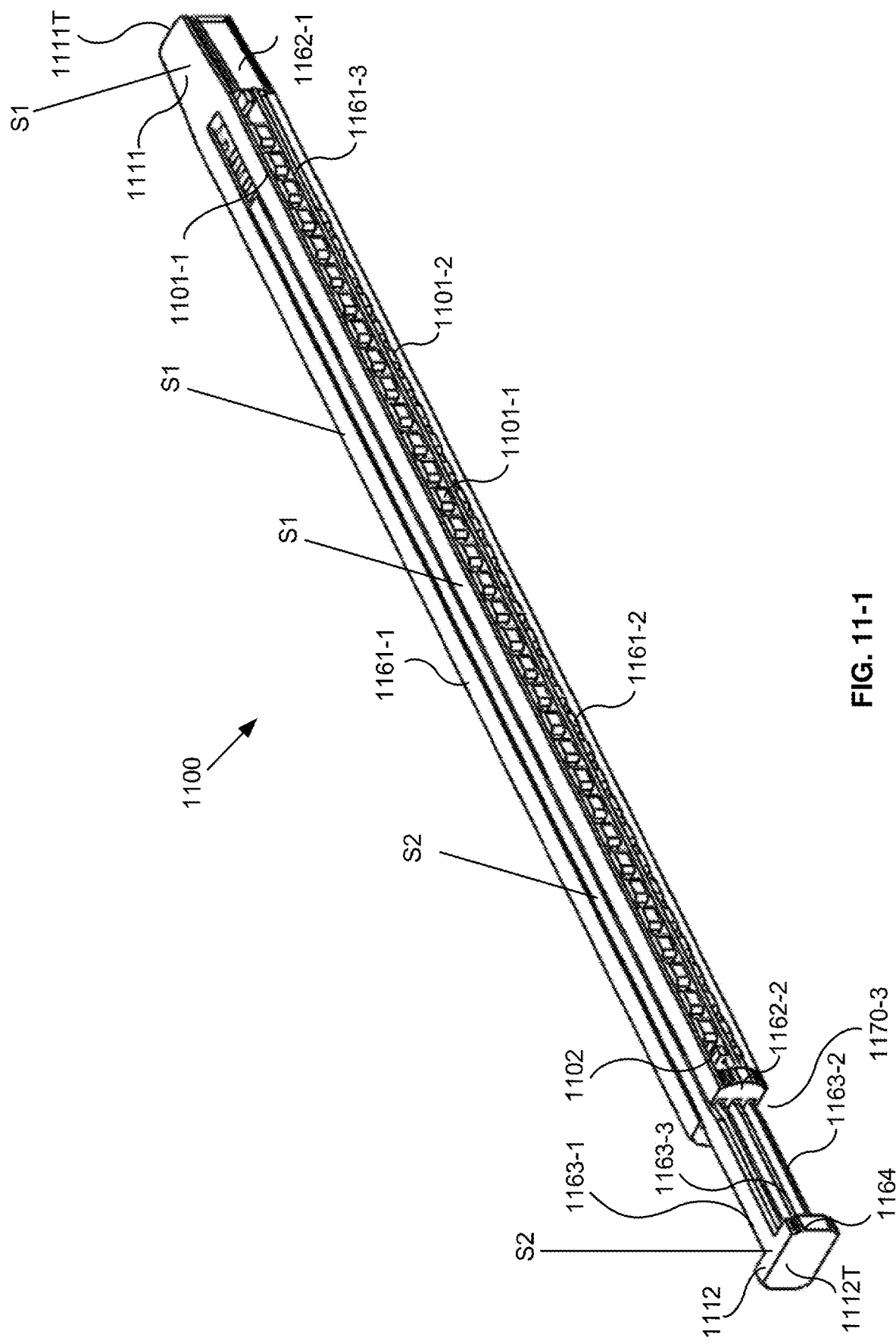
Figures 2, 11:
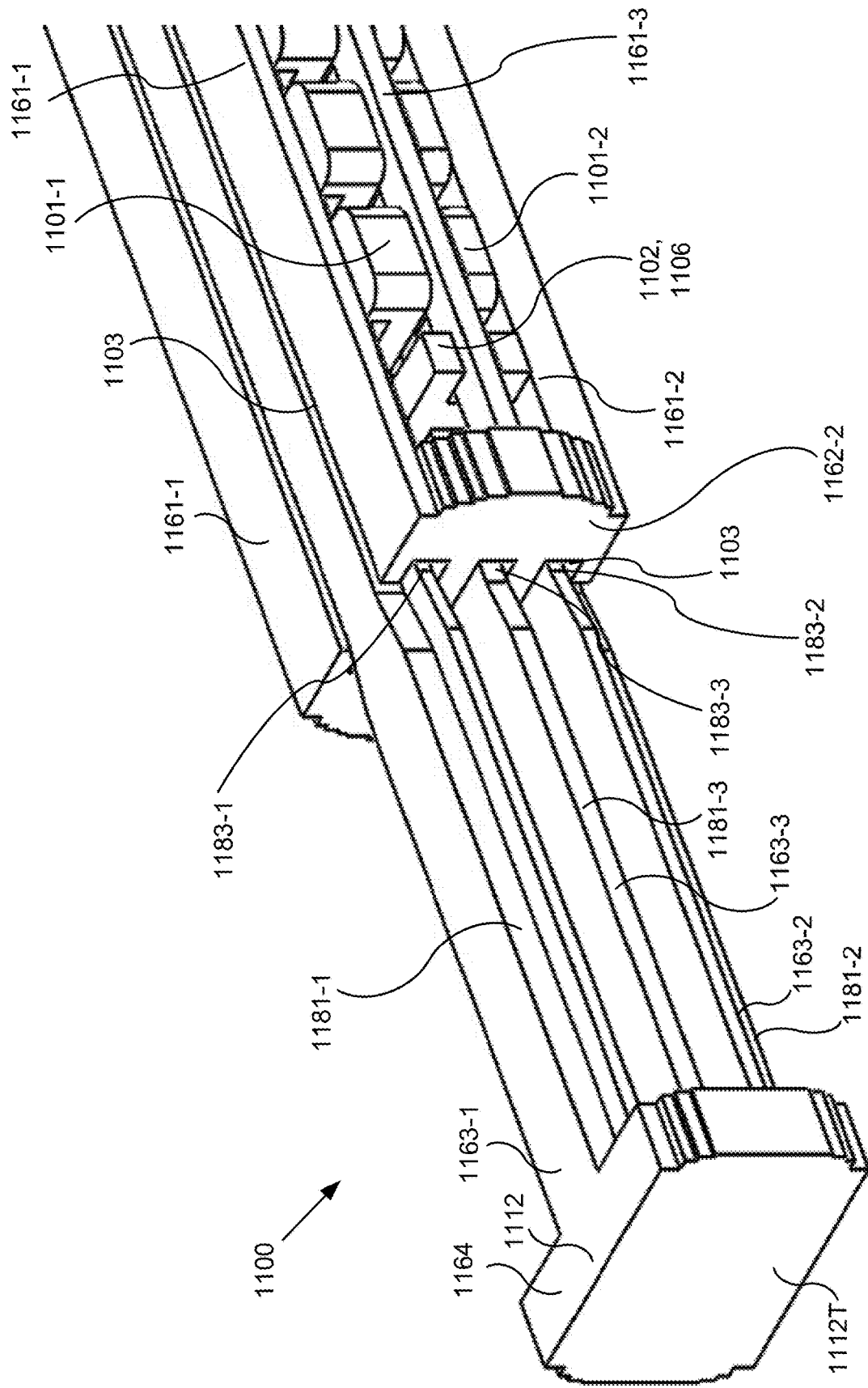
Figures 3, 11:
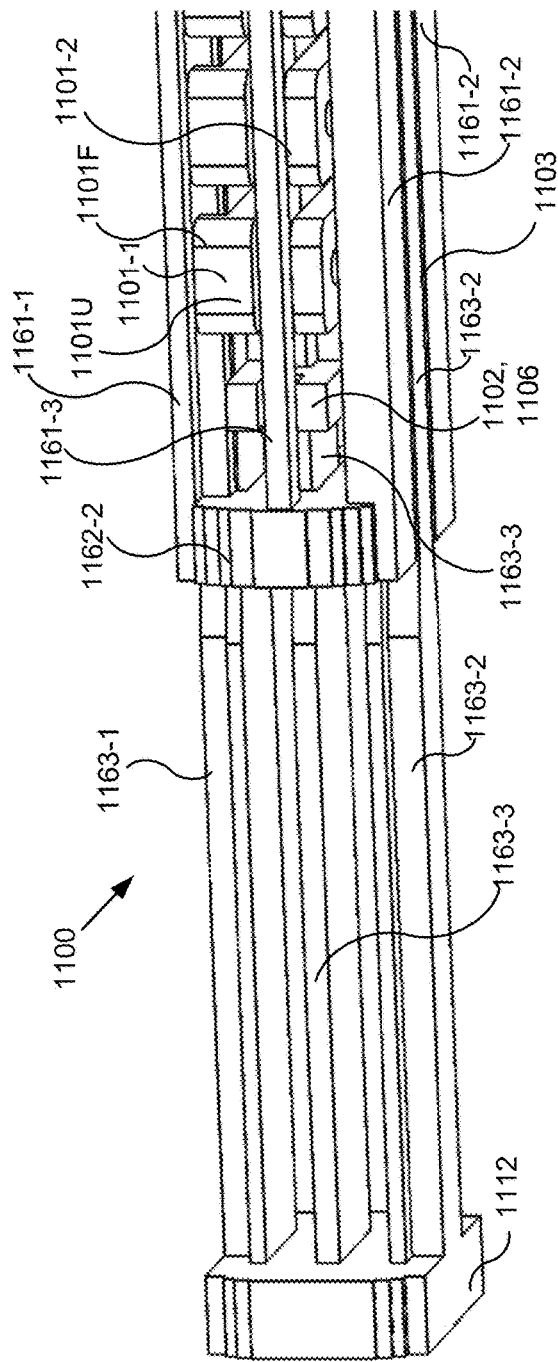

15A1 to 15C2 provide three sample configurations of a layer with features that provide for enhanced pointing accuracy or probe stability wherein FIG. 15A1 provides a similar configuration to that of layers 3 and 9 of the embodiment of FIGS. 13A1 to 13E6 as shown in FIG. 13E3 with FIG. 15A2 showing the arm and channel after longitudinal tip-to-tip compression that provides for engagement of the enhanced features that narrows the effective clearance or gap near the left end of the channel, with FIGS. 15B1 and 15B2 provide similar initial (e.g. as formed) and engaged (e.g. after some tip-to-tip compression) views of a second example wherein clearance tightening elements can be found at both the left and right ends of the arm/channel engagement providing even more enhancement in pointing accuracy than the example of FIGS. 15A1 and 15A2, and with FIGS. 15C1 and 15C2 providing similar views but with gap narrowing features found not only at the left and right ends but at two intermediate locations as well wherein prior to initial compression of the tips, normal gaps provide a certain level of probe stability and/or pointing accuracy (as well as possibly allowing engaged formation by providing gaps at least as great as a minimum feature size requirement or MFS requirement) while after some amount of tip compression, engagement of features with smaller effective clearances contribute to the pointing accuracy or otherwise assist in providing stabilized probe functionality.

Figure 16A:
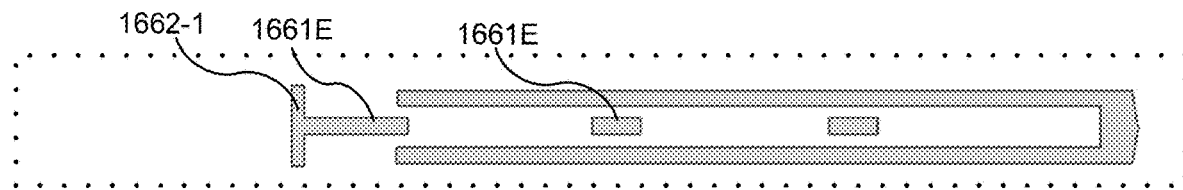
Figure 16B:
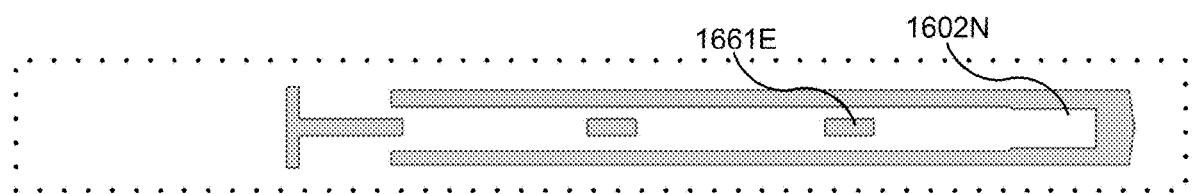
Figure 16C:
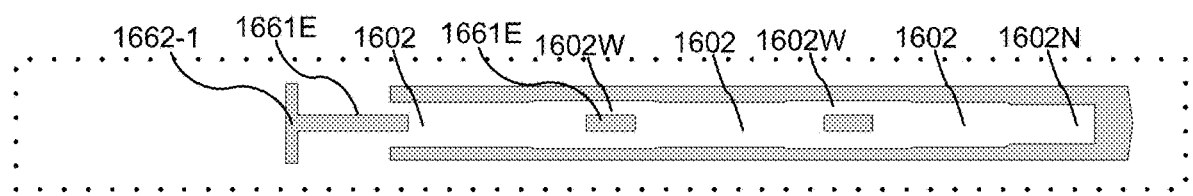

FIGS. 16A-16C, like 15A1-15C1 provide various alternative example configurations but for layers 2 and 10, as opposed to layers 3 and 9, of the probe of FIGS. 13A1 to 13F6 wherein layers 2 and 10 should be understood, at least in part, as transition layers between adjacent layers that have features that would otherwise be joined together but for the gap formed as part of layers 2 and 10, wherein FIG. 16A, like 15A, carries over no clearance enhancing features beyond those found in layers 3 or 9 or that will be found on layers 1 and 11, FIG. 16B carries over the channel narrowing feature on the right side of the channel as existed on FIG. 15B, and FIG. 16C carries forward the expanded channel areas in the intermediate portion of the channel that provide room for, and ensure no inadvertent bonding to, expanded arm elements found in the intermediate portion of the arm of FIG. 15C.

Figure 17:
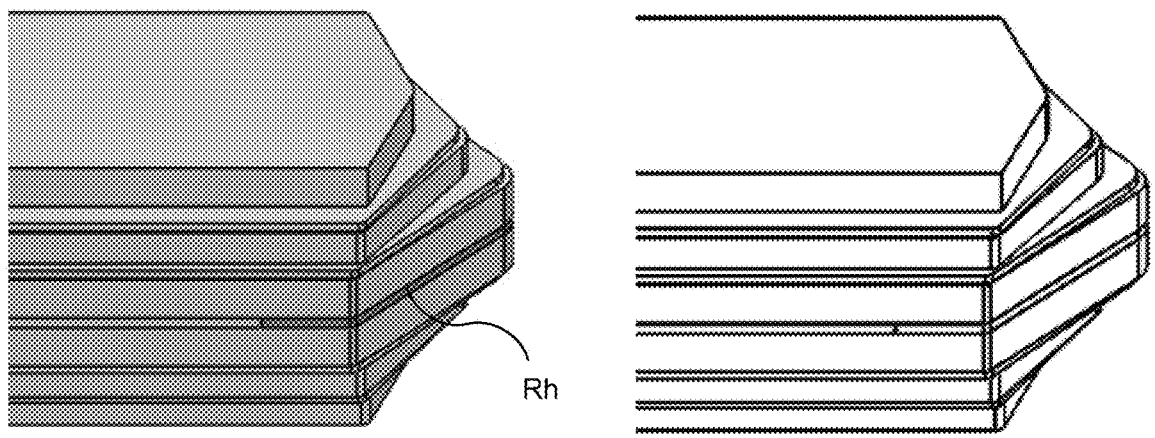

FIG. 17 provides an example alternative tip configuration that may be used on either end of a probe wherein a central region of the tip provides a thin rhodium layer to improve contact properties of the probe FIGS. 18A-18C provide various view of an alternative left end to the probe of FIGS. 13A-13E6 (or possibly a right end in further variations of that probe) wherein in addition to a tip of desired configuration, a laterally compressible spring element is provided on one or both sides of the probe, as part of one or more layers wherein upon loading of the probe into an opening in a guide plate or other array structure, e.g., a block with probe pin holes, the spring elements can engage walls of the guide plate or other array structure to frictionally hold the pin probe in a desired longitudinal position such the probe does not inadvertently fall out of the array structure while the probe can be removed if required.

FIGS. 19A and 19B provide a top and isometric view of the left end of the engagement channels of the probe of FIGS. 13A1-13F6 wherein pointing accuracy enhancement features can be seen as widened arm configuration that provide narrowed gaps as they enter the slot or channel wherein not only does the deeper arm (layer 3 or 9) include the tapering feature but also the more exterior arm segment features of the layers 1 and 2 and 10 and 11 include the similar wide, tapering, and narrowed features.

FIGS. 20A-20B provide an as formed schematic cut view of a sheathed extension spring probe along with a blown up view of a side of the sheath in a neutral, initial, or as formed state (FIG. 20A) and in an extended, or pre-biased, final working state along with a blown up view of a side of the sheath (FIG. 20B) wherein the sheath includes ratchetable features which engage when the sheath initially undergoes an expansion from an initial state (which may be an as formed state or a less biased working state) to the pre-biased final working state.

Figure 21B:
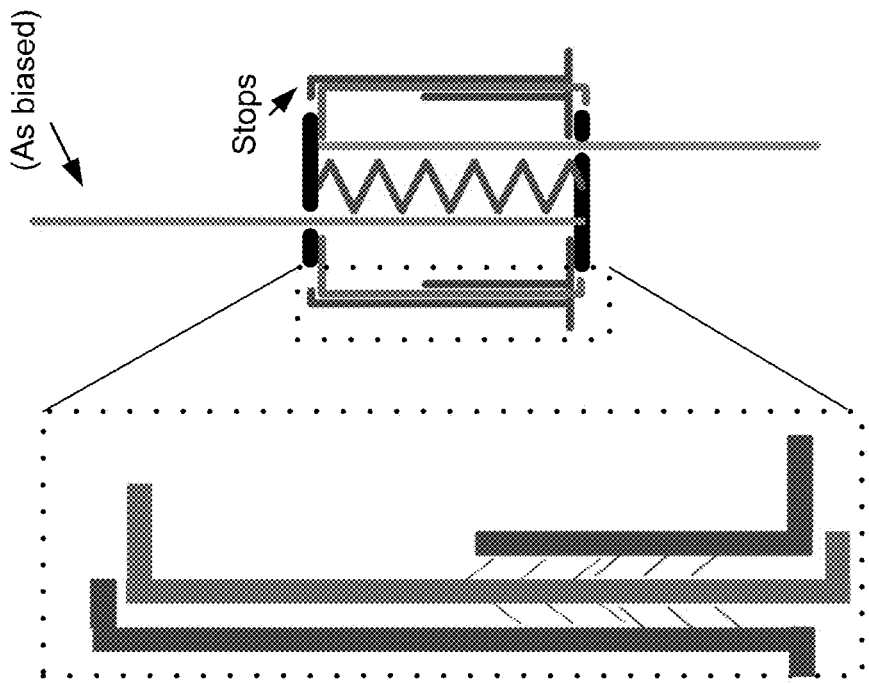
Figure 21A:
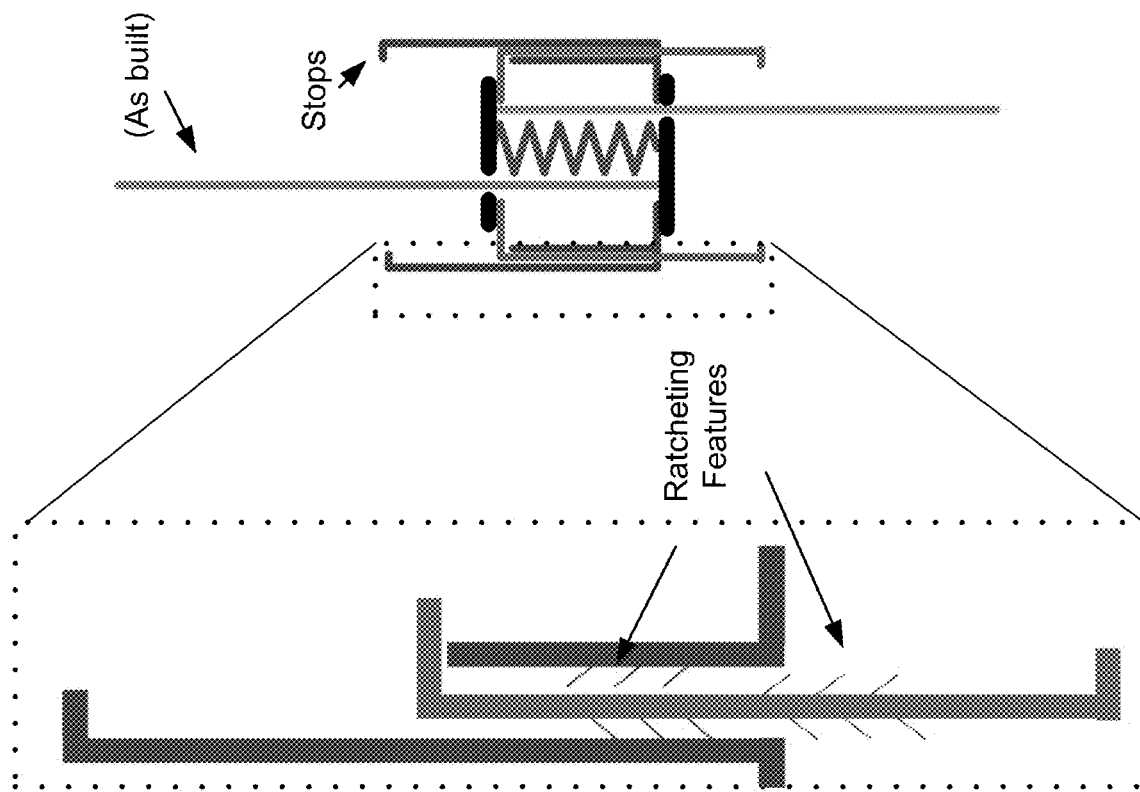

FIGS. 21A-21B provide an as formed schematic cut view of a sheathed extension spring probe along with a blown up view of a side of the sheath in a neutral, initial, or as formed state (FIG. 21A) and in an extended, or pre-biased, final working state along with a blown up view of a side of the sheath (FIG. 21B) wherein the sheath includes ratchetable features and an expansion stop feature which engage when the sheath initially undergoes an expansion from the initial state to the pre-biased final working state.

Figure 22B:
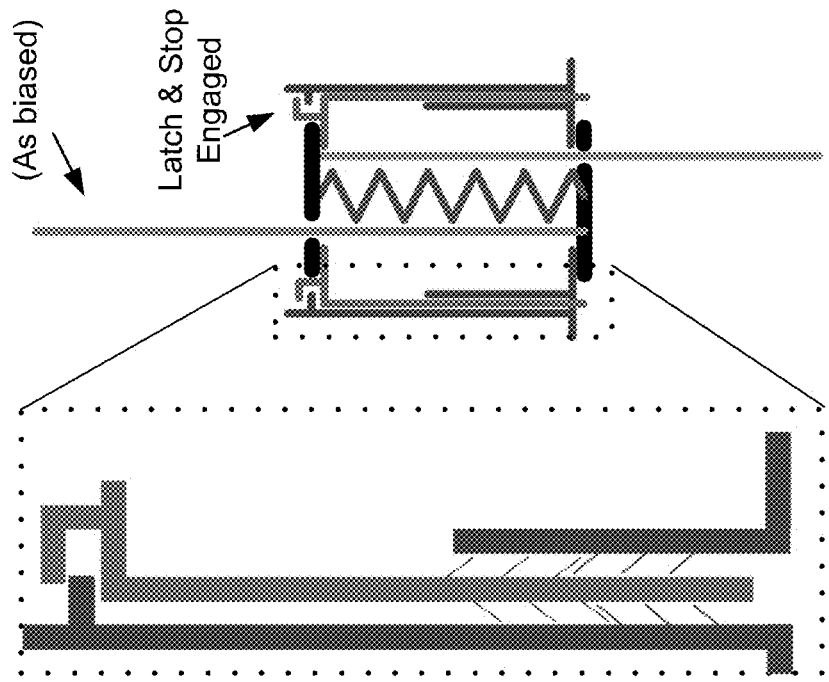
Figure 22A:
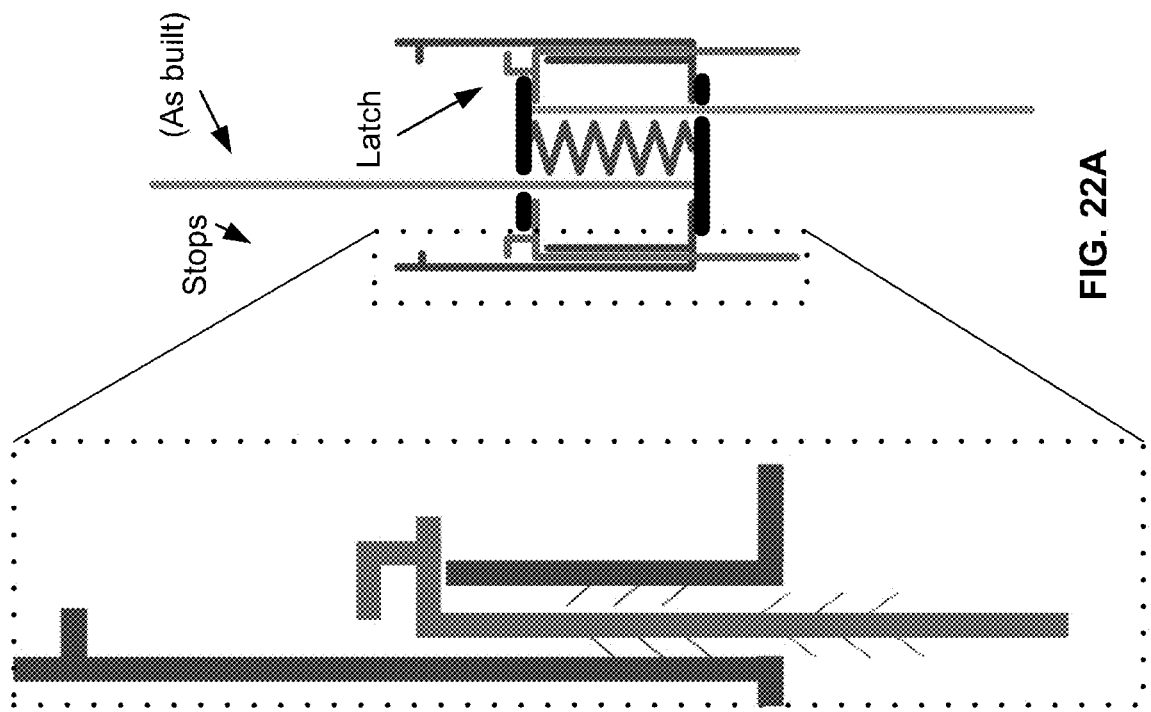

FIGS. 22A-22B provide an as formed schematic cut view of a sheathed extension spring probe along with a blown up view of a side of the sheath in a neutral, initial, or as formed state (FIG. 22A) and in an extended, or pre-biased, final working state along with a blown up view of a side of the sheath (FIG. 22B) wherein the sheath includes ratchetable features, an expansion stop feature, and a secondary expanded lock feature which engages when the sheath initially undergoes an expansion from the initial state to the pre-biased final working state.

FIGS. 23A-23B provide an as formed schematic cut view of an extension spring probe in a neutral, initial, or as formed state (FIG. 23A) and in an extended, or pre-biased, final working state (FIG. 23B) wherein the tip extension arms include ratchetable features that can be moved through openings in engagement plates to permanently transition from the neutral state to the pre-biased final working state.

FIGS. 24A-24B provide an as formed schematic cut view of an extension spring probe in a neutral, initial, or as formed state (FIG. 24A) and in an extended, or pre-biased, final working state (FIG. 24B) wherein a single tip extension arm includes a ratchetable feature that can be moved through an opening in an engagement plate to permanently transition from the neutral state to the pre-biased final working state.

DETAILED DESCRIPTION OF PREFERRED EMBODIMENTS

Electrochemical Fabrication in General

Figure 1A:
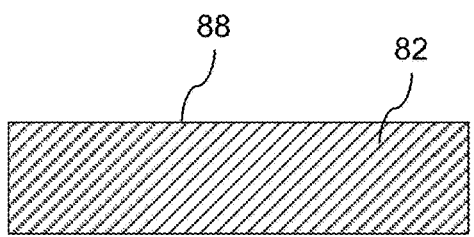
FIGS. 1A-1F schematically depict the formation of a first layer of a structure using adhered mask plating where the blanket deposition of a second material overlays both the openings between deposition locations of a first material and the first material itself.
Figure 1B:
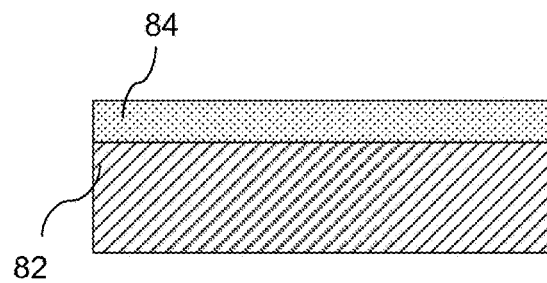
Figure 1C:
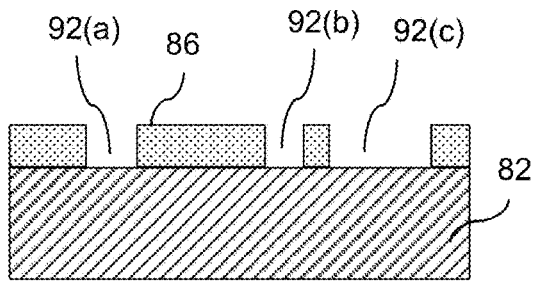
Figure 1D:
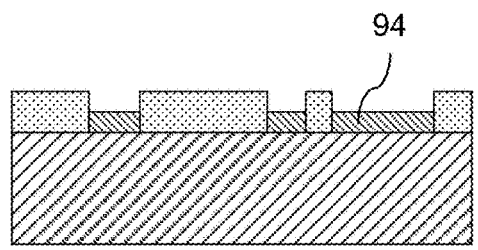
Figure 1E:
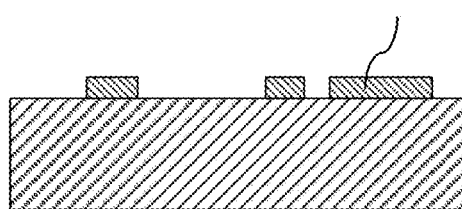
Figure 1F:
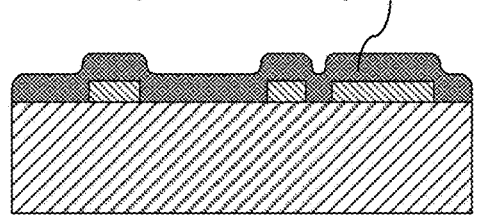
Figure 1G:
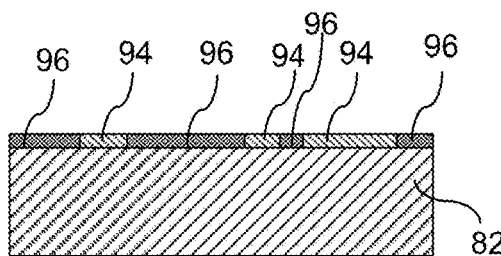
FIG. 1G depicts the completion of formation of the first layer resulting from planarizing the deposited materials to a desired level.
Figure 1H:
FIGS. 1H and 1I respectively depict the state of the process after formation of the multiple layers of the structure and after release of the structure from the sacrificial material.
Figure 1I:
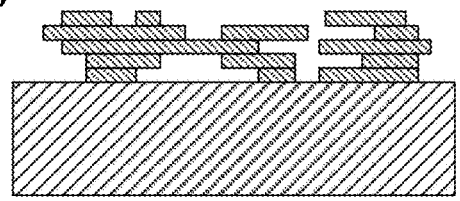

FIGS. 1A-1I illustrate side views of various states in an alternative multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 82 having a surface 88 is shown, onto which patternable photoresist 84 is deposited, spread, or cast as shown in FIG. 1B. In FIG. 1C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 1D, a metal 94 (e.g. nickel) is shown as having been electroplated into the openings 92(a)-92(c). In FIG. 1E, the photoresist has been removed (i.e. chemically or otherwise stripped) from the substrate to expose regions of the substrate 82 which are not covered with the first metal 94. In FIG. 1F, a second metal 96 (e.g. silver) is shown as having been blanket electroplated over the entire exposed portions of the substrate 82 (which is conductive) and over the first metal 94 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 98 (e.g. component or device) or multiple such structures.

In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material, or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g. a planarized layer) that is formed from one or more deposited materials while others are formed from a plurality of build levels, each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used, while in still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments adhered mask material may be used as a sacrificial for the layer or may be used only as a masking material which is replaced by another material (e.g., dielectric or conductive material prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration) . Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e. destroyed or damaged during separation of deposited materials to the extent they cannot be reused) or non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g., U.S. patent application Ser. No. 16/584,818).

Probe Embodiments

Probes of the various embodiments of the invention can take on a variety of forms. Each probe includes at least one substantially flat tensional spring segment that biases a test contact tip relative to a second tip that may or may not be a contact tip wherein the probes generally include structural elements for ensuring stable and robust probe functionality. In some embodiments, the probes further include a plurality of substantially flat spring segments, either of the extension type only or of a combination of one or more extension springs and one or more compression springs. In some embodiments, springs are configured to operate functionally in series or in parallel with the spring segments at least partially lying side-by-side or face-to-face as opposed to edge-to-edge or end-to-end. In some embodiments, probe deformation is limited to a compression along the axis of the probe (e.g., substantially longitudinal compression as probe tips or circuit joining elements move to more proximal positions).

Numerous variations of the probe embodiments are possible; including for example:

(1) use, or inclusion, of only extension springs;
(2) use, or inclusion, of a combination of compression springs and extension springs;
(3) use, or inclusion, of multi-segment springs as a single effective spring;
(4) use, or inclusion, of multi-segment springs including springs in series with interconnecting bars, plates or the like as necessary;
(5) use, or inclusion, of multi-segment springs including springs in parallel with interconnecting bars, plates or the like as necessary;
(6) use, or inclusion, of multi-segment springs formed of springs grouped in a combination of parallel and series connections with interconnecting bars, plates, or the like as necessary;
(7) use, or inclusion, of individual springs having substantially linear behavior (e.g. $F=K*\Delta x$) or having non-linear behaviors;
(8) use, or inclusion, of individual spring segments having common or different spring constants;
(9) use, or inclusion, of springs or spring segments that are substantially flat (e.g. having substantially planar front and back surfaces when unbiased or having substantially flat profiles whether formed from a single layer, multiple layers or in some other manner);
(10) use, or inclusion, of springs or spring segments laying in different parallel but offset planes (e.g., each formed within a single layer or from a series of adjacent layers) with connection elements extending from one spring segment to another through one or more intermediate layers;
(11) inclusion of a fixed stop, or more than one fixed stop, which interacts with one or more movable stops or alternatively the one or more fixed stops may be part of an array mounting structure or array assembly which can engage the movable stop or stops once probes are loaded into the array structure or final assembly is completed;
(12) inclusion of at least two fixed stops that may be used to bias one or more spring segments such that the one or more spring segments are pre-biased by at least two moving stops being on the inside (spring side) of their respective fixed stops for a spring that is compressed or both being on the outside of their respective stops for a spring that is operated as an extension spring (i.e. biased in an extended state);
(13) inclusion of three springs, or more, and two or more moving stops that contact fixed stops when their respective springs, if of the extension type, are compressed to a working limit or, if of the compression type, are made to extend to a working limit;
(14) inclusion of spring segments that are connected via flat, T-shaped, angled, or other bar or plate configurations that run between springs or spring segments on a single layer or via one or more intermediate layers that proved separation of overlaying springs or spring segments;
(15) inclusion of spring segments that are connected via flat, T-shaped, angled, or other bar or plate configurations that run along the edges of the springs or spring segments on a single layer or via one or more layers;
(16) inclusion of guide elements (e.g. sheaths, rails, fixed or movable plates, slip rings, or the like) in probes with compression springs to ensure that compression springs do not laterally bulge excessively during compression (e.g. where unintended contact or interference with an adjacent spring or spring segment could occur or even unintended contact with a neighboring probe);
(17) inclusion of probe tips that may take on one or more forms including flat surfaces, knife edge or blade-like structures, multi-contact crown-like configurations, single point contacts, single curved contact structures, or multiple curved contact structures;
(18) inclusion of tips formed from the same material as the springs or that include a material that is different from a spring material,
(19) inclusion of a probe configuration that allows, during use, current to flow from one probe tip to another probe tip via at least one spring;
(20) or inclusion of tips, tip extensions, springs, connection bars, sheaths, and/or the like providing moving or non-moving (e.g. sliding) contacts between elements of a single probe to shunt a portion, most, or all of the current around spring elements;
(21) inclusion of incorporated dielectric elements to provide individual probes with isolated conductive regions (e.g. for coaxial or other multi-path probe structures) or to ensure electrical isolation of some probes from other probes;
(22) inclusion of selective electrical or dielectric connections from probe to guide plates or to other structures to provide desired lateral or longitudinally spacing of probes, alternate current flow paths, and/or to provide electrical shielding;
(23) inclusion of end regions or intermediate regions of probes that include sliding components or surfaces through which moving probe elements slide as shunting contact surfaces;
(24) inclusion of end regions or intermediate regions of probes that engage sliding components or surfaces of array or mounting structures against which probe shaft elements slide as shunting contact surfaces;
(25) inclusion of sliding surfaces of moving probe components or of fixed probe components that include different materials or have regions of different materials as compared to materials used in formation of the bulk of spring segment elements, e.g. to provide more wear resistance surfaces, higher conductive regions, contact surfaces with less contact resistance, and the like;

(26) use of multi-layer, multi-material electrochemical fabrication methods in whole or in part;

(27) separate probe components or as partly connected or aligned components that need at least some assembly after formation;

(28) use of formation methods that provide probes in their entirety with all components formed together where build configurations are similar to their working configurations with possible exceptions of additional biasing required prior to use or where such biasing may occur upon initial use;

(29) use of formation methods so that all components are formed in relation to one another with build configurations that are different from working configurations such that assembly is limited to movement of components from one configuration to another prior to use (e.g., compression or expansion of spring elements, snapping together of separated but aligned component features, sliding together or interlocking components, and the like);

(30) inclusion of stop features that do not engage moving stops upon probe formation but instead are made to engage moving stops upon compression or extension of their respective springs, or probe tips, by longitudinal sliding of engagement elements, lateral movement of engagement elements, rotational movement of engagement elements, or the like, where engagement may occur automatically upon initial spring movement, tip movement, or may be made to occur independently of spring or probe tip movement;

(31) inclusion of elastic elements in the form of serpentine, saw-tooth, rectangular, triangular, sine-shaped, S-shaped, C-shaped, or numerous other configurations that provide elastic compliance over a working range of probe compression;

(32) probes being configured for 0.1 or smaller to 0.7 mm pitch, or larger pitch (probe-to-probe tip spacing in an array);

(33) probes having body diameters or lateral dimensions (e.g., sheath, guide element, or spring width dimensions) ranging from 0.05 mm or less to 0.65 mm or more);

(34) probes having force targets (at maximum over-travel) from 1 gram or less to 100 grams or more (e.g., 2 g-40 g, 4 g-30 g, 6 g-20 g);

(35) probes having over-travel targets as low as 50 microns or less or as high as 1 mm or more, (e.g., 100-800 microns or 150-600 microns);

(36) probes having dimensions that allow pre-loading to occur with a travel of slightly above zero microns to more than 400 microns, (e.g., 20-400 microns, 50-300 microns, or 100-200 microns);

(37) probes having lengths that may be on the order of 100 microns or less to 5 mm or more (e.g., 0.3 mm to 3 mm);

(38) probes formed from layers with their longitudinal axes parallel to a build axis or stacking axes of the layers;

(39) probes formed with their longitudinal axes laying in a plane perpendicular to a build axes or stacking axes of layers from which the probes are formed;

(40) probes that are formed with their longitudinal axes laying in a plane perpendicular to a build axes and with a normal to the plane or planes of their spring segments also being perpendicular to the build axes when forming the probes from a plurality of stacked layers;

(41) probes formed with their longitudinal axes laying in a plane perpendicular to a build axes and with a normal to the plane or planes of their spring segments being parallel to the build axes when forming the probes from a plurality of stacked layers;

(42) inclusion of curved lateral cross-sectional features of the probes being approximated by layer-to-layer stair stepping with the approximation dictated by the thickness of individual layers when probes are formed on their sides from a plurality of layers;

(43) inclusion of spring segments that are constrained upon use by being inside an outer body that forms part of the probes (e.g. sheath or framing structure);

(44) inclusion of spring segments that are constrained upon use by an internal frame structure that forms part of the probes;

(45) inclusion individual spring segments formed from a single layer, formed from two layers, or formed from more than two layers;

(46) probes meeting one or more of the following criteria: (1) have a total uncompressed working length of between 3-4 mm, (2) a spring length of 2.5-3.5 mm, (3) an over-travel of at least 300 microns, and (4) a maximum force at maximum over travel of 1.5-3.0 grams;

(47) inclusion of guide channels and sliding plunger elements that are configured to provide enhanced pointing alignment by including narrower channel regions and wider channel regions and/or wider plunger regions and narrower plunger regions (as part of a single layer or as part of multiple layers) such that the wider channel regions and the narrower plunger regions are in proximity while the probe is not in a working range of operation while the narrower channel regions and the wider plunger regions are in proximity to one another when the probe is in a working range of operation so as to provide tightened angular tolerance between the channels and the plunger while in a working range of operation wherein the number of narrowed gap regions for a single probe on a selected layer or set of layers is at least one, is at least two, is at least three, is at least four, or is at least five;

(48) inclusion of multiple narrowed gap regions of (47) wherein at least two of the narrowed regions provide longitudinally narrowing over a length that is at least as large as 30% of a longitudinal working range of motion of the channels and plunger elements, is more preferably greater than 50%, even more preferably greater than 70%, and is more preferably greater than 90%;

(49) inclusion of narrowed gap regions of (47) such that the pointing accuracy is enhanced by a reduction in angular tolerance of at least 30%, more preferably at least 50%, even more preferably at least 70%, and even most preferably at least 90%;

(50) inclusion of narrowed gap regions (47) such that the pointing accuracy is enhanced by a tip placement tolerance of at least 30%, more preferably at least 50%, even more preferably at least 70%, and even most preferably at least 90% or an absolute tip placement tolerance of less than plus or minus 20 microns, more preferable less than 15 microns, more preferably less than 10 microns, and even more preferably less than 5 microns.

Numerous other variations are possible, some of which are explicitly or implicitly set forth herein while others will be apparent to those of skill in the art after review of the teachings herein. Some variations include using such probes in testing integrated circuits, dies on semiconductor wafers, or other electronic circuits. Other variations include assembly of a plurality of such probes into arrays for use in testing applications or for use in permanent contact applications. Further embodiments include methods for making such probes or making such arrays.

Reference numbers are included in many of FIGS. 2A-24B wherein like numbers are used to represent similar structures or features in different embodiments. In particular, when the FIGS. of the various embodiments use reference numbers, the reference numbers are provided in a 3 or 4 digit format which may be followed by letters, dashes, and/or additional numbers, wherein the first digit or first two digits (from the left) represent the FIG. number while the final digits to the right along with any trailing letters, dashes, or numbers represent a particular general structure or feature. When two or more figures include a reference having the same right most digits (and following letters, dashes, and additional numbers), it is intended indicate a similarity of the features indicated. The following table sets forth these right most digits and a general description of the structure or feature being represented.

| Table of Reference Numbers for Structures/Features | |
|---|---|
| No. | Description |
| 00, 00A-00J | Probe |
| 01, −1, −2, −3 | Spring (which may be a compression spring, an extension spring, or one of several springs operating in series or in compression). |
| 02, −W, −N | Slidable full connection element, slip ring, a surrounded or retaining slot or channel where inclusion of N indicates a relative narrowing of a passage through the ring, slot or channel while inclusion of W indicates a relative widening of the channel and where inclusion of a −1 or −2 indicates a separate designation for different elements within a probe. |
| 03 | Slidable partial connection element, half ring, open, or non-retaining slot or channel. |
| 06, −1, −2 | Spring-to-spring connection arm for connecting longitudinally overlapping compression springs together or for connecting longitudinally overlapping extension springs together where the inclusion of a −1 or −2 indicates a separate designation for different elements within a probe. |
| 11, −1, −2 | $1^{st}$ end tip arm or arms. |
| 11T | $1^{st}$ end tip for making an electrical connection generally via contact but possibly via a bonded or otherwise attached connection. |
| 12 | $2^{nd}$ end tip arm. |
| 12T | $2^{nd}$ end for making an electrical connection generally via contact but possibly via a bonded or otherwise attached connection |
| 21 | $1^{st}$ end movable stop or lateral extension arm. |
| 22-1, 22-2 | 1st or $2^{nd}$ intermediate movable stop. |
| 32-1, 32-2 | $1^{st}$ and $2^{nd}$ fixed stops set by a spacing structure, spacer, or standoff. |
| 34 | Spacer or standoff for fixed stops. |
| 51 | Sheath for probe spring(s). |
| 61 | $1^{st}$ frame generally extending longitudinally and rigidly associated, directly or indirectly, with a first or upper tip arm of a probe where −1, −2, −3 may be joined to the number to differentiate different portion of the frame from each other. |
| 61E | Guide tab or guide extension forming part of a $1^{st}$ frame element. |
| 62 | Frame element generally extending laterally rigidly associated, directly or indirectly, with a first or upper tip arm. |
| 63 | Frame element generally extending longitudinally rigidly associated, directly or indirectly, with a second or lower tip arm. |
| 63A | Longitudinally extending arm of frame element 63. |
| 63B | Bridge arms that connect other elements, such as multiple arms of frame element 63 |
| 64 | Frame element generally extending laterally rigidly associated, directly or indirectly, with a second or lower tip arm that may connect other elements. |
| 67 | $1^{st}$ tip arm to spring attachment structure/location. |
| 68 | $2^{nd}$ tip arm to spring attachment structure/location. |
| 70, −1, −2, 3 | Gaps between structural elements that allow relative movement of those elements where −1, −2, −3 may be joined to the number to differentiate separate gap regions within a probe |
| 81 | Expanded width region element that provides for a relatively narrow gap between the structural region or element and a surrounding structure. |
| 83, −1, −2, −3 | Narrowed structural region or element that provides for a relative widening of a gap between the structural region or element and a surrounding structure where −1, −2, −3 may be joined to the number to differentiate separate regions within a probe. |
| 91 | Lateral engagement or retention spring elements. |

First Group of Embodiments: Probes with at Least One Tensional Spring Element or Segment without a Sheath:

FIGS. 2A-3J provide probes according to a number of embodiment variations within the first group of embodiments of the invention wherein spring segments and structural elements illustrate a number of different example configurations of probes having at least one tensional spring but not a sheath.

Figure 2A:
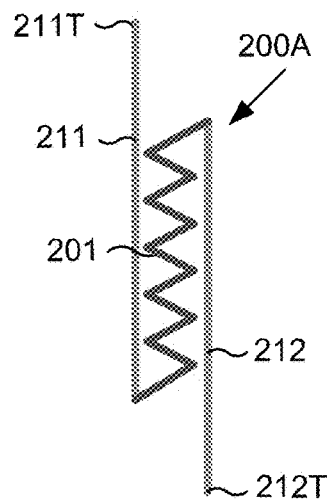
FIG. 2A provides a schematic representation of a side view of a vertically oriented probe that includes a single flat tensional spring connected to two tip arms that extend in opposite directions relative to their associated spring ends such that the spring operates in tension when the tips are pressed toward one another.

FIG. 2A provides a schematic representation of a side view of a vertically oriented probe 200A that includes a single flat tensional spring 201 connected to two tip arms 211 and 212 that extend in opposite directions relative to their associated spring ends such that the spring operates in tension when the tips 211T and 212T are pressed toward one another wherein the arms are shown as being located along the edges of the spring segment but could alternatively be located along and spaced slightly from either face of the spring segment or both could be located along a single face of the segment and could potentially function as shields that protect that face of the segment.

Figure 2B:
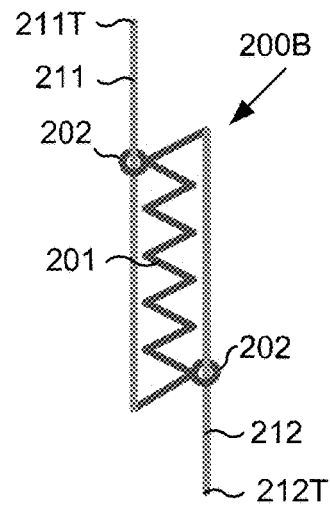
FIG. 2B provides a schematic representation of a side view of a vertically oriented probe having a configuration similar to that of FIG. 2A but additionally including an upper and lower coupling ring that provides for the arms to remain joined to the edges of the spring segments in a slidable configuration.

FIG. 2B provides a schematic representation of a side view of a vertically oriented probe 200B having a configuration similar to that of FIG. 2A but additionally including two coupling rings that provide for the arms 211 and 212 to remain joined to the edges of selected spring segments in a slidable configuration. In other configurations, the slide rings, the arms, and any other connecting elements could have been formed along one or both faces of the segment so that the arms could alternatively run along one or both faces. In other embodiments, other or additional spring segments could have been attached to slide rings. In still other embodiments, the slide rings may be replaced with channels and arms that slide through the channels, or what might be termed as barrels and plungers.

Figure 2C:
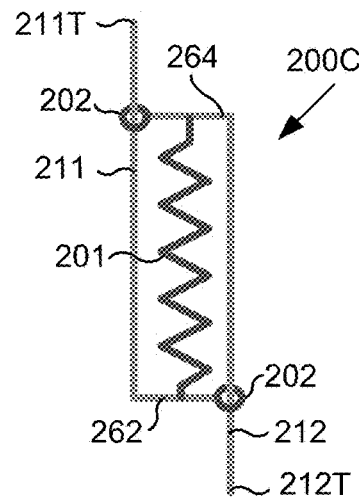
FIG. 2C provides a schematic representation of a side view of a vertically oriented probe having a configuration and functionality similar to that of the probe of FIG. 2B but with the connection rings not being attached to the springs themselves but to lateral extension elements of the tip arms that attach to the top and bottom ends of the segment.

FIG. 2C provides a schematic representation of a side view of a vertically oriented probe 200C having a configuration and functionality similar to that of the probe of FIG. 2B but with the connection rings 202 not being attached to the springs themselves but to lateral connection elements 262 and 264 of the tip arms 211 and 212, respectively that attach to the top and bottom ends of the spring segment.

Figure 2D:
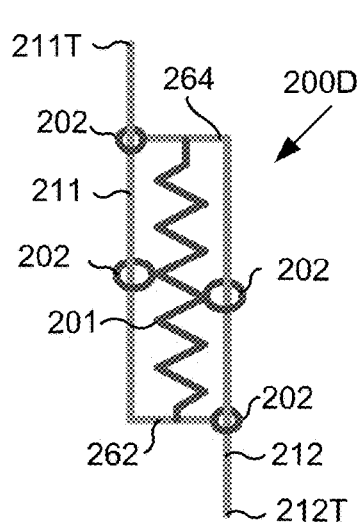
FIG. 2D provides a schematic representation of a side view of a vertically oriented probe having a configuration similar to that of FIG. 2C with the exception that two additional connection or slide rings have been added.

FIG. 2D provides a schematic representation of a side view of a vertically oriented probe 200D having a configuration similar to that of FIG. 2C with the exception that two additional slide or connection rings 202 have been added to provide additional movement stability.

Figure 2E:
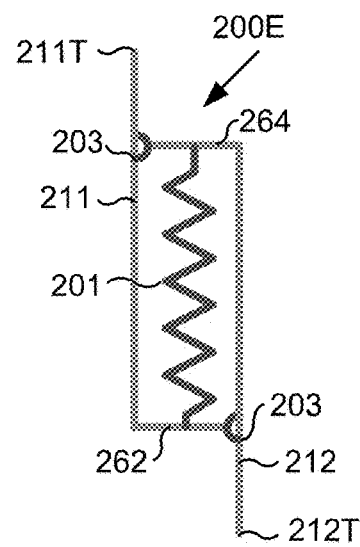
FIG. 2E provides a schematic representation of a side view of a vertically oriented probe having a configuration that is similar to FIG. 2C but where the retention or connection rings are replaced by half rings that provide for sliding but not complete lateral connection of the tip arms to the lateral extension elements.

FIG. 2E provides a schematic representation of a side view of a vertically oriented probe 200E having a configuration that is similar to the probe of FIG. 2C but where the retention or connection rings are replaced by half rings 203 that provide for sliding but not complete lateral connection of the tip arms 211 and 212 to the lateral extension elements 262 and 264. In other embodiments, the sliding elements may take on other configurations that still allow separation of the connection between the arms and the extension elements while still enhancing desired relative movement ability and/or inhibiting certain unwanted degrees of freedom between the components or structural elements of the probe.

Figure 2F:
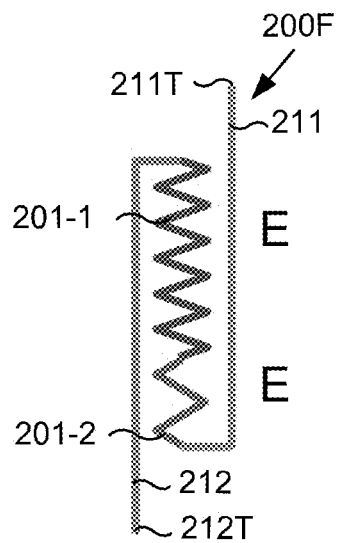
FIG. 2F provides a schematic representation of a side view of a vertically oriented probe that includes two flat tensional springs connected inline and in series with the lower end of the lower spring connecting to the upper tip arm and the upper end of the upper spring connected to the lower tip arm such that the springs operate together in tension (e.g., with a combined spring constant) when the tips are pressed toward one another.

FIG. 2F provides a schematic representation of a side view of a vertically oriented probe 200F that includes two flat tensional springs 201-2 and 201-1 connected inline and in series with the lower end of the lower spring 201-2 connecting to the upper tip arm 211 which connects to upper tip 211T and the upper end of the upper spring 201-1 connecting to lower tip arm 212 which connects to lower tip 212T such that the springs operate together in tension (e.g., with a combined spring constant) when the tips are pressed toward one another.

Figure 2G:
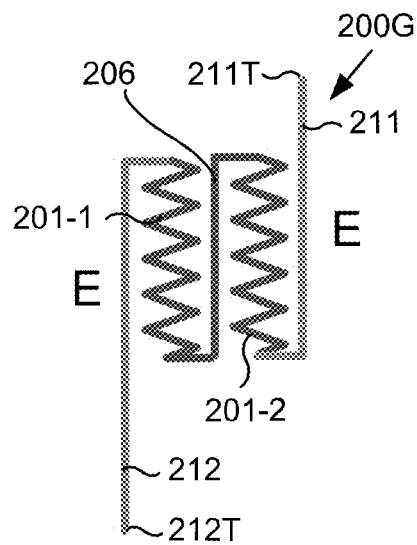
FIG. 2G provides a schematic representation of a side view of a vertically oriented probe that includes two flat tensional springs positioned edge-to-edge (when unbiased) and in series with a connection bar joining the lower end of the left spring to the upper end of the right spring with the lower end of the right spring connected to the upper tip arm and the upper end of the left spring connected to the lower tip arm such that the springs operate together in tension (e.g., with a combined spring constant) when the tips are pressed toward one another.

FIG. 2G provides a schematic representation of a side view of a vertically oriented probe 200G that includes two flat tensional springs 201-1 and 201-2 positioned edge-to-edge (when unbiased) and in series with a connection bar 206 joining the lower end of the left spring 201-1 to the upper end of the right spring 201-2 with the lower end of the right spring 201-2 connecting to the upper tip arm 211 which connects to the upper tip 211T and the upper end of the left spring 201-1 connecting to lower tip arm 212 which connects to lower tip 212T such that the springs operate together in tension (e.g., with a combined spring constant) when the tips are pressed toward one another. In some alternative embodiments, instead of the springs lying edge-to-edge, the spring segments may lie face-to-face with a gap between them for the connection bar. In still other variations, slide rings or other guidance features may be added. As with the other embodiments herein, the two longitudinally spaced tips do not need to be laterally separated (as illustrated) but could be located in line with one whether where such a line be a longitudinally centered or off center.

Figure 2H:
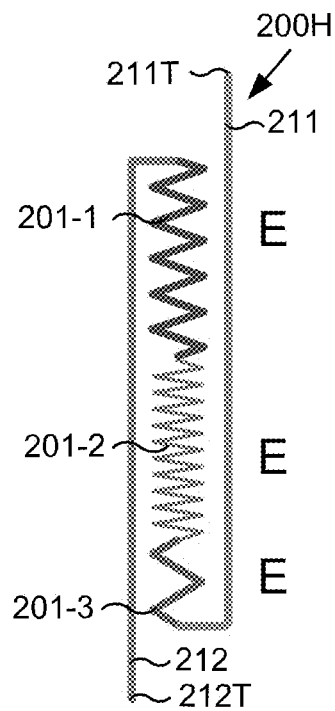
FIG. 2H provides a schematic representation of a side view of a vertically oriented probe that includes three flat tensional springs connected inline and in series with the lower end of the lower spring connecting to the upper tip arm and the upper end of the upper spring connected to the lower tip arm such that the springs operate together in tension (e.g., with a combined spring constant) when the tips are pressed toward one another.

FIG. 2H provides a schematic representation of a side view of a vertically oriented probe 200H that includes three flat tensional springs 201-1, 201-2, and 201-3 connected inline and in series with the lower end of the lower spring 201-3 connecting to the upper tip arm 211 which connects to upper tip 211T and the upper end of the upper spring 201-1 connects to lower tip arm 212 that connects to lower tip 212T. The intermediate spring segment 201-2 has ends that connect to the lower spring 201-3 and the upper spring 201-1. In this configuration, the springs operate together in tension (e.g., with a combined spring constant) when the tips are pressed toward one another.

Figure 2I:
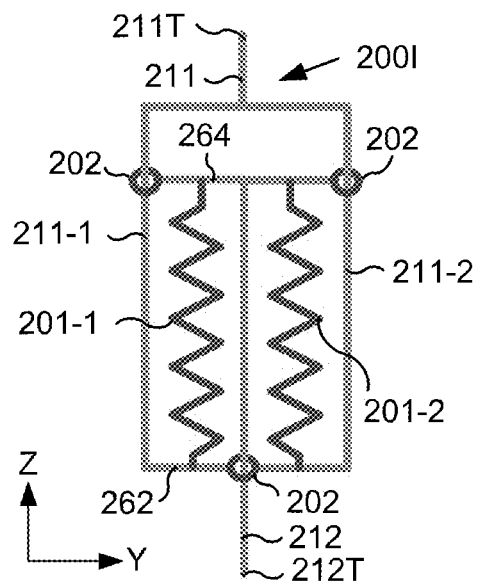
FIG. 2I provides a schematic representation of a side view of a vertically oriented probe having a configuration that provides two extension spring segments that operate in parallel to provide a longitudinal and tensional return force when tips of arms are compressed toward one another.

FIG. 2I provides a schematic representation of a side view of a vertically oriented probe 200I having a configuration that provides two extension spring segments 201-1 and 201-2 that operate in parallel to provide a longitudinal and tensional return force when tips 211T and 212T of arms 211 and 212 are compressed toward one another. More specifically, the compression of the end tips 211T and 212T of arms 211 and 212 cause relative movement of arm 212 and the branches 211-1 and 211-2 of tip arm 211 which in turn cause increased spacing between the upper and lower lateral connecting arms 264 and 262 which slide along branches 211-1, 211-2, and tip arm 212 via connecting slip rings 202 which in turn cause tensional extension (in Z) of both spring segments. Though, as in the previous illustrations, the arms are shown in the same plane as the springs, in other variations, the arms could lay in planes above or below (e.g. behind the sheet or in front of the sheet—in X) the springs or the spring segments to allow narrowing of the width of the probe (in Y) while providing some increase in thickness (in X).

Figure 2J:
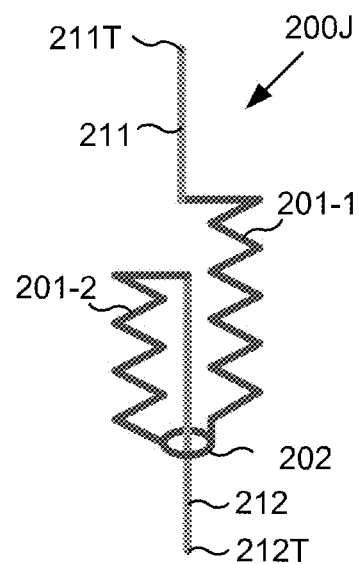
FIG. 2J provides a schematic representation of a side view of a vertically oriented probe having two spring segments with one of the edge-to-edge configured springs operating in compression and the other operating in tension.
Figure 3A:
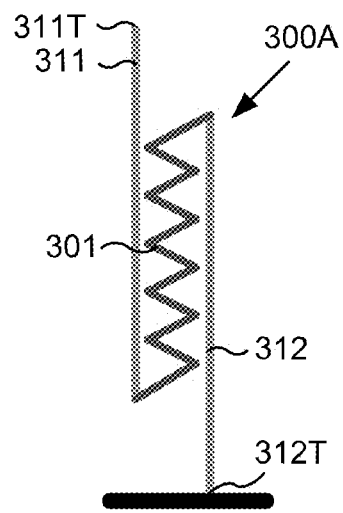
FIGS. 3A-3J provide further example embodiments of probes that are similar to those of FIGS. 2A-2J, respectively, with the difference being that the lower contact tip of each probe is replaced by a tip that is a bonded, attached, captured, or otherwise retained electrical connection.
Figure 3B:
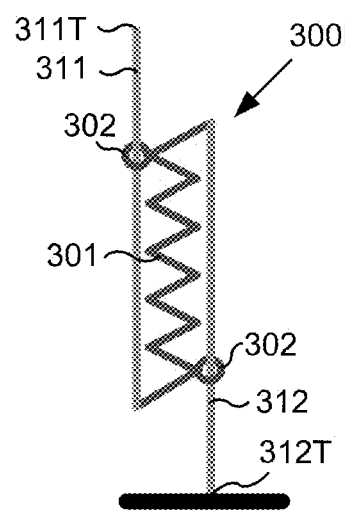
Figure 3C:
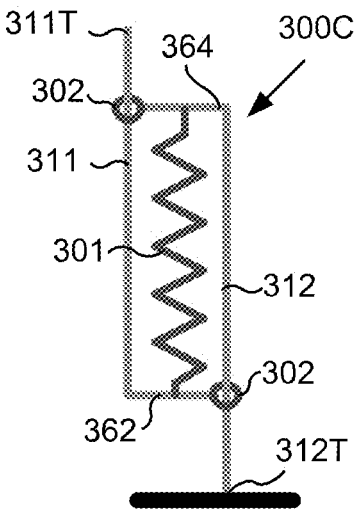
Figure 3D:
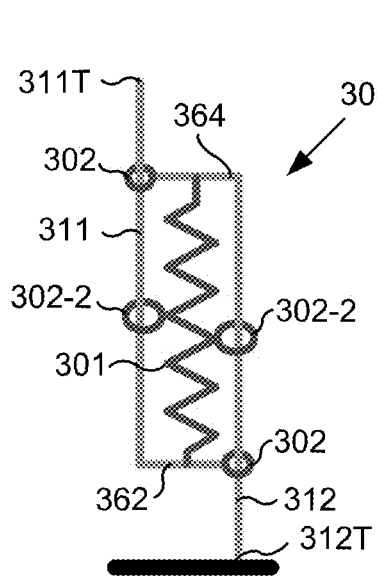
Figure 3E:
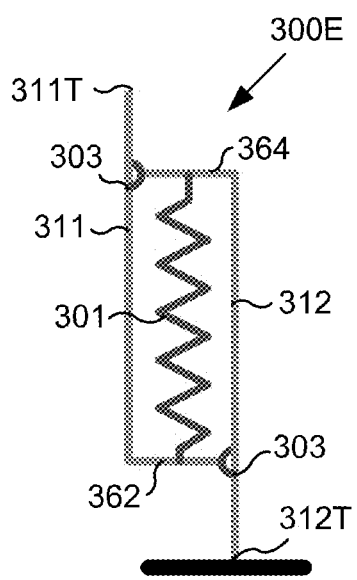
Figure 3F:
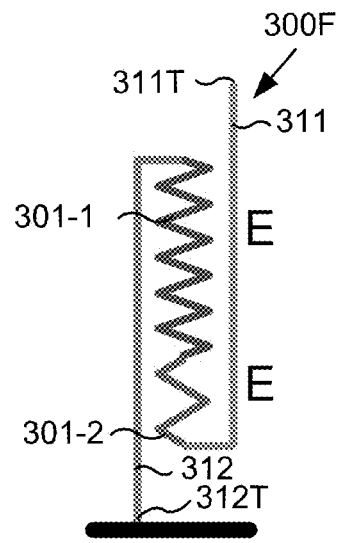
Figure 3G:
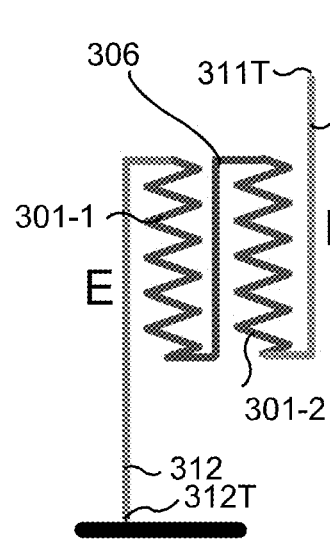
Figure 3H:
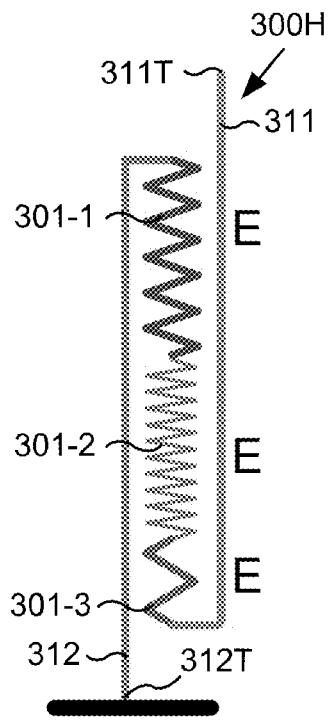
Figure 3I:
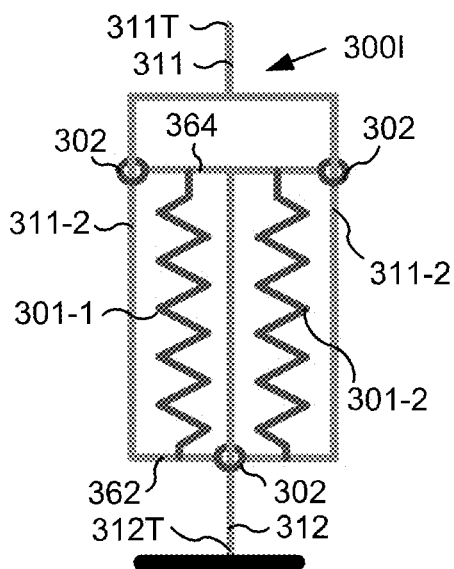
Figure 3J:
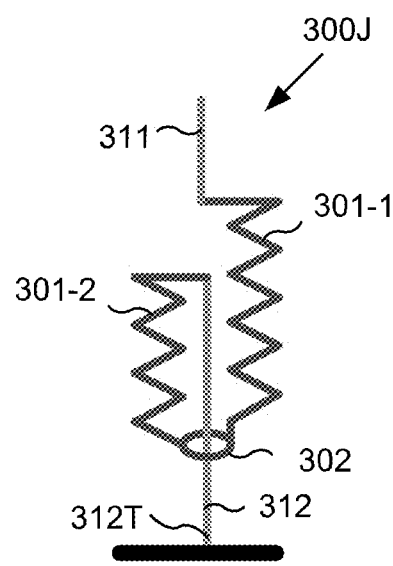

FIG. 2J provides a schematic representation of a side view of a vertically oriented probe 200J having two spring segments with one of the edge-to-edge configured springs 201-1 operating in compression and the other 201-2 operating in tension with the segments connected to one another by a slip ring 202 or other guide structure while in other examples, as with the other embodiments herein, a face-to-face configuration could have been implemented. In some other examples, additional structural features may be added to the probe to aid in probe stability and in particular, to aid in ensuring controlled deflection of the compression spring element 201-1 (e.g., to avoid unintended buckling or deflection of the spring that might lead to inadvertent contact, shorting, and/or entanglement between neighboring probes in an array).

FIGS. 3A-3J provide further example embodiments of probes 300A to 300J, respectively, that are similar to probes 200A-200J of FIGS. 2A-2J, respectively, with the difference being that a contact tip 212T of FIGS. 2A-2J is replaced by an attached, bonded, captured, or otherwise retained electrical connection tip 312T. Like features between FIGS. 2A-2J and FIGS. 3A-3J are represented by similar reference numerals with the exception that the reference number series is shifted from 200 to 300. In other embodiments, the roles of the contact tip and the other tip may be reversed.

Second Group of Embodiments: Probe with First and Second Extension Springs Held within Sheath FIG. 4A provides a schematic illustration of a probe 400A similar to that of FIG. 2C with a single tensional spring 401 connected on either end to two tip arms 411 and 412 with corresponding tips 411T and 412T where the arms are connected to the springs via respective stop plates or lateral arms 462 and 464 respectively (i.e. with the lower portion of the upper arm 411 connecting to the lower plate 462 and the upper portion of the lower arm 412 connecting to the upper plate 464), wherein the upper plate has an opening 402-1 and the lower plate has an opening 402-2 through which the respective arm can pass freely with the walls of the openings functioning as longitudinal movement guides.

FIGS. 4B-1 to 4B-3 provide schematic illustrations of a probe 400B, similar to probe 400A of FIG. 4A, with the probe further including a sheath or frame structure with a left side and right side being shown that sets a minimum distance between the stop plates 462 and 464 with the sheath including upper stop features 432-1, lower stop features 432-2, and spacer or standoff sections 434. FIG. 4B-1 shows the probe in an undeflected state with the movable stops resting against the upper and lower portions of the sheath. FIG. 4B-2 shows the probe with the lower tip compressed toward the sheath (e.g., by contact with a lower contact structure that is moved toward the bottom of the sheath) with the spring being biased or stretched as the top movable plate is forced away from the top of the sheath. FIG. 4B-3 shows the probe after the upper tip is compressed toward the sheath (e.g., by contact with an upper contact structure that is moved toward the top of the sheath) with the spring being further biased or stretched as the lower movable plate is forced away from the lower portion of the sheath. In some embodiments, the sheaths may be provided with solid front and back faces or front and back frame structures that help provide lateral guidance during plate movement. In some embodiments, the sheath and/or the movable plates may include additional features that allow for retention of relative lateral positions during longitudinal movement of the probe arms, connected plates, and spring relative to the sheath.

FIG. 4C provides another schematic illustration of a probe 400C, similar to probe 400A of FIG. 4A, with the spring being pre-biased by use of a taller sheath or frame structure that holds the movable stops at a larger relative separation, thus ensuring that an initial contact of either tip against a surface (e.g. a pad, bump, or other contact surface of an electrical circuit element) will be accompanied by a non-zero restoration or back force.

FIG. 5A provides a schematic illustration of a probe 500A similar to that of FIG. 2I with two tensional springs 501-1 and 501-2 functionally connected in parallel and with additional structural emphasis added to the three structural members 562-1, 562-2 and 564 that may function as movable stops. The probe 500A of FIG. 5A has two tensional springs 501-1 and 501-2 functionally connected in parallel and connected on top to a movable stop 564 which includes two openings for passing longitudinal tip arms 511-1 and 511-2. The movable stop 564 connects to the upper end of lower tip arm 512 which in turn ends at, or connects to, lower tip 512T. The two tensional springs connect on their bottoms at bar, plate, or lateral arm 562-2 that connects to the bottom of tip arms 511-1 and 511-2 which in turn connect, at their tops, to a crossbar, plate, or lateral arm 562-1, that may function as a movable stop, which in turn connects to upper tip arm 511 which connects to tip 511T. The probe of FIG. 5A includes three potential movable stop features but with only two degrees of freedom since crossbar, plate, or arm 562-1 and bar, plate, or arm 562-2 are rigidly connected to one another by arms 511-1 and 511-2 as such viable combinations for engaging independent pairs of the potentially movable stops include: (1) engaging plate 562-1 and 564 or (2) engaging plate 562-2 and 564.

FIGS. 5B-1 to 5B-2 provide first and second variations of the probe of FIG. 5A but with the addition of sheath or frame structures. The probes 500B of FIGS. 5B-1 and 5B-2 have pairs of stops 532-1 and 532-2 that set the minimum distance between the upper and lower moving stops. Stop 532-1 sets the lower position of upper movable stop 564 by bounding the upper movable stop 564 to upward relative motion. Stop 532-2 sets the upper position of lower movable stop 562-2 by bounding the lower movable stop 562-2 to downward relative motion. The minimum distance set by the stops of FIG. 5B-1 is the same separation distance shown in FIG. 5A while the minimum distance set by the stops of FIG. 5B-2 is larger than the separation distance shown in FIG. 5A. Worded another way, the probe of FIG. 5B-2 has an initial bias that is larger than that of FIG. 5B-1. The amount of working compression range of the probes of FIGS. 5B-1 and 5B-2 may be set by the lengths of arms 511-1, 511-2, and 512 or by the gap between 564 and 562-1 because either of these may dictate the elastic range of motion allowed. In other embodiments, different parameters, structures, or features may be used to set the working range of motion and any desired level of pre-biasing of the spring.

Figures 1, 2, 5C:
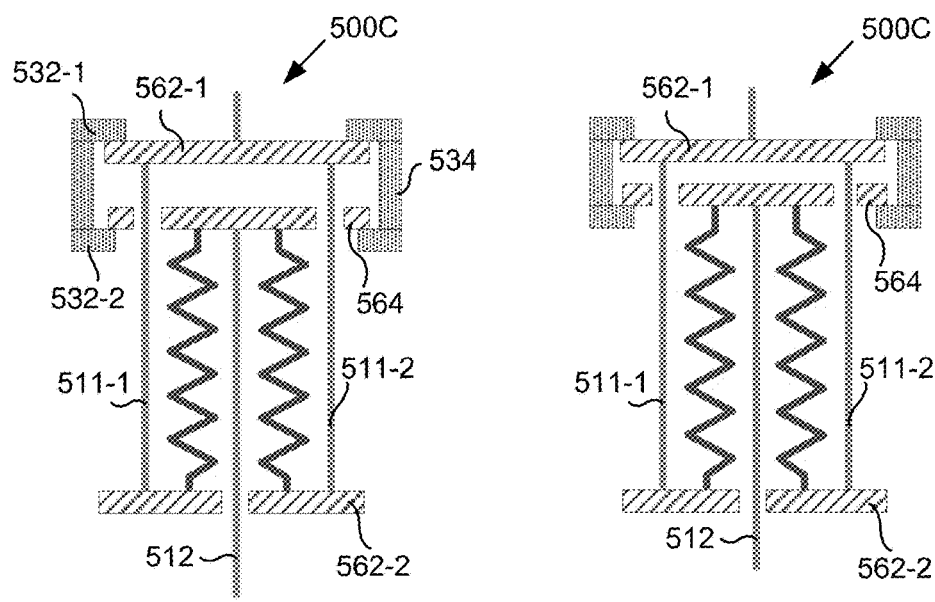

The probes 500C of FIGS. 5C-1 and 5C-2 provide third and fourth variations of the probe of FIG. 5A with each having a pair of stops that sets the maximum distance between the upper pair of movable stops. Stop 532-2 sets the lower position of movable stop 564 by bounding movable stop 564 to upward relative motion. Stop 532-1 sets the upper position of upper movable stop 562-1 (and thus the upper position of lower movable stop 562-2) by bounding the upper and lower movable stops 562-1 and 562-2 to down-ward relative motion. The gap between stops 532-1 and 532-2 of FIG. 5C-1 should be adequate to provide a desired extent of compressive motion for the tips of the probe. The maximum distance set by the stops of FIG. 5C-1 is the same separation distance shown in FIG. 5A while the maximum distance set by the stops of FIG. 5C-2 is smaller than the separation distance shown in FIG. 5A wherein the maximum distance also sets a maximum allowable compression of the tips toward one another. Worded another way, the probe of FIG. 5C-2 has an initial bias that is larger than that of the probe of FIG. 5C-1. The amount of working compression range of the probes of FIGS. 5C-1 and 5C-2 may be set by the lengths of arms 511-1, 511-2, and 512 or the gap between 564 and 562-1 (or the gap resulting from the limitations defined by stops 532-1 and 532-2 because any of these may dictate the elastic range of motion allowed. In other embodiments, different parameters, structures, or features may be used to set the working range of motion and any desired level of pre-biasing of the spring.

In some variations of the embodiments of FIGS. 5A to 5C-2, different spacing heights may be used for the fixed stops, different lengths of arms and springs may be used, additional guide structures may be added, tabs or other structures may be added to the sheaths or frame structures to provide controlled engagement with array structures (e.g. guide plates, substrates, other probes, or the like), and dielectric features may be added to provide electric isolation of selected elements within a given probe or between neighboring probes.

Figures 1, 2, 6A, 6B:
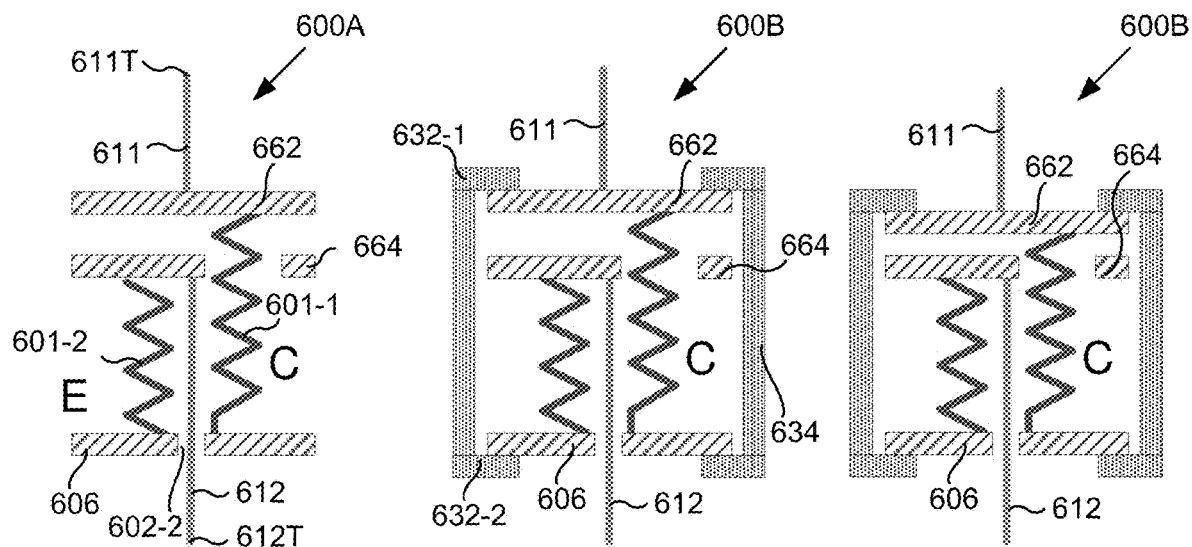

FIG. 6A provides a schematic illustration of a probe 600A similar to that of FIG. 2J with an extension spring or tensional spring 601-2 and a compression spring 601-1 functionally connected side-by-side in series by a movable stop structure 606 at their lower ends. Lower movable stop structure 606 includes an opening through which arm 612 can pass. An upper end of arm 612, along with an upper end of spring 601-2 attach to another movable stop 664 that includes an opening for passing spring 601-1. An upper end of spring 601-1 connects to a movable stop 662 as does a lower end of upper tip arm 611 which joins tip 611T at its opposite end. A lower end of lower tip arm 612 joins tip 612T.

FIGS. 6B-1 to 6B-2 provide first and second variations of a probe 600B, similar to probe 600A of FIG. 6A but with the addition of sheaths or frame structures having upper stop 632-1, lower stop 632-2 and spacers or standoffs 634 that set the maximum distance between a first pair of movable stops 606 and 662 (i.e., the top and bottom movable stops) with the maximum distance of FIG. 6B-1 being the same separation distance shown in FIG. 6A while the maximum distance of FIG. 6B-2 being smaller than the separation distance shown in FIG. 6A wherein the initial displacement of the upper tip downward results in biasing the compression spring while the initial displacement of the lower tip upward biases both the tension and compression springs until the middle and upper movable stops contact one another in which case any remaining compressibility biases the compression spring only until the lower movable stop contacts the lower sheath or frame structure. The probe of FIG. 6B-2 has an initial bias that is larger than that of FIG. 6B-1. The amount of working compression range of the probe of FIGS. 6B-1 is greater than that of FIG. 6B-2 wherein the working compression range may be set by the lengths of arms 611 and 612 or the gap between 664 and 662 because either of these may dictate the elastic range of motion allowed. In other embodiments, different parameters, structures, or features may be used to set the working range of motion.

Figures 1, 2, 6C:
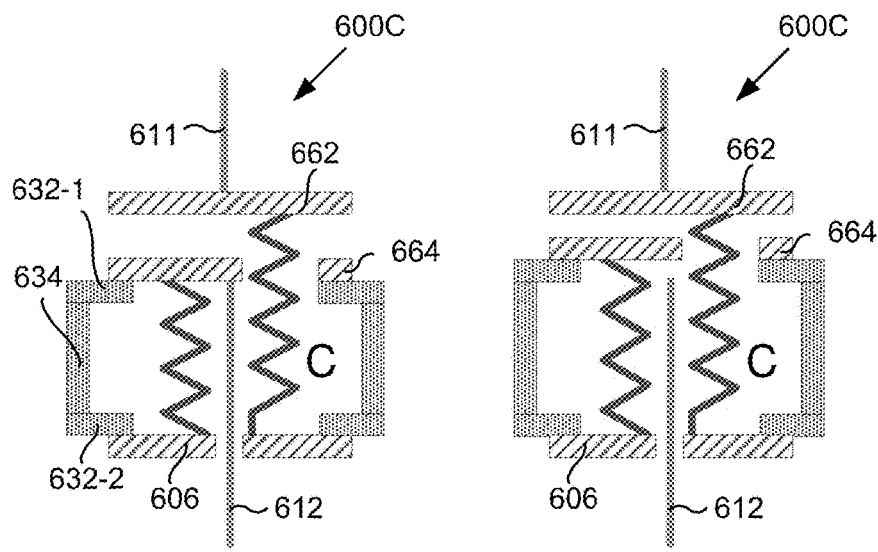

FIG. 6C-1 to 6C-2 provide third and fourth variations of a probe 600C, similar to probe 600A of FIG. 6A but with the addition of sheaths or frame structures that set a minimum distance between a second pair of movable stops 664 and 606 (i.e., the middle and bottom movable stops) with the maximum distance of FIG. 6C-1 being the same separation distance shown in FIG. 6A while the minimum distance of FIG. 6C-2 being larger than the separation distance shown in FIG. 6A wherein the initial displacement of the upper tip downward results in biasing both the compression spring and the extension spring while the initial displacement of the lower tip upward biases only the extension spring at least until the compression spring no longer contacts the lower sheath or frame stop with the maximum compression of the tips toward one another being no greater than the initial separation of the middle and upper movable stops 662 and 664. The probe of FIG. 6C-2 has an initial bias that is larger than that of FIG. 6C-1 leaving a smaller working range of motion. The amount of working compression range of the probes of FIGS. 6C-1 and 6C-2 may be set by the lengths of arms 611 and 612 or the gap between 664 and 662 because either of these may dictate the elastic range of motion allowed. In other embodiments, different parameters, structures, or features may be used to set the working range of motion.

In some variations of the embodiments of FIGS. 6A to 6C-2, different spacing heights may be used for the fixed stops, different lengths of arms and springs may be used, additional guide structures may be added, tabs or other structures may be added to the sheaths or frame structures to provide controlled engagement with array structures (e.g. guide plates, substrates, other probes, or the like), and dielectric features may be added to provide electrical isolation of selected elements within a given probe or between neighboring probes.

Figure 7A:
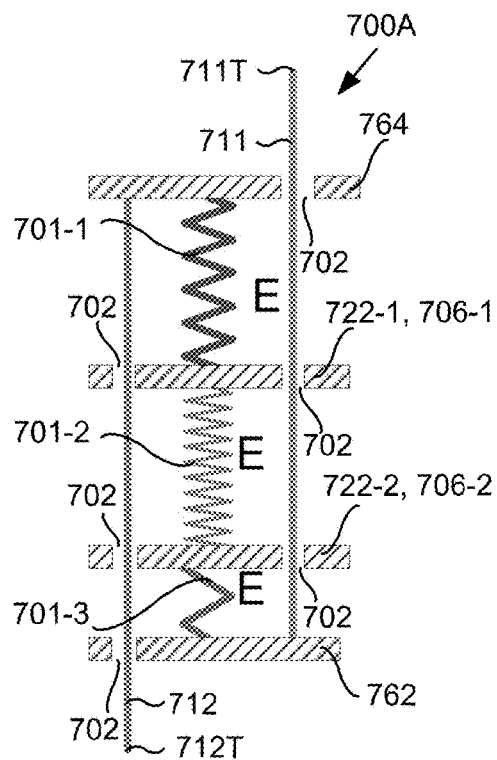
FIGS. 7A-7C provide a three-spring segment example probe with the upper spring, lower spring, and middle spring all operating in tension wherein the probe also includes upper and lower moving stops as well as upper and lower tips and arms with fixed stops also shown in FIGS. 7B and 7C.
Figure 7B:
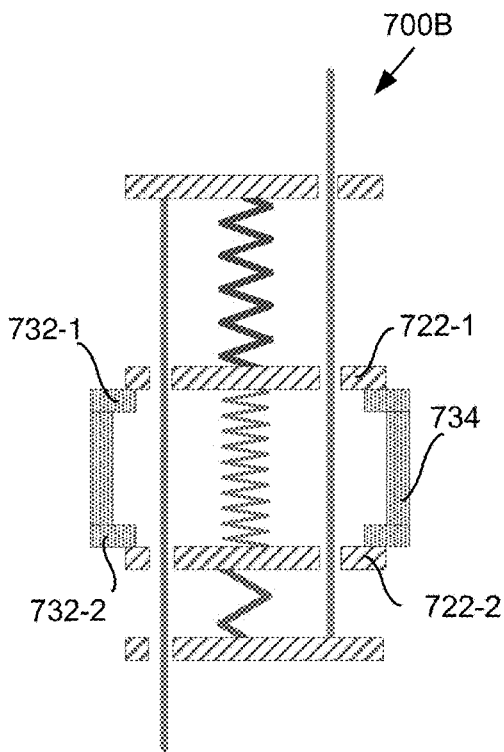
Figure 7C:
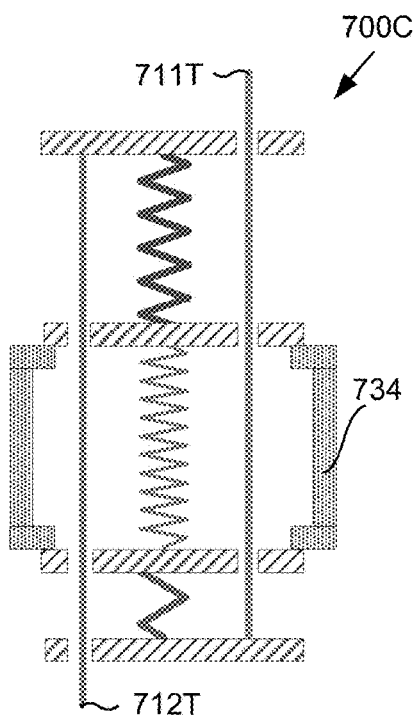

FIGS. 7A-7C provide schematic illustrations of three example probes 700A-700C having three extension springs 701-1, 701-2, and 701-3 located in series with the probes also having movable stops 764, 722-1, 722-2, and 762 as well as upper and lower tips 711-T and 712T and tip arms 711 and 712 with fixed stops 732-1 and 732-2 also shown in FIGS. 7B and 7C. Movable stops 722-1 and 722-2 also function as joiners 706-1 and 706-2 for spring segments. Probe 700A of FIG. 7A includes an upper tip 711T at the upper end of an upper arm 711. The lower end of the upper arm is attached to a movable stop or lateral extension arm 762 with the stop having an opening that may function as a slip ring 702 that allows passage of a second tip arm 712 and the arm 762 having the lower end of spring 701-3 attached thereto. The upper end of spring 701-3 attaches to a second movable stop 722-2 to which a lower end of spring 701-2 attaches, with the stop 722-2 also including an opening for passing another portion of tip arm 712. An upper end of spring 701-2 attaches to another movable stop 722-1 to which a bottom end of spring 701-1 attaches with the movable stop 722-1 also having an opening for passage of another portion of arm 712. The upper end spring 701-1 and the upper end of arm 712 attached to a final movable stop or lateral extension arm 764. Movable stops 722-2, 722-1, and 764 also include passages for one or both of lower tip arm 712 and upper tip arm 711 that may also function as slip rings 702.

FIG. 7B depicts a probe 700B, similar to probe 700A of FIG. 7A, having a fixed stop or a fixed spacing structure that sets a minimum distance between two intermediate movable stops 722-1 and 722-2. The spacing structure includes stops 732-1 and 732-2 along with a spacing or standoff element 734, wherein the minimum spacing distance is the same as the separation distance shown in FIG. 7A.

FIG. 7C shows a probe 700C, similar to probe 700A of FIG. 7A, with the fixed stop or fixed spacing structure of FIG. 7B but with the spacer or standoff 734 being taller. Interactions between springs, the fixed stops, the moving stops, along with pre-tensioning of one or more springs prior to usage can lead to overall spring constant variations (e.g., decreases) over a working compression range of the probe tips 711T and 712T toward one another, as is discussed in more detail in currently filed U.S. application Ser. No. 17/139,936 (Microfabrica Docket No. P-US400-A-MF). In other examples, variations are possible where one spring or two springs operate in compression while the other two springs or one spring operate in tension. In still other variations, the springs and/or the arms could all be overlaid in a variety of face-to-face or edge-to-edge configurations with the arms running outside or between the various spring segments.

Figure 8:
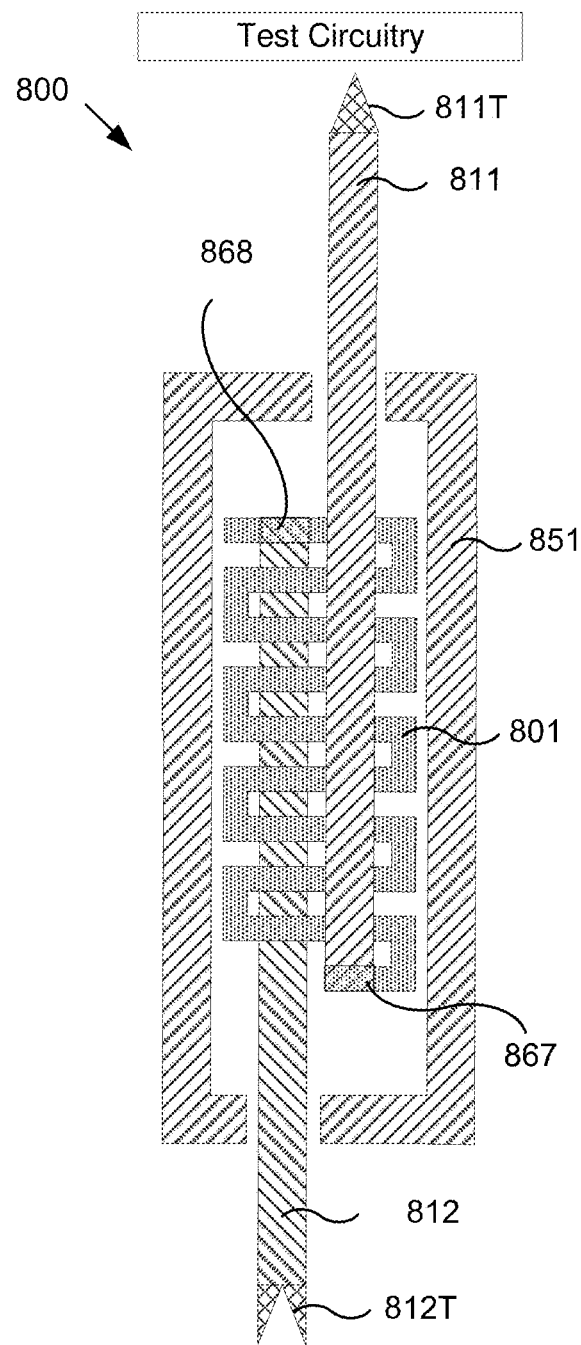
FIG. 8 provides a schematic representation of a probe according to another embodiment of the invention where the probe includes a single spring segment (like that of FIG. 2A or 2B), an upper tip arm and contact tip which are positioned in front of the plane or layer of the spring, and a lower arm and tip that are positioned behind the plane or layer of the spring.

FIG. 8 provides a schematic representation of a probe 800 according to another embodiment of the invention where the probe includes a single spring segment 801 (like that of FIG. 2A or 2B) that is operated by pressing on upper tip 811T, which is connected to arm 811 with both being positioned in front of the plane or layer of the spring, and lower tip 812T, which is connected to arm 812 with both being positioned behind the plane or layer of the spring and where the ends of the spring engage the arms at locations or via structures 867 and 868 which are longitudinally opposite to their respective tip locations and wherein the arms run along opposite faces of the spring segment and extend longitudinally beyond the ends of the sheath 851. Gaps also separate the spring faces and the arms except at the connection locations 867 and 868. In some embodiments, the front and back of the sheath may be fully closed, be partially closed, or remain open. Similarly, the sides of the sheath may be fully closed or partially open. In the illustration of FIG. 8, the front and back faces are shown as open. Numerous other alternatives are also possible: for example: (1) arm positioning may be opposite to that shown, (2) both arms may be positioned on the same side of the spring, (3) both arms may be laterally aligned with one another in front of or behind the spring, (4) both arms may be located on either side of the spring with their respective tips located in line with the arms or with tips translated to a common line (e.g. a center line) of the probe by inclusion of laterally extending translating arms (e.g. that may be located beyond the working range of the spring), or (5) one or both arms may be located beyond either edge of the spring, within a plane or layer of the spring or in a separate plane or layer with their respective tips located in line with the arms or with tips translated to a different line (e.g. a center line) of the probe by laterally extending translating arms (e.g. that may be located beyond the working range of the spring). In some embodiments, one or more laterally extending arms set the maximum compression of the probe tip toward that respective end of the sheath. Still numerous other variations are possible with some set forth herein as features of other embodiments or as alternatives associated with other embodiments.

Third Group of Embodiments: Assembly of Multi-Spring Probes into Arrays with Pre-loading of Tensional Springs FIGS. 9A-9J provide side section illustrations of various states in a process of assembling a probe array with pre-tensioned spring probes. In particular, the side section illustrations show a plurality of probes (two probes in this illustration) being loaded into an array frame including an upper set of biasing plates, one or more standoffs, and a lower set of biasing plates that provides intended lateral (XY) positioning of the probes along with pre-loading or biasing of an extension spring that is held by movable stops to which probe tip arms join while allowing upper and lower moving stop elements to move upward and downward respectively while maintaining a minimum downward position of the upper moving stops and a maximum upward position of the lower moving stops at positions dictated by the upper and lower fixed stops or biasing plates wherein fixed stop positions are at different longitudinal heights on either side of each probe and wherein at least some of the fixed stop positions are set by the relative lateral sliding of the stop or biasing plates.

Figure 9A:
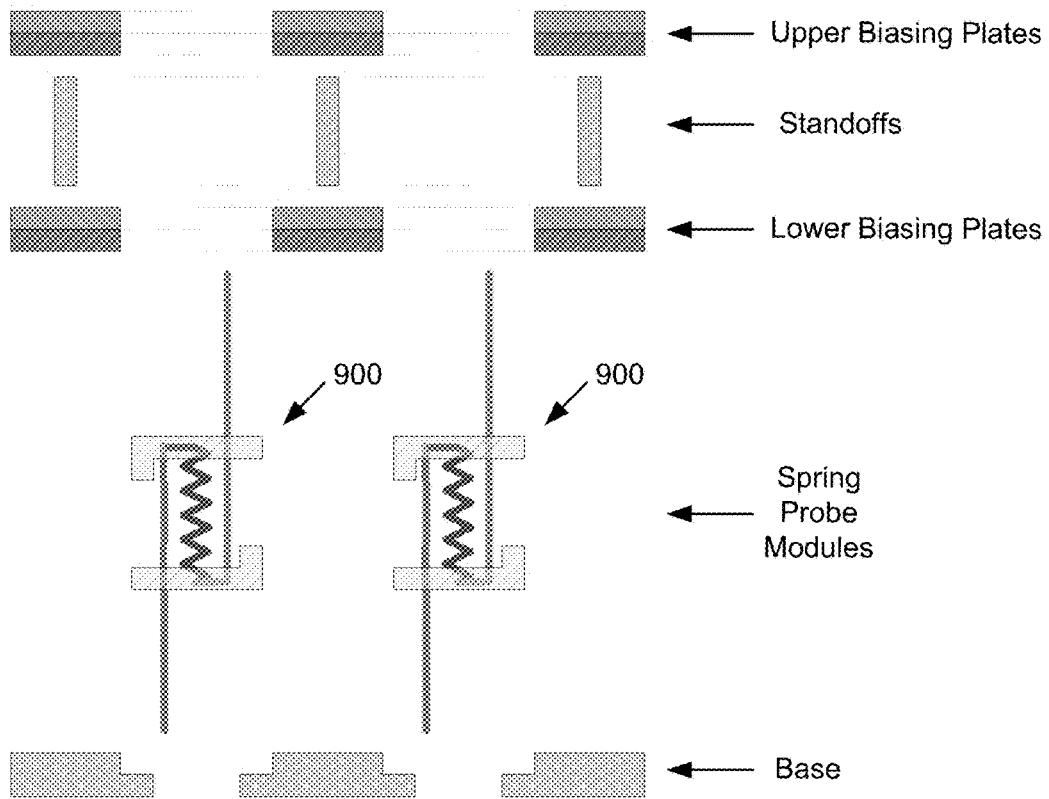
FIGS. 9A-9J provide side section illustrations of various states in a process of assembling a probe array with pre-tensioned spring probes according to an embodiment of the invention.
Figure 9B:
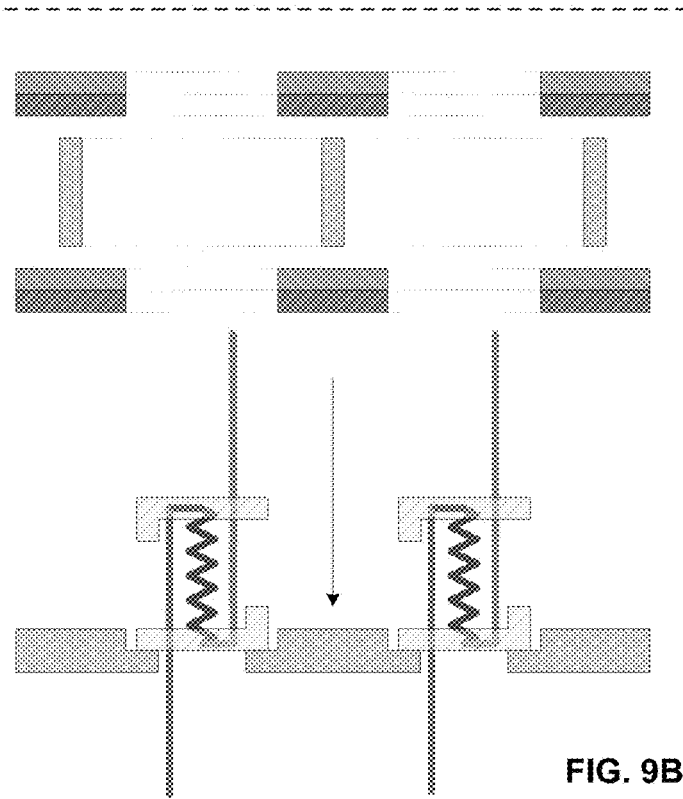
Figure 9C:
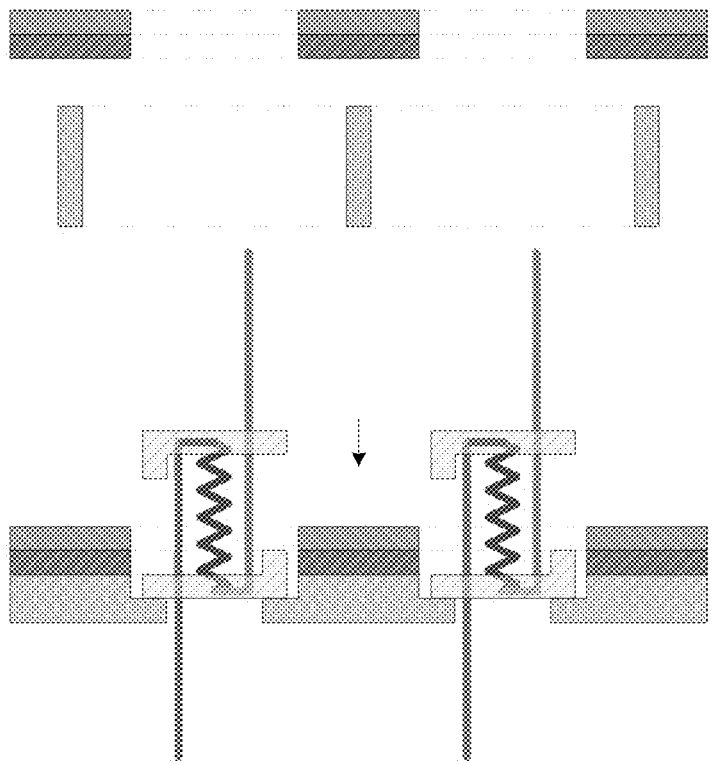
Figure 9D:
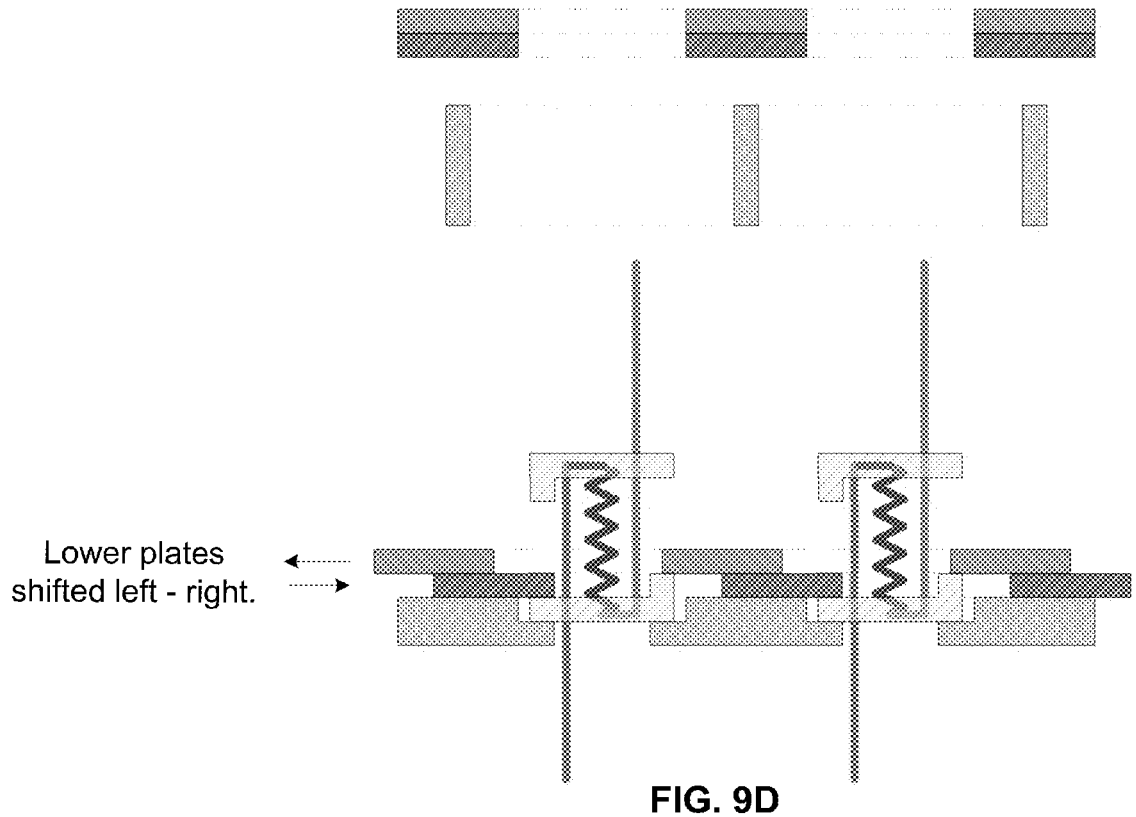
Figure 9E:
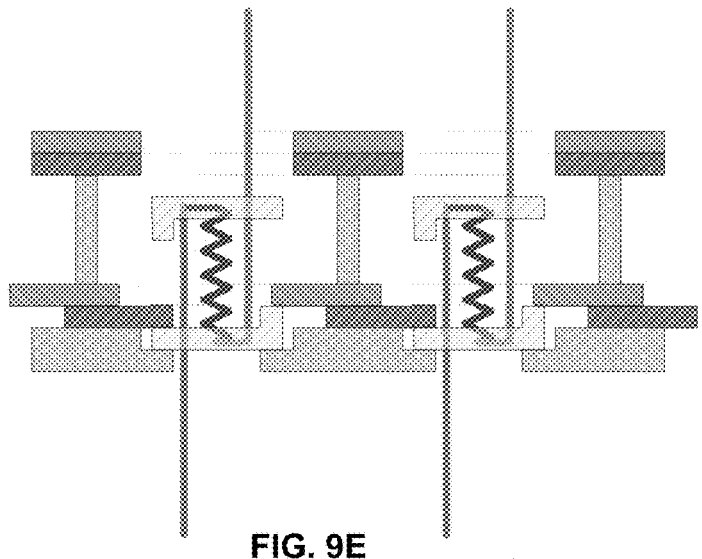
Figure 9F:
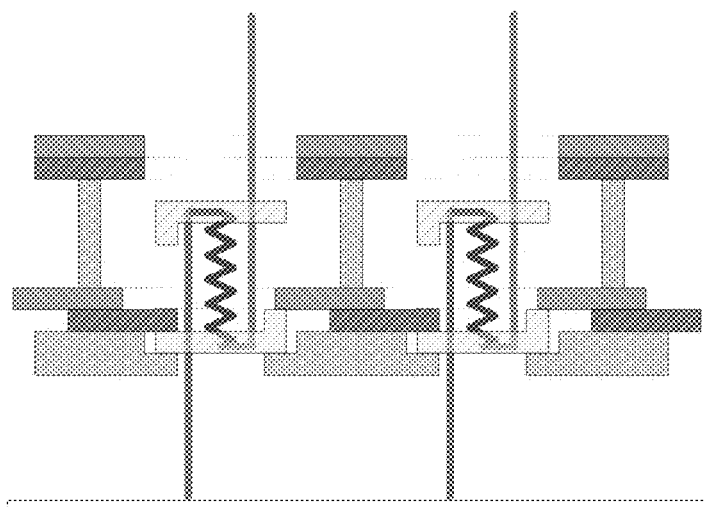
Figure 9G:
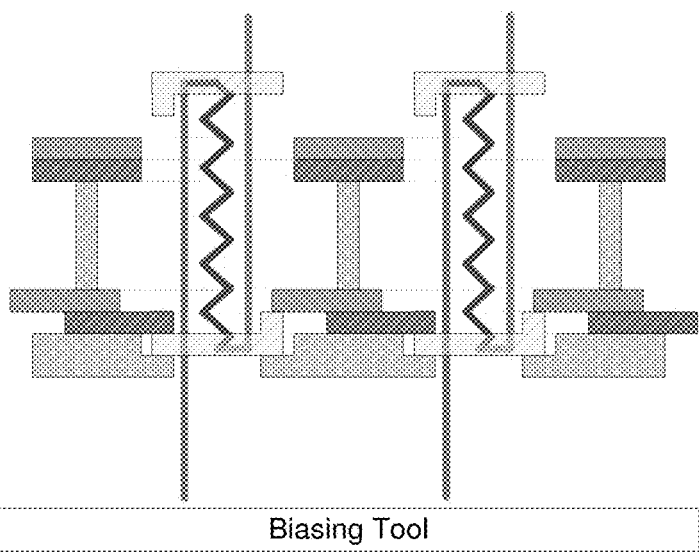
Figure 9H:
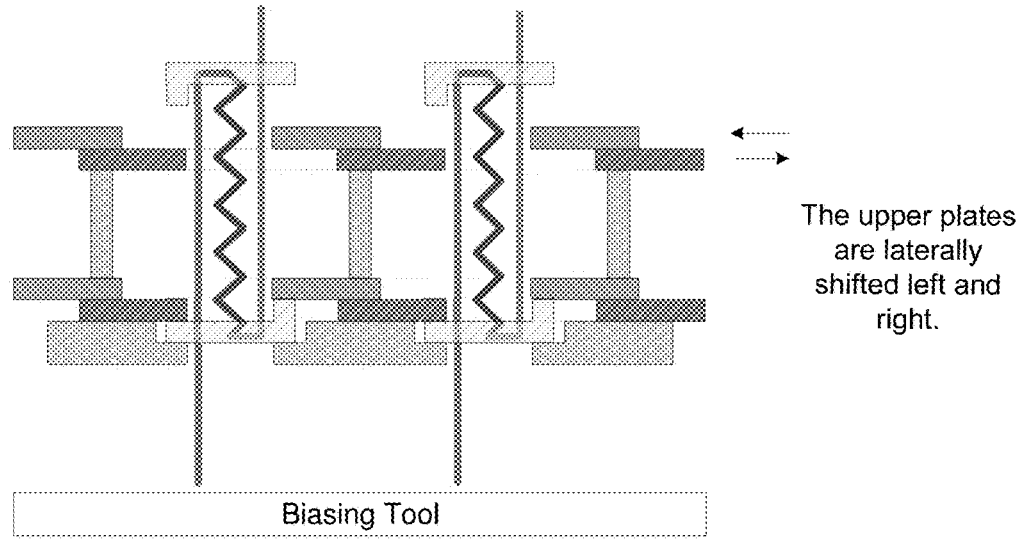
Figure 9I:
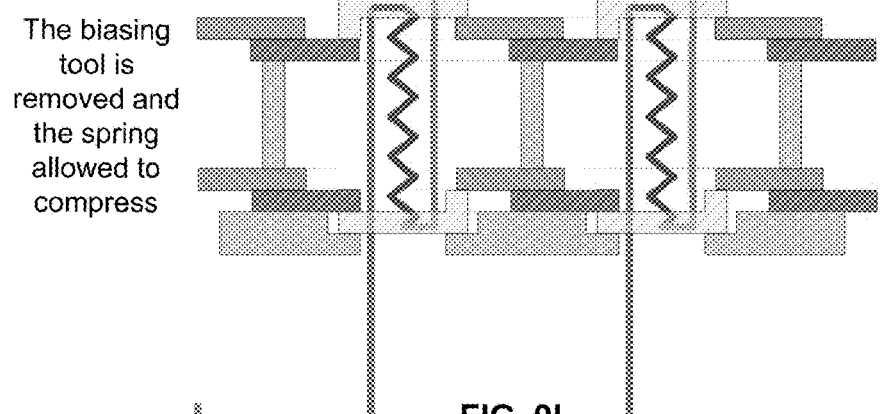
Figure 9J:
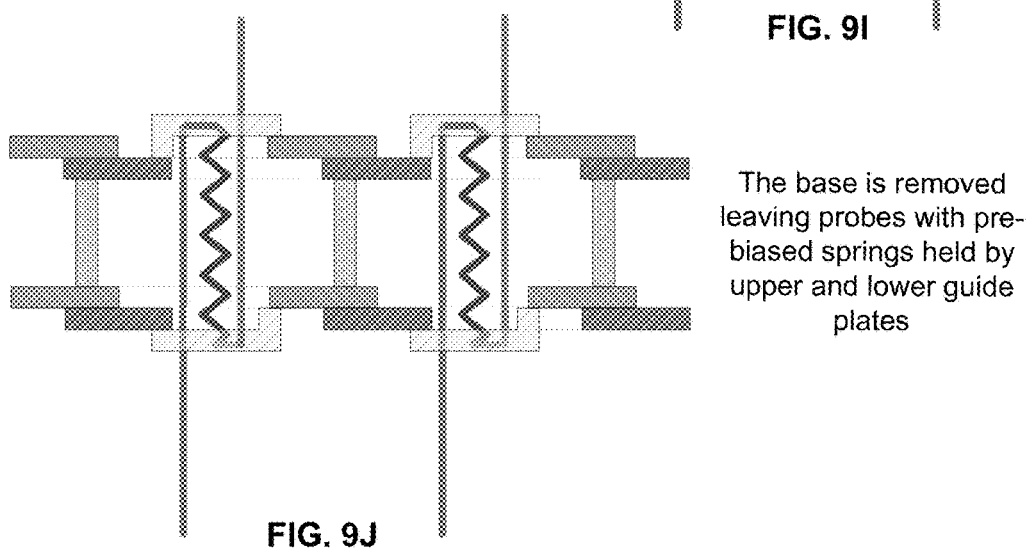

FIG. 9A provides a side schematic representation of an initial state in a probe array assembly process where a base, probes, a lower biasing or stop plate pair, standoffs, and an upper biasing or stop plate pair are shown as being longitudinally separated and laterally aligned. The lower biasing plate pair and the upper biasing plate pair each include a bottom plate and a top plate that can be laterally shifted relative to one another while maintaining their longitudinal proximity. FIG. 9B shows the probes and the base after being brought together longitudinally. FIG. 9C shows the lower stop plate pair being shifted longitudinally to a position on or near the base. FIG. 9D shows the state of the process after relative lateral movement that splits the bottom and top biasing plates of the lower pair laterally to close the openings and trap the probe's lower movable stop plate temporarily against the base. As shown, the left side of the lower movable stops are captured by the right facing edges of openings in the lower biasing plate while the slightly higher right side of the lower movable stops of the probes are captured by the slightly higher left facing edges of the openings in the top biasing plate (of the lower set of plates) such that the probes are temporarily restrained by the base and the lower biasing plate pair. FIG. 9E illustrates the state of the process after the standoffs and upper pair of fixed stop plates set are lowered into contact with each other and into contact with the upper plate of the lower set. FIG. 9F shows the state of the process after a biasing tool is moved into position below the lower probe tips. FIG. 9G shows the state of the process after relative longitudinal movement of the biasing tool and the base (or of some other features of the probes or probe frames) causes the upper portion of the spring to extend such that the lower surface of the upper movable stop is moved upward and is located above the longitudinal level of the lower surface of the top biasing plate of the upper biasing plate pair. FIG. 9H shows the state of the process after relative lateral movement of the bottom and top biasing plates of the upper plate pair such that the right facing edges of the openings in the bottom plate move laterally under the left edges of movable upper stops of the probes and the left facing edges of the openings in the top biasing plate are below the right edges of the upper movable stops of the probes. FIG. 9I shows the state of the process after relative longitudinal movement of the base and the biasing tool allow the upper springs to contract so as to allow the upper movable probe stops to contact the upper plate pair while still maintaining some tensional biasing of the springs. FIG. 9J shows the state of the process after the base has been removed, leaving only the configured probe array with the biasing plates being used as guide plates for the array while allowing the probe tips to be compressed toward one another when making electrical contact with circuit elements while allowing the upper movable stops to move upward and the lower movable stops to move downward, thus allowing the compliance of the springs to provide controlled mating of the probes and the circuit elements. In alternative embodiments, the movable stops of the probe may not have raised and lowered plate engagement features as any height difference associated with the side-to-side displacement of the upper and lower biasing plates of a biasing plate pair may be insignificant or otherwise acceptable. In other embodiments, additional plates may be included within a pair so as to provide a higher level of surface engagement (e.g., three plates undergoing lateral displacement along 120° orientations, or four plates undergoing displacement at 90° orientations). In still other alternative embodiments, different probe structures may be used instead of the example shown. Similar processes may be used to cause loading of springs into multiple probe sheaths to provide pre-biasing of at least one spring in such probes after which the encased probes may be loaded into array frames or guide plates.

Figure 10:
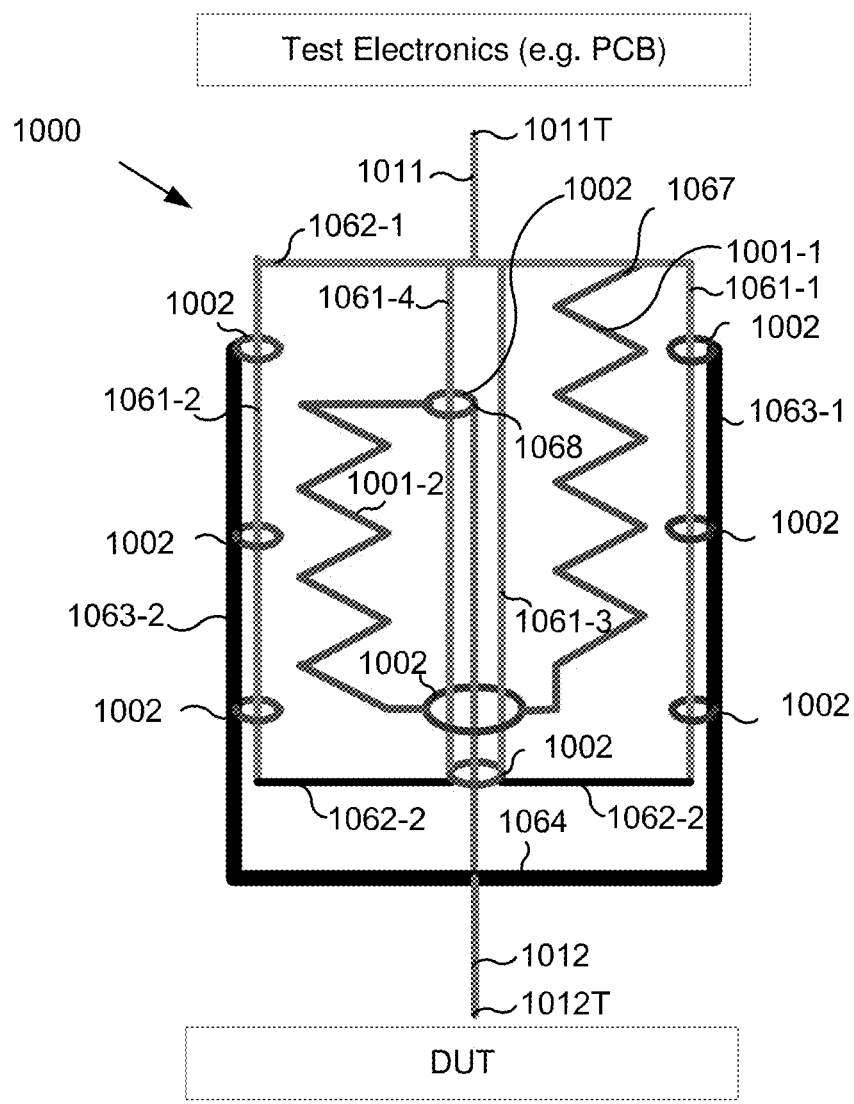
FIG. 10 provides a schematic representation of a probe according to another embodiment of the invention where the probe includes two spring segments with a first segment (on the left) operating in tension and a second segment (on the right) operating in compression, wherein the upper end of the first spring rigidly engages a lower frame structure and lower tip arm and probe tip while the upper end of the second spring rigidly engages an upper frame structure and upper tip arm and probe tip, and wherein the frame structures can move longitudinally relative to one another via a number of sliding guide structures.

Fourth Group of Embodiments: Probes with a Multiple Springs and Stabilizing Guide Elements FIG. 10 provides a schematic representation of a probe 1000 where tip 1011T results in compression of spring 1001-1 while movement of lower tip 1012T results in extension of spring 1001-2. Since the two springs 1001-1 and 1001-2 are joined at their lower ends by coupling and guide ring 1002, the compressing of spring 1001-1 has an impact on the net extension of spring 1001-2 while the extension of spring 1001-2 has a net impact on the compression of spring 1001-1. A net force applied to the tips of the probe depends on several factors including the spring constant of each spring, the net deflection of each spring, and any initial bias created in each spring. An upper probe tip 1011T is located at the upper end of tip arm 1011 while the other end of the tip arm connects to a relatively rigid upper sliding frame structure via a lateral crossbar or arm 1062-1 with these bars in turn connecting to the upper end of spring segment 1001-1 as well as to other frame elements 1061-1 to 1061-4. Frame elements 1061-1 to 1061-4 at their lower ends connect to lateral cross bars 1062-2 which are joined by another coupling and guide ring 1002. The upper portion of spring 1001-2 connects to another slip ring 1002 which also connects to tip arm 1012 which ends in tip 1012T. The upper sliding frame is held by and can slide longitudinally relative to a second frame that includes longitudinal elements or arms 1063-1 and 1063-2 and lateral element or arm 1064 where an interface between the relatively movable frames includes a plurality of slip rings 1002 on the right and on the left which are mounted to the second or lower frame while slidably engaging the first or upper frame with a relative longitudinal positioning of the frames being a function of the relative position of upper and lower circuit elements (such as a DUT, device under test, or a space transformer, a PCB, or other test circuit interface elements that engage probe tips) along with any other movable or fixed stop to which the probe may engage. In some variations another lateral arm, arms, or arm and slide ring elements may connect the upper portion of the longitudinal arms 1063-1 and 1063-2 together (e.g. via slide rings 1002 while still allowing sliding of element 1061-1 to 1061-4 relative thereto. The frame elements help in stabilizing probe functionality and may help ensure that the compression spring 1001-1 does not deflect or bow excessively. In some implementations, additional guide elements may be provided in front and/or behind both faces of one or both springs to provide additional operational stability. In some variations, initial biasing of one or both springs may be useful in providing tailored operational characteristics to the probe. For example, selecting and setting a distance between element 1064 and elements 1062-2 that is different from a nominal unbiased distance may result in pre-biasing of the springs to provide an initial non-zero contact force for the probe.

FIGS. 11-1 to 11-6 provide a number of isometric views of a probe 1100 and views of expanded sections of the probe 1100 according to another embodiment of the invention where probe 1100 provides a specific implementation of spring and guide functionality similar to that of the probe of FIG. 10 with the primary exception being that the lower frame moves within slots or channels in the upper frame as opposed to the upper frame moving within slots or channels in the lower frame.

FIG. 11-1 provides an isometric view of probe 1100 with the lower frame (left frame or S2) movable in channels or slots in the upper (right frame or S1). The two frame structures S1 and S2 are elastically joined by two spring segments 1101-1 and 1101-2 connected in series. Structure S1 includes the first tip arm 1111 and tip 1111T (which may be used to make contact with a bonding pad or other connection element of a first electrical circuit element), guide arms 1161-1 to 1161-4 (with only 1161-1 to 1161-3 being visible in FIG. 11-1 and with 1161-4 being visible in FIG. 11-4 and with it being symmetrically opposed to 1161-3 about a plane containing the longitudinal axis of the probe and stacking axis of probe layers) and end connectors 1162-2 that joins the guide arms on the left end of S1 and 1162-1 that joins the right end of S1 and doubles as part of the right end tip arm 1111. Structure S2 includes guide arms 1163-1 to 1163-3 and lateral arm 1164 that also functions as a movable stop where S1 and S2 can slide relative to each other. S1 and S2 are connected by a spring group which includes a tensional portion or segment 1101-2 that has a right end that joins the right end of S2 at 1168 (see FIGS. 11-5 and 11-6) and a left end that joins the left end of a compressional spring segment 1101-1 via a slidable guide 1102, or lateral connector 1106, which can slide relative to the guide arms of both S1 and S2. The right end of spring segment 1101-1 joins S1 at 1167 (see FIG. 11-5). The right end of S2 is shown with a flat tip arm 1112 and tip 1112T. The tip 1112T may be used to make electrical connection with a contact pad of a second electrical circuit element (e.g. a DUT or device under test, which may be, for example, an integrated circuit still in wafer form) and which, in alternative embodiments, may take on a variety of different forms other than the blunt flat tip configuration of the current example. As shown, flat tip arm 1112T is separated from the left end of S1 by a gap 1170-3 that allows compression of tip 1112T toward tip 1111T. Spring segment 1101-2 takes the form of an extension spring and has a planar configuration as the extension spring self-aligns longitudinally under tension while spring segment 1101-1 takes the form of an extension spring and has flanged edges on either lateral side of the probe where the flanges can engage with and slide along arms 1161-1 to inhibit excess lateral displace as the spring is compressed. In other embodiments, other configurations may be used to provide lateral displacement constrains on the compression spring including, for example, one or more slots in which the spring moves, laterally centralized flanges, or notches in the spring that engage appropriate guide elements.

FIG. 11-2 provides a close up view of the left most portion of the probe of FIG. 11-1 so that various key elements can be better seen, including: (1) Tip 1112T; (2) Three guide arms 1163-1, 1163-2, and 1163-3 of S2; (3) Main guide arms 1161-1, 1161-2, 1161-3; (4) an upper and lower pair of sliding interfaces or slots 1103 in S1 for the T-shape rails or guide arms of S2, wherein the slots are partially defined by guides 1161-1 and 1161-2 of S1; and (5) Tensional spring segment 1101-2 and the compressional spring segment 1101-1, and the connector 1102 (or lateral arm 1106 that joins the left end of the two spring segments together and allows for sliding along both S1 and S2. Furthermore, in this example, guides 1163-1, 1163-2, and 1163-3 can be seen having narrowed regions 1183-1, 1183-2, and 1183-3, respectively, where the narrowed regions can be used to provide a larger gap between the guides 1163-1, 1163-2, and 1163-3 and inside of the slots defined by 1161-1 and 1161-2 during fabrication of the as-assembled but not fully engaged probe, whereafter S1 and S2 are transitioned to a working or operational configuration by pressing the ends of the probe together wherein the wider regions of the guides 1163-1, 1163-2, and 1163-3, labeled as 1181-1, 1181-2, and 1181-3 respectively, are brought into the slots formed by 1161-1 and 1161-2, thereby narrowing the gap and providing a probe with a more stable operational configuration that includes a tightened sliding tolerance. For example, during formation, the gap may be larger than a minimum feature size (e.g., a size that allows formation of the features to occur with desired or required yield, e.g., 80, 90, 95, or even 99%, or more as a feature yield for a given batch fabrication process) which may be, for example, as large as 5, 10, 20, 30 microns or more. After transition to a work configuration, the gap is smaller than the minimum feature size, for example, and the gap may be reduced to 10, 5, 2 microns or even less. In other probe embodiments of the invention, such configuration size changes between interface regions for fabrication and use may be designed into other probe regions to improve stability and probe operation.

FIG. 11-3 provides an isometric view of the left end of S1 and S2 from a different angle compared to that of FIG. 11-2 so that additional features can be more readily seen such as the retention flanges 1101F at the top of the most lateral portions of undulations 1101U of the compressive spring segment 1101-1 which engages a narrowed or recessed portion along the bottom of guide arm 1161-1.

Figures 4, 11:
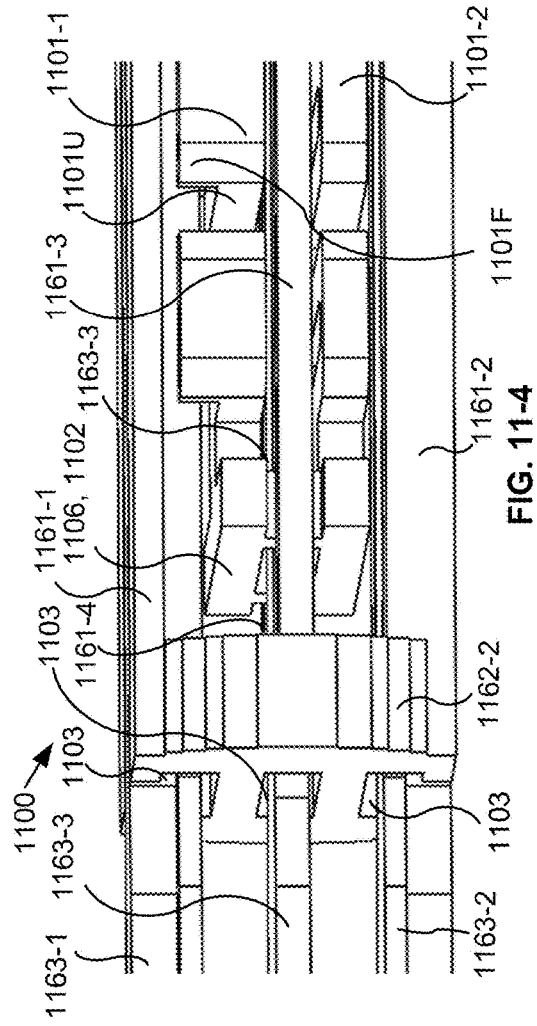

FIG. 11-4 provides an expanded view of the left end of S1 from a different angle compared to that of FIG. 11-2 so that additional features may be more readily seen such as: (1) The double I configuration of the connector 1102 (arm 1106) that joins springs 1101-1 and 1101-2 while allowing the central bar 1163-3 of S2 and side bars 1161-3 and 1161-4 of S1 to pass through it; and (2) Flanges 1101F at the ends of undulations 1101U (i.e. the elastically deformable compliant building blocks) of the compression spring segment 1101-1.

FIG. 11-5 provides an isometric view of the right most ends of S1 and S2 so that select features may be more readily seen such as: (1) Attachment structure 1167 joining the right end of the compression spring segment 1101-1 to tip arm 1111 of S1; (2) Gaps 1170-1 and 1170-2 that provide space for elements 1163-1 and 1163-2 to move into during compression of the probe tips 1111T and 1112T toward one another, and (3) Attachment structure 1168 joining the right end of the extension spring 1101-2 to tip arm 1112 of S2.

FIG. 11-6 provides an isometric view of the right most ends of S1 and S2 from a different angle than that shown in FIG. 11-5 so that selected features may be more readily seen such as the attachment structure 1168 that joins the right end of the extension spring 1101-2 to the right end of the lower bar 1163-2 and/or to the central bar 1163-3 of S2.

Numerous variations of the embodiment of FIG. 11 are possible and include for example: (1) adding to the present embodiment features associated other embodiments or replacing some of the features of the present embodiment with those from one or more other embodiments, (2) using or including a different number of stabilizing guides, (3) using or including a different configuration of stabilizing guides, (4) using or including a different number of springs or springs with different configurations, including different numbers of segments and/or types of segments and/or positional relationships between segments and their guides (e.g. between flanges and their guides), and/or different connection relationships between segments and other segments or between segments and coupling structures, (5) using or including different tip configurations. (6) using or including different connecting elements that join the spring segments where the connecting elements may or may not provide guide features, (7) using or including fixed stop features, (8) using or including different or additional moving stop features, (9) using or including interface features that aid in aligning with and engaging fixed stop features that are part of array structures, (10) using or including interface features that aid in array loading and retention, and (11) using or including additional features for aiding in the pre-biasing of spring segments.

Figure 12:
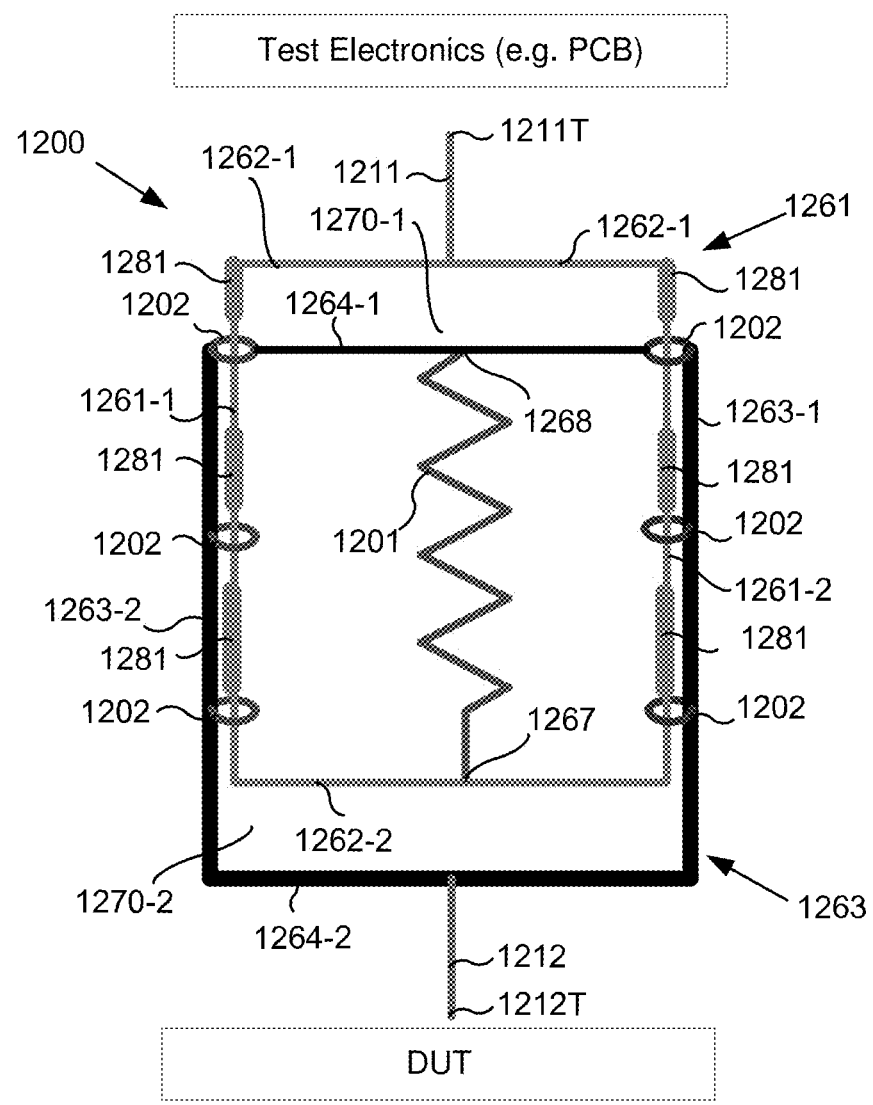
FIG. 12 provides a schematic representation of a probe according to another embodiment of the invention where the probe includes a single spring segment operating in tension by forced extension (i.e. as the probe tips are compressed longitudinally toward one another), wherein the upper end of the spring engages a first upper frame structure that rigidly joins a lower probe tip arm and tip while the lower end of the spring engages a lower portion of a second upper frame structure that rigidly joins an upper probe tip arm and tip, wherein the second frame structure can move longitudinally with respect to the first frame structure via at least one sliding guide element (a plurality are shown) wherein at least one of the sliding guide elements provides a tightened alignment tolerance after the ends of the probe undergo some amount of compression toward one another.

Fifth Group of Embodiments: Probes with a Single Spring and Multiple and Stabilizing Guide Elements FIG. 12 provides a schematic representation of a probe 1200 where compression of tips 1211T and 1212T toward one another results in extension of spring 1201. An upper probe tip 1211T is located at the upper end of tip arm 1211 while the other end of the tip arm connects to a relatively rigid first frame structure 1261 wherein the first frame structure includes two vertical or longitudinal arms labeled as 1261-1 and 1261-2, an upper lateral crossbar or arm 1262-1 and lower crossbar or arm 1262-2 with the lower crossbar in turn connecting to the lower end of spring segment 1201 at 1267. Frame structure 1261 also includes regions of expanded width 1281 on longitudinal arms 1261-1 and 1261-2 that provide for tightened tolerance or reduced gap spacing in guide elements or rings 1202 as these expanded elements transition from outside the guide elements to sliding within the elements (e.g., they are away from the expanded regions during fabrication and are relatively moved to surround the expanded regions while in a working state). The upper portion of spring 1201 connects to a second frame structure 1263 at 1268 wherein the second frame structure includes an upper lateral crossbar or arm 1264-1, a pair of vertical or longitudinal arms labeled as 1263-1 and 1263-2, and a lower crossbar or arm 1264-2. The second frame structure 1263 also fixedly holds slip rings or guide elements 1202 through which the first frame 1261 can slide including moving of the expanded width portions of the arms from outside to inside the slide rings 1202. The lower crossbar or arm 1264-2 of the second frame also connects to tip arm 1212 which ends in tip 1212T. The first and second frame elements are elastically joined to one another by spring 1201 and allowed to slide relative to one another by movement of the arms of the first spring element through the guide or ring elements 1202 that are joined to the second frame. The first and second tips can be pressed toward one another by stretching or tensioning the spring while the first and second tips can move away from each other under a return force created in response to a prior compression of the spring. The interface between the guides or rings 1202 and the arms 1262-1 and 1262-2 of the first frame, and more specifically the effective gaps between these elements and longitudinal separation interface regions, define the stability of movement and the associated lateral out of line displacement or wobble that can occur between the tips on opposite ends of the probe or between the sliding frame elements. The tighter the tolerance, the more parallel the movement of the elements will be and the more predictable tip alignment from probe-end-to-probe-end will be. As elements 1281 enter the rings or guide elements 1202, the gap size decreases with a resulting smaller angular displacement of the elements being allowed. As the maximum longitudinal separation of the ring elements or length of the effective displacement channels defined thereby increases a lowering of allowed angular displacement also occurs. The framing elements and associated guide elements may help in stabilizing probe functionality and may help ensure that the probe does not deflect or bow excessively. Use of gap decreasing elements like expanded width elements 1281 relative to interior width of rings or other guide elements may provide more stable probe operation. In some variations, instead of using rings, a slotted channel, or multiple slotted channels may be provided. In some variations, instead of providing elements with expanded widths, opening or slots with narrowed widths may be provided. In situations where the probes will be formed without assembly of slidable frame elements (i.e. where slidable frame elements are formed with engaged or partially engaged features), it may be possible to provide gaps large enough to meet process tolerance requirements for co-fabrication of the movable elements while in fabrication positions that ensure that a minimum feature size (MFS) requirement is maintained as described in U.S. patent application Ser. No. 10/949,744 which is incorporated herein by reference. After formation, the movable elements may be relatively longitudinally translated or otherwise moved to working regions (e.g. regions or relative positions that involve some amount of tip-to-tip compression) which have tighter tolerances than are allowed by the MFS but which provide more stable longitudinal movement of the elements while the probe is in use. In some variations, a first movement from a fabrication position into the working range may trigger a locking mechanism (e.g. ratcheting mechanisms) that inhibits the elements from readily transitioning from the working region back to the fabrication position. In some variations, initial biasing of one or both springs may be useful in providing different operational characteristics to the probe. For example, selecting and setting a maximum separation distance between upper lateral elements 1264-1 and 1262-1 and/or between lower lateral elements 1262-2 and 1264-2 that is smaller than a nominal unbiased distance may result in pre-biasing of the spring to provide an initial non-zero contact force for the probe.

FIGS. 13A1 to 13E4 provide a number of different isometric, plane, and section views of a probe 1300 according to another embodiment of the invention where the probe provides a specific implementation of spring and guide functionality similar to the probe 1200 of FIG. 12.

FIGS. 13A1 provides a side view of probe 1300 so the 11 layers making up the probe can be seen with layers 2, 4, 8, and 10 being thin and shown by thicker blackened lines. FIG. 13A1 points out several probe elements or features including relatively moveable frames 1361 and 1363 with respective tips 1311T and 1312T and frame ends or lateral connecting elements 1362-1, 1362-2 for frame 1361 and frame ends or lateral connecting elements 1364-1 and 1364-2 for frame 1363. FIG. 13A1 also shows spring 1301 as well as a left side gap 1370-1 and a right side gap 1370-2 that allow for relative movement of the frame elements as a left side tip 1311T and a right side tip 1312T are compressed toward one another.

FIG. 13A2 provides an isometric view of the probe 1300 of FIG. 13A1 tilted forward so that the top of the probe can be seen which provides a view of guide tabs or guide extensions 1361E that form part of frame 1361 and slots with wider regions 1302W and narrower regions 1302N that form part of frame 1363 where the guide extension 1361E can slide with a relatively large clearance in the wider regions 1302W and with a tighter clearance in the narrow regions 1302N. Frame 1363 not only includes relative long arms 1363A that longitudinally extend the length of frame 1363 but also bridging elements 1363B that connect the arms that are located on opposite sides of the slots. Near the right end of frame element 1363, a widened region 1381 of element 1361 is shown which reduces to a narrower region that extends into a channel or slot in frame 1363 with the beginning of the narrower region 1383 shown. As the probe tips are pressed together, wider region 1381 enters the channel to provide another structural configuration that narrows the clearance to improve operational stability. In embodiments where the two frame elements are to be formed in a pre-assembled state, the wider regions can allow for sufficient clearance such that MFS requirements can be met while the narrow regions can allow for an operational range of motion with tighter tolerances and more precise relative movement for frames 1361 and 1363. Since the probe is symmetric about a plane cutting through the center layer of the probe, a view of the bottom of the probe would show features similar to that shown in the view of FIG. 13A2.

FIG. 13A3 shows a top view (or bottom view) of the probe of FIGS. 13A1 and 13A2 with locations of frame extensions 1361E, narrower slot regions 1302N, wider slot regions 1302W, widened structural feature 1381 and the beginning of narrower structural feature 1383 again referenced.

FIG. 13A4 shows an isometric view of the probe showing the left, upper, and front side view of the probe while FIG. 13A5 shows an isometric view of the probe showing the right, lower, and front side view of the probe wherein features noted in FIGS. 13A2 and 13A3 are again referenced.

FIGS. 13B1 and 13B2 show views of the upper half of the probe 1300 that has been sectioned through the middle of the middle layer of the probe. FIG. 13B1 shows the probe with a slight tilt so that the top of the probe can be seen along with an edge of the top half of the probe. FIG. 13B2 shows upper half of probe 1300 with a slight backward tilt with the left end being slightly forward of the right end so that the edge of the probe may be seen along with the bottom of the upper half of the probe and left side of the probe. Because the probe was sectioned in the middle, the upper half of spring 1301 and its general configuration can be seen in FIG. 13B2 along with the connection location/connection structure 1367 which joins the spring to frame element 1361 and connection location/connection structure 1368 which joins the spring to frame element 1363.

FIGS. 13C1 and 13C2 show the probe 1300 of FIGS. 13A1 to 13A4 with the bottom half cut away and with the front half cut away, thus providing views of the upper, back, left quarter of probe 1300. FIG. 13C1 provides a side view and FIG. 13C2 provides an isometric view of the left end of the probe 1300 wherein the connection 1368 between the right end of spring 1301 and frame 1363 can be clearly seen.

FIGS. 13D1-13D4 show the probe 1300 of FIGS. 13A1 to 13A4 with the bottom half cut away, with the front half cut away, and with the left half cut away, thus providing views of the upper, back, right quarter of probe 1300. FIG. 13D1 provides a side view while FIGS. 13D2 to 13D4 provides several isometric views wherein the connection 1367 between the right end of spring 1301 and frame 1361 can be clearly seen.

FIGS. 13E1 to 13E6 provide top views of individual layers that define the probe of FIGS. 13A1-13D4 wherein FIG. 13E1 shows the features of layers 1 and 11, FIG. 13E2 shows the features of layers 2 and 10, FIG. 13E3 shows the features of layers 3 and 9, FIG. 13E4 shows the features of layers 4 and 8, FIG. 13E5 shows the features of layers 5 and 7, and FIG. 13E6 shows the features of layer 6 wherein each figure also provides a dashed rectangular alignment guide that correlates the relative positions of the features from layer-to-layer. The layer views of FIGS. 13E1 to 13E6 help illustrate some of the harder to see features of probe 1300. Element 1367 of FIG. 13D4 (for each of layers 4 and 8) shows the structure that attaches the right end of the spring 1301 to the first frame structure 1381 as part of frame 1361 while 1368 shows the pair of elements (for each of layers 4 and 8) that join the left end of spring 1301 to the left end of arms 1363A of layers 3 and 9. Element 1381 of element 1361 distinguishes the wider part of 1361 from the narrower part 1383 that extends toward the right end of the channel in 1363.

The various views of probe 1300 of FIGS. 13A1 to 13E6 illustrate various features of the probe 1300. Probe 1300 includes first and second frame structures 1361 and 1363, which can be longitudinally moved relative to one another and which are connected by a spring 1301. A left end of structure 1361 joins a tip arm 1311 which connects to, or becomes, a tip 1311T while the right end of structure 1363 connects to a tip arm 1312 which in turn connects to, or becomes, a tip 1312T. The right end of 1361 connects to the right end of spring 1301 at 1367 while the left end of 1363 connects to the left end of the spring at 1368 wherein structures 1361 and 1363 are engaged with one another by sliding arms (or plungers) and channels (or barrels) such that when the tips are pressed toward one another, the spring is biased in extension that provides an increasing force that attempts to drive the tips apart. Upon release of the compressive force, the biased spring attempts to drive the tips back to an unbiased separation.

Probe 1300 also includes a feature 1362-1 that has lateral dimensions larger than tip arm 1311 and tip 1311T that may engage an array structure (e.g., a guide plate or a mounting structure) by sliding the tip 1311T through the structure such that engagement of 1362-1 and the structure can provide preload compression of the spring or provide other engagement functionality.

The first frame structure 1361 includes upper and lower longitudinal arms or plungers (e.g. 1381, 1383, and 1361E that correlate to vertical arms 1261-1 and 1261-2 of FIG. 12 that move through openings or channels formed in the second frame structure 1363, which includes 1363-1 and 1363-2, which correspond to structures 1263-1 and 1263-2 of FIG. 12 where these elongated structures and their interplay provide a certain level of pointing accuracy of the probe (or tip-to-tip correlation) which is dictated in part by the gaps or clearance through which the interaction occurs as well as the amount of longitudinal overlap between the frame elements. Depending on the method of formation, the gap or clearance may be larger or smaller. In the example of probe 1300, longitudinal arms 1383 move through channels having larger clearances than do the arm extensions 1361E when moving through their slots 1302N such that extension arms 1361E provide enhanced operational stability. Since layers may be formed with thicknesses that are less than intra-layer MFS requirements, stability of movement within a plane of the layer stacking axis and the longitudinal axis of the probe can typically be sufficiently controlled by proper setting of the layer thickness of gap layers between moving elements. Segments 1361E are initially formed in wider lateral portions of the slots or channel segments 1302W in 1363 that provide sufficient separation or clearance to allow formation to occur but wherein such gaps or clearance do not provide a desired level of stability and/or tip pointing accuracy. After formation, during usage or in preparation for usage, as arm 1383 moves longitudinally through its channel and carried segments 1361E move from the wider portions 1302W of their channel segments 1302 to laterally narrow regions 1302N to reduce clearance to an amount that provides enhanced probe functional stability and/or pointing accuracy. The segment slots on the top and bottom of the probe are separated from other segments or openings by bridging elements 13638 that provide additional stability to the channel size and thus provide for improvement in functional operation of the probe (e.g., for both sliding and pointing stability).

Numerous variations of this embodiment are possible and include for example: (1) adding to the present embodiment features associated other embodiments or replacing some of the features of the present embodiment with those from one or more other embodiments, (2) using, or including, a different number of stabilizing guides, (3) using, or including, a different configuration of stabilizing guides, (4) using, or including, a different number of springs and with different configurations, including different numbers of segments and/or types of segments and our positional relationships between segments, and/or different connection relationships between segments and other segments or between segments and coupling structures or sliding guides, (5) using or including different tip configurations, (6) using or including different connecting elements that join the spring segments where the connecting elements may or may not provide guide features, (7) using or including fixed stop features, (8) using or including different or additional moving stop features, (9) using or including interface features that aid in aligning with and engaging fixed stop features that are part of array structures, (10) using or including interface features that aid in array loading and retention, (11) using or including additional features for aiding in the pre-biasing of spring segments, and (12) using or including different materials and/or configurations in different portions of the probe to provide one or more operational enhancements, such as, for example, improved conductivity, electrical isolation, improved wearability, tailored spring constants, improved material strength, decreased contact resistance, improved scrubbing without excess scrubbing, inhibition of working stress reaching or approaching yield strength limits, and the like.

Still other variations may provide, or include, for example: (1) instead of just intermediate side to side bridges 1363B, top to bottom bridge elements (that are either located in the interior of the probe or located on the exterior of the probe) may be included that provide further structural integrity where such bridges may be formed from one or both conductive and/or dielectric materials; (2) the probe may be formed such that an external frame exists that allows movement of both tips relative to the frame as opposed to allowing only the tips on one end of the probe to be movable; (3) different numbers of and/or different lengths of bridging elements and/or channel segments may be used; (4) different lengths, widths, working ranges, and materials for structural elements may be used; (5) enhanced alignment tolerances (e.g. smaller or more uniform effective gap sizes) may be obtained by widening selected portions of a slide segment in addition to or opposed to narrowing certain portions of slide channels; and (6) layers may be added or removed to either add in additional features, make larger parts, to remove unneeded features, and the like.

Figure 14A:
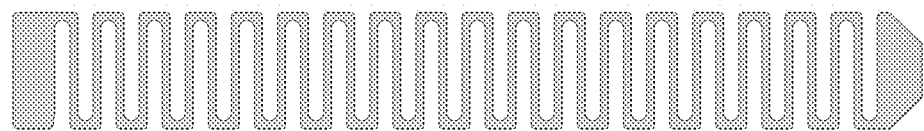
FIG. 14A to 14E provide five example alternative spring configurations that may be used in the variations of the embodiments of the invention wherein the examples are shown with attachment or end elements that are similar to those for the spring used in the embodiment of FIGS. 13A1 to 13E6.
Figure 14B:
Figure 14C:
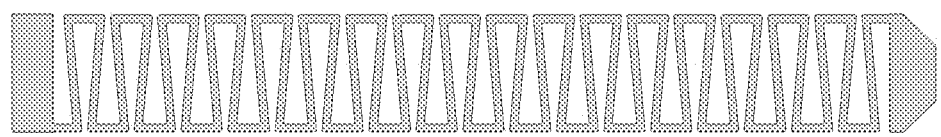
Figure 14D:
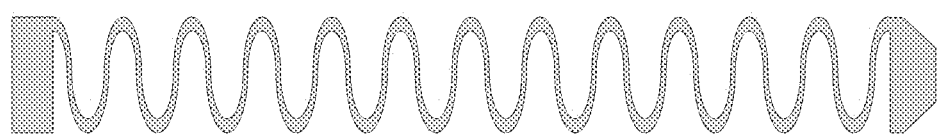
Figure 14E:
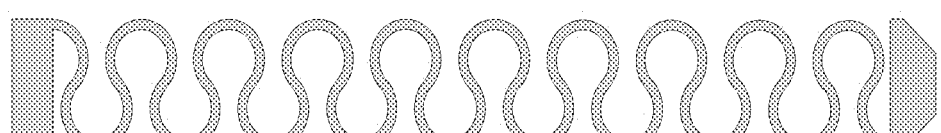

FIGS. 14A to 14E provide five example alternative spring configurations that may be used in the various embodiments of the invention wherein the examples are shown with attachment or end elements that are similar to those for the spring used in the embodiment of FIGS. 13A1 to 13E6. The spring of FIG. 14A provides a rectangular spring similar to that of FIGS. 13F5 and 13F6 with the exception that the arm width of the vertical segments is thinner than those shown in the FIG. 13 images and the longitudinal segments are thicker than the vertical segments. FIG. 14B shows a spring with a saw tooth configuration wherein the vertical arms have longitudinal components that extend in a forward direction or a direction of spring extension. FIG. 14C provides a spring that includes vertical arms which also have a component that extend in a longitudinal direction but where the longitudinal direction is backward relative to the direction of spring extension. FIG. 14D provides a spring that is like that of FIG. 14B but instead of having straight arms, the arms are provided with smooth curves and wherein the intermediate portion of the vertical arms are shown with narrower widths than that of their upper and lower ends wherein the thickest portion of the springs is at the bottom and top horizontal transitions between vertical segments. FIG. 14E provides another spring configuration similar to that of FIG. 14C but where the undeformed vertical segments, and even the horizontal segments, are provided with a smooth curved configuration. Other spring configurations are possible and may be based on a balance of competing factors such as: (1) spring constant, (2) longitudinal length, width, and thickness of the spring, (3) required travel length (e.g., overtravel) with or without accounting for any pre-extension requirements, (4) ensuring that no portion of the spring upon reaching maximum overtravel exceeds an acceptable fraction of yield strength of the material/configuration used for the spring and that strain is effectually distributed or concentrated in acceptable areas. In addition to considering spring configuration, consideration may also be given to spring materials, e.g., different metals, dielectrics, composites, and like, as well as temperature considerations associated with current flowing through the springs, contact resistance heating, shunting current away from the springs into thicker structural members or into members having surface or embedded materials of higher conductivity. In such considerations, a shunting member may be incorporated near one or both ends of the springs, wherein the shunting members or members may be configured to provide an acceptable and reliable contact resistance. Example materials include use of gold to enhance conductivity or lower contact resistance. Copper or silver may be used to improve conductivity. Rhodium may be included as a hard and low wear contact material. Palladium, nickel, alloys of palladium (e.g. palladium cobalt), alloys of nickel (e.g. nickel cobalt or nickel phosphor), beryllium copper, as well as other materials may be used as spring materials.

FIGS. 15A1 to 15C2 provide three sample configurations of a layer with features that provide for enhanced pointing accuracy or probe stability wherein FIG. 15A1 provides a similar configuration to that of layers 3 and 9 of the embodiment of FIGS. 13A1 to 13E6 as shown in FIG. 13E3 with FIG. 15A2 showing arm 1581, narrowed arm 1583, and channel 1502 after longitudinal tip-to-tip compression provides for engagement of the widened or enhanced feature 1581 with slot 1502. Upon engagement, the effective clearance or gap formed between 1581 and 1502 near the left end of the channel is narrowed compared to what it was based on only 1583 engaging 1502. In this embodiment, no narrowing is provided near the right end of the arm/channel or plunger/barrel.

FIGS. 15B1 and 15B2 provide a similar left end initial clearance (e.g. as formed) and engaged clearance views (e.g. after some tip-to-tip compression) as were found in FIGS. 15A1 and 15A2 but where the right end of channel 1502 narrows to become channel 1502N which provides the probe not only with a left end clearance reduction but also a right end clearance reduction as the right end of arm 1583 engages the narrowed channel region 1502N. The clearance reduction embodiment of FIGS. 15B1 and 15B2 significantly improve the pointing accuracy of the probe tips compared to that provided by the embodiment of FIGS. 15A1 and 15A2 which in turn provide a significant improvement compared to what would have existed with no clearance reduction.

FIGS. 15C1 and 15C2 provide similar views as shown in FIGS. 15A1-15B2 and with similar clearance reduction features as shown in FIGS. 15B1 and 15B2 but with gap narrowing features found not only at the left and right ends but at two intermediate locations as a result of two intermediate widened channel regions 1502W that can co-exist during formation with widened portions of arm 1583 that provide width comparable to that of 1581 which upon tip compression move to narrower channel regions. Prior to initial compression of the tips, normal gaps provide a certain level of probe stability and/or pointing accuracy while after some amount of tip compression, engagement of the features provide smaller effective clearances that contribute to the pointing accuracy or otherwise assist in providing stabilized probe functionality. The intermediate widened and narrow regions may or may not provide an increase in overall pointing accuracy, may reduce arm or channel bending, provide improve stability of sliding movement, and distribute stress more uniformly across the moving elements which may be useful in extending useful probe life and/or inhibiting premature failure.

FIGS. 16A-16C, like 15A1, 15B1, and 15C1 provide various alternative example configurations for further variations to the probe of FIGS. 13A1-13E6 but instead of applying to layers 3 and 9, the alternatives apply to layers 2 and 10 wherein layers 2 and 10 may be understood to be, at least in part, transition layers between adjacent layers that have features that would otherwise be joined together but for the gap formed by layers 2 and 10. In FIGS. 16A-16C, the stop or lateral arm 1662-1 with its longitudinal external extension arm 1661E can be seen along with two additional external guide features 1661E. These features move through channel segments on the layers 1 and 11 that have widened regions 1602W and narrow regions 1602N formed as part of the second frame element 1363 with the segments separated from one another by side-to-side bridge elements 13636 that provide additional stability to the probe (as can be seen in FIGS. 13A2-13A5). These elements together provide improved stability and/or improved pointing accuracy as well as probe durability. FIG. 16A, like 15A, does not provide additional clearance reduction features found in layers 3 or 9 or that will be found in layers 1 and 11. FIG. 16B carries over the channel narrowing feature on the right side of the channel as it existed in FIG. 15B. FIG. 16C carries forward the expanded channel areas in the intermediate portion of the channel that provide room for, and ensure no inadvertent bonding to, expanded arm elements found in the intermediate portion of the arm of FIG. 15C.

FIG. 17 provides an example alternative tip configuration that may be used on either end of a probe wherein a central region of the tip provides a thin rhodium feature (Rh) to improve contact properties of the probe. In other alternatives, the rhodium feature and the tip itself may take on different configurations which may include the use of multiple tips or multiple rhodium contact features.

FIGS. 18A-18C provide various views of an alternative left end of a probe wherein in addition to a tip of desired configuration, lateral engagement or retention spring elements 1891 are provided on one or both sides of the probe, as part of one or more layers wherein upon loading of the probe into an opening in a guide plate or other array structure (not shown), e.g., a block with probe capture holes, the spring elements can engage walls of the guide plate or other array structure to frictionally hold the probe in a desired lateral and longitudinal position to inhibit the probe from inadvertently falling out of the array structure while still allowing it to be removed if required. In other embodiments, such spring elements may be located as part of the top or bottom layers, or both, or near the top of bottom layers. In still other embodiments, such spring elements may be located at the opposite end of the probe, at both ends, at one or more intermediate locations, at multiple locations along the either, or both, sides of the probe or even extending out of the lateral top or bottom of the probe.

FIGS. 19A and 19B illustrate an additional feature that may be incorporated into an alternative to probe 1300 wherein top and isometric views of the left end of the probe are provided so that the left end engagement channels of the probe of FIGS. 13A1-13E6 can be seen wherein pointing accuracy enhancement features on either side of elements 1983 can be seen as widened arm configurations that provide narrowed gaps as they enter their respective slots or channels 1902 in frame element 1963 wherein not only does arm 1981 (forming part of layers 3 and 9) but extensions 1961E (forming parts of layers 1, 11, and 2, and 10) provide similar wide to narrowing features via a taper such that upon tip-to-tip compression, reduced clearance is achieved and more fully supported.

FIGS. 20A-20B provide an as formed schematic cut view of a sheathed extension spring probe along with a blown up view of a side of the sheath in a neutral, initial, or as formed, state (FIG. 20A) and in an extended, or pre-biased, final working state along with a blown up view of a side of the sheath (FIG. 20B) wherein the sheath includes ratchetable features which engage when the sheath initially undergoes an expansion from an initial working state (which may be an as formed state or a less biased working state) to the pre-biased final working state. After batch formation of a plurality of probes, the probes may be individually released or released in as groups (e.g. tethered groups). After release of the probes in groups, or as individual probes, the probes may be placed in fixtures that hold the probes in a desired orientation and then the handles or other features on the upper portion of the sheath may be manipulated in relation to handles or other features on the lower portion of the sheath such that the upper and lower portions move apart to engage the ratcheting features so that the spring of the probe becomes permanently biased and the sheath becomes permanently elongated.

FIGS. 21A-21B provide an as formed schematic cut view of a sheathed extension spring probe along with a blown up view of a side of the sheath in a neutral, initial, or as formed state (FIG. 21A) and in an extended, or pre-biased, final working state along with a blown up view of a side of the sheath (FIG. 21B) wherein the sheath includes ratchetable features and an expansion stop feature which engage when the sheath initially undergoes an expansion from the initial state to the pre-biased final working state. In a manner similar to that discussed above with regard to FIGS. 20A-20B, pre-biasing of the springs and sheaths may occur but instead of by pulling on handles, the upward extending arms of the lower portion of the sheath and the downward extending arms of the upper portion of the sheath may be pushed toward one another to engage the ratcheting features so that the spring of the probe becomes permanently biased and the sheath becomes permanently extended.

FIGS. 22A-22B provide an as formed schematic cut view of a sheathed extension spring probe along with a blown up view of a side of the sheath in a neutral, initial, or as formed state (FIG. 22A) and in an extended, or pre-biased, final working state along with a blown up view of a side of the sheath (FIG. 22B) wherein the sheath includes ratchetable features, an expansion stop feature, and a secondary expanded lock feature which engages when the sheath initially undergoes an expansion from the initial state to the pre-biased final working state. Like the embodiment of FIGS. 21A-21B, pre-biasing of the springs and sheaths of this embodiment may occur by pulling on handles or instead by the upward extending arms of the lower portion of the sheath and the downward extending arms of the upper portion of the sheath being pushed toward one another to engage the ratcheting features so that the spring of the probe becomes permanently biased and the sheath becomes permanently extended.

FIGS. 23A-23B provide an as formed schematic cut view of an extension spring probe in a neutral, initial, or as formed state (FIG. 23A) and in an extended, or pre-biased, final working state (FIG. 23B) wherein the tip extension arms include ratchetable features that can be moved through openings in engagement plates to permanently transition from the neutral state or initial state to a pre-biased final working state. Since the tip arms of the probes hold the ratchetable features in this embodiment, permanent pre-biasing of the springs may occur simply by pressing the probe tips together. In variations of this embodiment, the final configuration may be achieved while all the probes are located in their laterally spaced array configurations or where the probes will be assembled into their lateral array configurations after the pre-biasing of their springs have been completed.

FIGS. 24A-24B provide an as formed schematic cut view of an extension spring probe in a neutral, initial, or as formed state (FIG. 24A) and in an extended, or pre-biased, final working state (FIG. 24B) wherein a single tip extension arm includes a ratchetable feature that can be moved through an opening in an engagement plate to permanently transition from the neutral state to the pre-biased final working state. The probe and the pre-biasing of the probe spring is similar to that of the prior embodiment with the exception that the ratcheting elements are not provided on both arms but instead on only a single one of the arms.

Numerous variations of the ratcheting or locking based pre-biasing embodiments of FIGS. 20A-20B are possible and may involve the ratcheting elements taking on different configurations than the deflectable sloped arm latches that were illustrated, such as for example, ratcheting pairs may include a deflectable element that is capable of moving past a rigid feature, instead of a series of ratcheting element that move past one another, the ratcheting elements may be singular in nature. In the embodiments of FIGS. 23A-24B, the deflectable members may be moved from the arms to the plates while the arms carry one or more rigid back stop features. The features schematically depicted in FIGS. 20A-24B may be implemented, for example, in variations of the embodiments of FIGS. 11-1 to 11-6 and FIGS. 13A1 to 13E6 so as to provide pre-biasing of the springs or in the other embodiments set forth herein.

Still other embodiments may be created by combining the various embodiments and their alternatives with other embodiments and their alternatives as set forth herein.

Further Comments and Conclusions

Various other embodiments of the present invention exist. Some of these embodiments may be based on a combination of the teachings herein with various teachings incorporated herein by reference. For example, some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu) in combination with one or more other materials, beryllium copper (BeCu), nickel phosphorous (Ni—P), tungsten (W), aluminum copper (Al—Cu), steel, P7 alloy, palladium, palladium-cobalt, silver, molybdenum, manganese, brass, chrome, chromium copper (Cr—Cu), and combinations of these. Some embodiments may use copper as the structural material with or without a sacrificial material.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184 (P-US032-A-SC), which is entitled "Electrochemical Fabrication Methods Incorporating Dielectric Materials and/or Using Dielectric Substrates"; (2) U.S. Patent Application No. 60/533,932 (P-US033-A-MF), which is entitled "Electrochemical Fabrication Methods Using Dielectric Substrates"; (3) U.S. Patent Application No. 60/534,157 (P-US041-A-MF), which is entitled "Electrochemical Fabrication Methods Incorporating Dielectric Materials"; (4) U.S. Patent Application No. 60/533,891 (P-US052-A-MF), which is entitled "Methods for Electrochemically Fabricating Structures Incorporating Dielectric Sheets and/or Seed layers That Are Partially Removed Via Planarization"; and (5) U.S. Patent Application No. 60/533,895 (P-US070-B-MF), which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include: (1) U.S. patent application Ser. No. 11/139,262 (P-US144-A-MF), filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216 (P-US128-A-MF), filed Jan. 3, 2005 by Cohen, et al., now abandoned, and which is entitled "Electrochemical Fabrication Methods Incorporating Dielectric Materials and/or Using Dielectric Substrates"; (3) U.S. patent application Ser. No. 11/028,957 (P-US127-A-SC), by Cohen, which was filed on Jan. 3, 2005, now abandoned, and which is entitled "Incorporating Dielectric Materials and/or Using Dielectric Substrates"; (4) U.S. patent application Ser. No. 10/841,300 (P-US099-A-MF), by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378 (P-US106-A-MF), by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric"; (6) U.S. patent application Ser. No. 11/325,405 (P-US152-A-MF), filed Jan. 3, 2006 by Dennis R. Smalley, now abandoned, and which is entitled "Method of Forming Electrically Isolated Structures Using Thin Dielectric Coatings"; (7) U.S. patent application Ser. No. 10/607,931 (P-US075-A-MG), by Brown, et al., which was filed on Jun. 27, 2003, now U.S. Pat. No. 7,239,219, and which is entitled "Miniature RF and Microwave Components and Methods for Fabricating Such Components", (8) U.S. patent application Ser. No. 10/841,006 (P-US104-A-MF), by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295 (P-US061-A-MG), by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556 (P-US081-A-MG), by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material or to reduce stress. Various teachings concerning the use of diffusion bonding in electrochemical fabrication processes are set forth in U.S. patent application Ser. No. 10/841,384 (P-US103-A-SC), which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. Pat. App No., Filing Date U.S. App Pub No., Pub Date U.S. Pat. No., Pub Date | First Named Inventor, Title |
|---|---|
| 10/271,574-Oct. 15, 2002 2003-0127336-Jul. 10, 2003 7,288,178-Oct. 30, 2007 | Cohen, "Methods of and Apparatus for Making High Aspect Ratio Microelectromechanical Structures" |
| 10/387,958-Mar. 13, 2003 2003-0221168-Dec. 4, 2003 — | Cohen, "Electrochemical Fabrication Method and Application for Producing Three-Dimensional Structures Having Improved Surface Finish" |
| 10/434,289-May 7, 2003 2004-0065555-Apr. 8, 2004 — | Zhang, "Conformable Contact Masking Methods and Apparatus Utilizing In Situ Cathodic Activation of a Substrate" |
| 10/434,294-May 7, 2003 2004-0065550-Apr. 8, 2004 — | Zhang, "Electrochemical Fabrication Methods With Enhanced Post Deposition Processing" |

-continued

| U.S. Pat. App No., Filing Date U.S. App Pub No., Pub Date U.S. Pat. No., Pub Date | First Named Inventor, Title |
|---|---|
| 10/434,315-May 7, 2003 2003-0234179-Dec. 25, 2003 7,229,542-Jun. 12, 2007 | Bang, "Methods of and Apparatus for Molding Structures Using Sacrificial Metal Patterns" |
| 10/434,494-May 7, 2003 2004-0000489-Jan. 1, 2004 — | Zhang, "Methods and Apparatus for Monitoring Deposition Quality During Conformable Contact Mask Plating Operations" |
| 10/677,498-Oct. 1, 2003 2004-0134788-Jul. 15, 2004 7,235,166-Jun. 26, 2007 | Cohen, "Multi-cell Masks and Methods and Apparatus for Using Such Masks To Form Three-Dimensional Structures" |
| 10/697,597-Dec. 20, 2002 2004-0146650-Jul. 29, 2004 | Lockard, "EFAB Methods and Apparatus Including Spray Metal or Powder Coating Processes" |
| 10/724,513-Nov. 26, 2003 2004-0147124-Jul. 29, 2004 7,368,044-May 6, 2008 | Cohen, "Non-Conformable Masks and Methods and Apparatus for Forming Three-Dimensional Structures" |
| 10/724,515-Nov. 26, 2003 2004-0182716-Sep. 23, 2004 7,291,254-Nov. 6, 2007 | Cohen, "Method for Electrochemically Forming Structures Including Non-Parallel Mating of Contact Masks and Substrates" |
| 10/830,262-Apr. 21, 2004 2004-0251142-Dec. 16, 2004 7,198,704-Apr. 3, 2007 | Cohen, "Methods of Reducing Interlayer Discontinuities in Electrochemically Fabricated Three-Dimensional Structures" |
| 10/841,100-May 7, 2004 2005-0032362-Feb. 10, 2005 7,109,118-Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347-May 7, 2004 2005-0072681-Apr. 7, 2005 — | Cohen, "Multi-step Release Method for Electrochemically Fabricated Structures" |
| 10/949,744-Sep. 24, 2004 2005-0126916-Jun. 16, 2005 7,498,714-Mar. 3, 2009 | Lockard, "Multi-Layer Three-Dimensional Structures Having Features Smaller Than a Minimum Feature Size Associated with the Formation of Individual Layers" |
| 12/345,624-Dec. 29, 2008 — 8,070,931-Dec. 6, 2011 | Cohen, "Electrochemical Fabrication Method Including Elastic Joining of Structures" |
| 14/194,564-Feb. 28, 2014 2014-0238865-Aug. 28, 2014 9,540,233-Jan. 10, 2017 | Kumar, "Methods of Forming Three-Dimensional Structures Having Reduced Stress and/or Curvature" |
| 14/720,719-May 22, 2015 — 9,878,401-Jan. 30, 2018 | Veeramani, "Methods of Forming Parts Using Laser Machining" |
| 14/872,033-Sep. 30, 2015 — — | Le, "Multi-Layer, Multi-Material Microscale and Millimeter Scale Batch Part Fabrication Methods Including Disambiguation of Good Parts and Defective Parts" |

Various other embodiments of the present invention exist. Some of these embodiments may be based on a combination of the teachings herein with various teachings incorporated herein by reference. Some method of making embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, palladium, palladium-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented method of making embodiments. These additional operations may, for example, perform cleaning functions (e.g. between the primary operations discussed herein or discussed in the various materials incorporated herein by reference), and they may perform activation functions and monitoring functions, and the like.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A probe for testing a device under test (DUT), comprising:
   (a) a first tip arm connecting directly or indirectly to an attachment region of a first tip for making electrical contact to a first electrical circuit element;
   (b) a second tip arm connecting directly or indirectly to an attachment region of a second tip;
   (c) a first stop plate with a first opening, joined directly or indirectly to the first tip arm and a second stop plate with a second opening, joined directly or indirectly to the second tip arm,
   wherein the first tip arm passes through the second opening of the second stop plate and the second tip arm passes through the first opening of the first stop plate; and
   (d) a compliant structure comprising at least one spring segment, wherein a first region of the compliant structure joins directly or indirectly the first stop plate and a second region of the compliant structure joins directly or indirectly the second stop plate,
   wherein relative displacement of the first and second tip arms results in an elastic stretching of the at least one spring segment of the compliant structure and in a movement of the second stop plate away from the first stop plate.

2. The probe of claim 1, further comprising a multi-part sheath having at least:
   a first biasing portion including at least one first lateral element resting on the second stop plate and at least one first longitudinal element protruding from the at least one lateral element; and
   a second biasing portion including at least one second lateral element resting on the first stop plate and at least one second longitudinal element protruding from the second lateral element toward the first biasing portion,
   wherein the first and second longitudinal elements of the first and second biasing portion can move at least partially passed one another and include respective first and second ratcheting features, that have different positions with respect to one another while the probe is in a different working condition.

3. The probe of claim 2, wherein the working condition is selected from a group consisting of: (1) a neutral, initial, or as formed, state: (2) an extended, or pre-biased, final working state.

4. The probe of claim 2, wherein the ratcheting feature of the first biasing portion are at a position selected from a group consisting of: (i) closer to the second stop plate than when in a final position, (ii) further from the first stop plate than when in a final position, and (iii) less centrally, longitudinally located with respect to the first stop plate than when in a final position.

5. The probe of claim 2, wherein the second biasing portion includes at least two second longitudinal elements, both protruding from the second lateral element toward the first biasing portion and defining a space between one another wherein the first longitudinal element of the first biasing portion slides.

6. The probe of claim 5, wherein the second biasing portion includes ratcheting features associated to both second longitudinal elements protruding into the space.

7. The probe of claim 2, wherein the second lateral element of the second biasing portion has an opening wherein the first longitudinal element of the first biasing portion can pass.

8. The probe of claim 7, wherein the first biasing portion further comprises an additional lateral element at an opposite end with respect to the first lateral element, the additional lateral element resting against the second lateral element of the second biasing portion in a final working condition of the probe.

9. The probe of claim 2, wherein the second biasing portion further comprises an additional lateral element at an opposite end with respect to the second lateral element.

10. The probe of claim 9, wherein the additional lateral element of the second biasing portion rests against the first biasing portion in a final working condition of the probe.

11. The probe of claim 9, wherein the first biasing portion further comprises a secondary lock feature at an opposite end with respect to the second lateral element and the additional lateral element of the second biasing portion engages with a further space defined by the secondary lock feature in a final working condition of the probe.

12. The probe of claim 11, wherein the secondary lock feature is a C-shaped feature having an internal open further space.

13. The probe of claim 2, wherein the ratcheting features are selected from a group consisting of: (a) deflectable sloped arm latches; (b) deflectable element capable of moving past a rigid feature, (c) series of ratcheting element that move past one another; (d) series of singular ratcheting element that move past one another; (e) inclined metal bristles.

14. The probe of claim 1, wherein at least the second tip arm holds, directly or indirectly, at least one ratcheting feature and wherein the at least one ratcheting feature can be moved through the first opening of the first stop plate to permanently transition the probe from a neutral state to a pre-biased final working state.

15. The probe of claim 14, wherein both the first tip arm and the second tip arm hold, directly or indirectly, respective ratcheting features and wherein the ratcheting features can be moved through the respective openings of the first and second stop plates to permanently transition the probe from the neutral state to the pre-biased final working state.

16. The probe of claim 14, wherein the ratcheting features are selected from a group consisting of: (a) deflectable sloped arm latches; (b) deflectable element capable of moving past a rigid feature, (c) series of ratcheting element that move past one another; (d) series of singular ratcheting element that move past one another; (e) deflectable members moved from tip arms to the stop plates while tip arms carry one or more rigid back stop features.

17. The probe of claim 1, wherein the compliant structure comprises a plurality of spring segments.

18. The probe of claim 1, further comprising a feature selected from a group consisting of: (1) configurations that can engage with features on an array structure to allow for pre-biasing of at least one spring segment, (2) at least one shunting element that directs current from one of the first or second tip arms through a non-compliant structure and then through the other of the first or second tip arms; and (3) at least one shunting element that directs current from one of the first or second tip arms through a non-compliant structure and then through the other of the first or second tip arms wherein the at least one shunting element is a surface against which the tip arms slide.

19. The probe of claim 1, further comprising at least one guide structure connected to the first and second tip arms and providing enhanced stability and/or pointing accuracy to the probe and limiting relative movement of the first tip and the second tip along a substantially longitudinal axis of the probe.

20. The probe of claim 1, wherein the second tip is configured for making an electrical connection to a second circuit element, wherein the configuration is selected from a group consisting of: (1) a tip for making a contact connection, and (2) a tip for making an attached connection.

21. The probe of claim 1, wherein the probe has a length selected from a group consisting of: (1) less than 2 mm, (2) less than 3 mm, (3) less than 5 mm, (4) less than 8 mm, (5) more than 2 mm, (6) more than 3 mm, (7) more than 5 mm, and (8) more than 8 mm and a width selected from a group consisting of: (1) less than 100 microns, (2) less than 200 microns, (3) less than 300 microns, (4) less than 400 microns, and (5) less than 600 microns.

22. The probe of claim 1, wherein the probe is configured in an array for wafer level testing or for socket testing of one or more packaged integrated circuits.

\* \* \* \* \*